(12) United States Patent
Seta et al.

(10) Patent No.: US 6,849,923 B2
(45) Date of Patent: Feb. 1, 2005

(54) SEMICONDUCTOR DEVICE AND MANUFACTURING METHOD OF THE SAME

(75) Inventors: Shoji Seta, Yokohama (JP); Makoto Sekine, Yokohama (JP); Naofumi Nakamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 375 days.

(21) Appl. No.: 10/086,556

(22) Filed: Mar. 4, 2002

(65) Prior Publication Data

US 2002/0102843 A1 Aug. 1, 2002

Related U.S. Application Data

(60) Continuation-in-part of application No. 09/995,839, filed on Nov. 29, 2001, now Pat. No. 6,605,542, which is a division of application No. 09/522,175, filed on Mar. 9, 2000, now Pat. No. 6,352,931.

(30) Foreign Application Priority Data

Mar. 12, 1999 (JP) .......................................... 11-066293

(51) Int. Cl.⁷ .............................................. H01L 23/58
(52) U.S. Cl. ..................... 257/635; 257/636; 257/637; 438/620; 438/626; 438/629; 438/631; 438/672
(58) Field of Search ............................... 257/635–640, 257/751, 752, 762–764; 438/620, 626, 629, 631, 637, 672

(56) References Cited

U.S. PATENT DOCUMENTS

| | | | | |
|---|---|---|---|---|
| 5,674,781 A | * | 10/1997 | Huang et al. | 438/629 |
| 5,702,982 A | * | 12/1997 | Lee et al. | 438/620 |
| 5,739,579 A | * | 4/1998 | Chiang et al. | 257/635 |
| 5,898,806 A | | 4/1999 | Nishimoto | 385/49 |
| 5,962,581 A | | 10/1999 | Hayase et al. | 524/588 |
| 5,985,513 A | | 11/1999 | Kani et al. | 430/270 |
| 5,989,998 A | | 11/1999 | Sugahara et al. | 438/743 |
| 6,025,117 A | | 2/2000 | Nakano et al. | 216/99 |
| 6,037,278 A | | 3/2000 | Koyanagi et al. | 438/787 |
| 6,054,379 A | | 4/2000 | Yau et al. | 438/623 |
| 6,218,299 B1 | | 4/2001 | Akahori et al. | 438/682 |
| 6,352,931 B1 | | 3/2002 | Seta et al. | 438/700 |

FOREIGN PATENT DOCUMENTS

| | | |
|---|---|---|
| JP | 7-94477 | 4/1995 |
| JP | 7-106324 | 4/1995 |
| JP | 9-36226 | 2/1997 |
| JP | 9-172009 | 6/1997 |
| JP | 9-232428 | 9/1997 |
| JP | 10-335592 | 12/1998 |
| JP | 2000-31280 | 1/2000 |
| JP | 2000-164719 | 6/2000 |

OTHER PUBLICATIONS

Copy of Korean Office Action dated Feb. 28, 2002 and copy of English–language translation thereof.

* cited by examiner

*Primary Examiner*—Duy-Vu N. Deo
(74) *Attorney, Agent, or Firm*—Finnegan, Henderson, Farabow, Garrett & Dunner, L.L.P.

(57) ABSTRACT

Disclosed is a semiconductor device, comprising a first wiring structure formed on a semiconductor substrate and including a first plug and a first wiring formed on the first plug, and a second wiring structure formed on the semiconductor substrate belonging to the wiring layer equal to the first wiring structure and including a second plug and a second wiring formed on the second plug, wherein the upper surface of the first wiring is positioned higher than the upper surface of the second wiring, and the lower surface of the first wiring is positioned flush with or lower than the upper surface of the second wiring. The present invention also provides a method of manufacturing the particular semiconductor device.

23 Claims, 41 Drawing Sheets

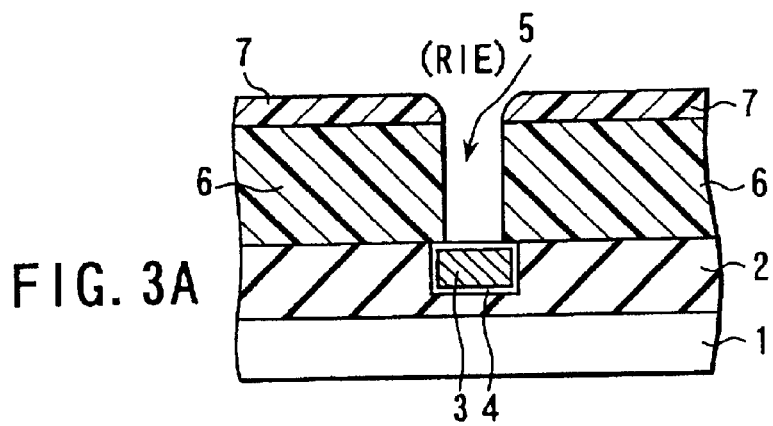
FIG. 3A
FIG. 3B
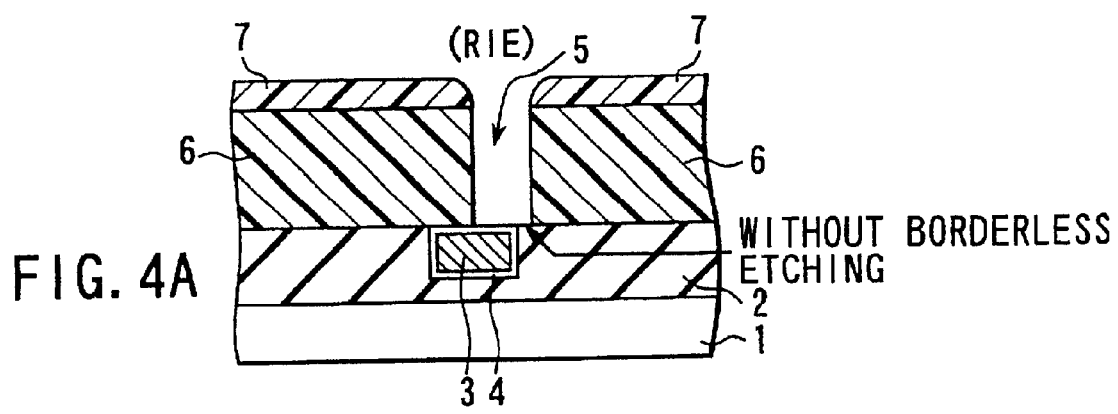
FIG. 4A — WITHOUT BORDERLESS ETCHING
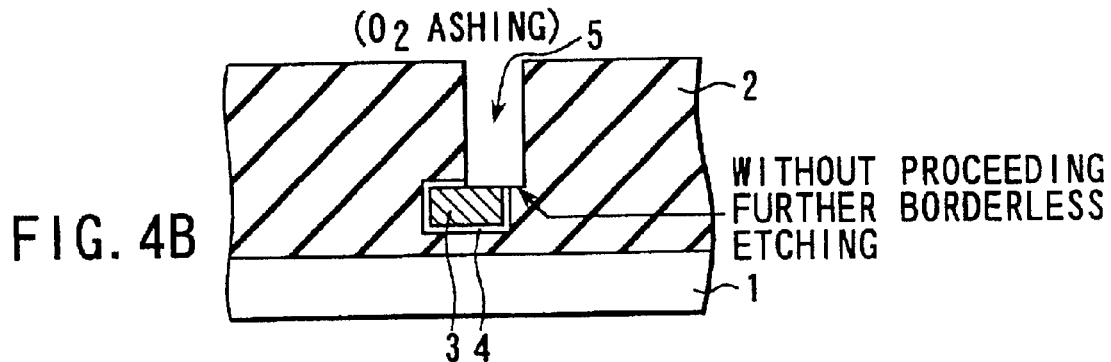
FIG. 4B — WITHOUT PROCEEDING FURTHER BORDERLESS ETCHING

SEMICONDUCTOR DEVICE AND MANUFACTURING METHOD OF THE SAME

CROSS-REFERENCE TO RELATED APPLICATIONS

This is a Continuation-in-Part application of U.S. patent application Ser. No. 09/995,839, filed Nov. 29, 2001, now U.S. Pat. No. 6,605,542, which is a divisional application of U.S. Patent Application Ser. No. 09/522,175 filed Mar. 9, 2000, now U.S. Pat. No. 6,352,931 the entire contents of which are incorporated herein by reference.

This application is based upon and claims the benefit of priority from the prior Japanese Patent Application No. 11-066293, filed Mar. 12, 1999, and the entire contents of which are incorporated herein by reference.

BACKGROUND OF THE INVENTION

1. Field of the Invention

The present invention relates to a manufacturing method of semiconductor devices by using a dry etching technology. More particularly, the present invention relates to a method of forming an interlayer insulating film of a dual trench metallization using an organic silicon film such as polysilane, a method of forming a contact hole and a trench, a method forming a deep trench, a method of removing an antireflection film, a method of forming a trench metallization of low interwiring coupling capacitance, and a semiconductor device manufactured by using these methods.

2. Description of the Related Art

When a process for manufacturing semiconductor devices each having a multilayered metallization is performed, a step is frequently employed whereby the pattern of a contact hole or the like is formed on a multilayered insulating film constituted by, for example, a silicon oxide film, silicon nitride film and the like, such that a resist serves as a mask.

Hitherto, when a selective etching step of the silicon oxide film and the silicon nitride film is performed by using dry etching technology such as reactive ion etching (RIE), the selective ratio (the ratio of etching speeds) between the resist and the silicon oxide film can be raised. The selective etching can easily be performed. Since the etching selective ratio between the resist and the silicon nitride film cannot be raised, selective etching of the silicon nitride film using the resist as a mask cannot easily be performed.

In recent years, the integration of miniature trench capacitors at a high density has been required to manufacture large scale semiconductor memory devices. Therefore, formation of trenches each having a great depth compared to the size of the opening portion (hereinafter called a "high aspect ratio") on a semiconductor substrate by using the anisotropic dry etching is one of the important techniques.

When the trenches each having a high aspect ratio are formed on a semiconductor substrate, also opening portions each having a high aspect ratio must be formed in an insulating film mask by using anisotropic dry etching. Hitherto, a resist mask has been employed to form the opening portions in the insulating film mask. To form opening portions each having a high aspect ratio, gas plasma excited by high power and high frequency radiation must be applied to the resist for a long time.

This leads to a fact that the opening portions in the resist are unevenly deformed. Therefore, a plurality of trenches each having a smooth inner surface and exhibiting satisfactory accuracy cannot easily be formed with a high yield in the semiconductor substrate.

As microfabrication technology progresses, the thickness of the resist must be reduced to raise the resolution of lithography. Since so-called film thinning occurs when the dry etching is performed, the trenches cannot easily be formed.

A common method of manufacturing semiconductor devices incorporates a smoothing process having the steps of forming isolation trenches for isolating devices from one another by using a silicon nitride film, the pattern of which has been formed on a semiconductor substrate as an etching mask, forming a thick silicon oxide film for isolating the devices from each other such that the isolation trenches are buried, and polishing the surface such that the silicon nitride film serves as a stopper (a suppression layer) so that the isolation trenches are buried with the oxide film and the device region is smoothed.

Where a plurality of silicon nitride film stoppers present in portions of high density device regions, the process for smoothing the device region using polishing of the surface enables satisfactory smoothing of the surface such that the isolation trenches are filled with the silicon oxide film. In the portions of low density device regions, the number of silicon nitride film stoppers is insufficiently small. Thus, the silicon oxide film is excessively polished in the smoothing process. As a result, there arises a problem in that smoothing and formation of the device regions cannot be performed uniformly over the overall surface of the wafer.

Therefore, a countermeasure is taken whereby a polysilicon film is deposited on the overall surface, and then a smoothing process is performed and the polysilicon film, as the etching mask, is left in the low density portion. The smoothing step, however, sometimes encounters a crack in the silicon oxide film in the low density portion. When the silicon nitride film stoppers on the device region and the polysilicon mask are removed, there arises a problem in that the silicon substrate is scooped out excessively.

Hitherto, a gate electrode has been formed by a method comprising the steps of forming a silicon nitride film on a metallic film for forming the gate electrode, forming a resist in a gate electrode formation region on the silicon nitride film, using the resist as a mask to form a nitride film, and using the silicon nitride film having a pattern formed after the resist mask has been removed to form the metallic film as the gate electrode.

If the surface of the wafer has an uneven portion, the projecting portions of the surface of the wafer are excessively etched when the pattern of the silicon nitride film is formed. As a result, the metallic film formed below the pattern is undesirably etched, causing a problem to arise in that a gate electrode formation cannot be satisfactorily performed.

When an etching process is performed to form a self-aligned contact (hereinafter abbreviated as a "SAC"), an opening of a contact hole is created in an interlayer insulating film for burying the space between the gate electrode. At this time, an edge line along which the upper surface and the side surface of the gate electrode intersect is exposed in the lower portion of the opening of the contact hole.

Undesirable etching of the gate electrode must be prevented during the etching process for opening the contact hole in the interlayer insulating film constituted by the silicon oxide film. Therefore, the gate electrode is usually coated with a silicon nitride film (an etching stopper) which has a high etching selective ratio with respect to the silicon oxide film. Although a satisfactory high etching selective ratio of the silicon nitride film with respect to the oxide film can be obtained in a flat portion, the etching selective ratio is lowered to about ⅓ or less of the flat portion in the edge line portion.

Therefore, the edge line portion of the gate electrode is undesirably etched when the contact hole is opened in the SAC formation step. Thus, the gate metal is exposed to the outside, causing a short-circuit fault to occur when the metal for the metallization is buried in the contact hole. As a result, it is known that the SAC cannot easily be formed in the process for manufacturing $E^2$ PROM in which the gate electrode has a high aspect ratio (the ratio of the length of the gate and the height of the gate).

Since microfabrication technology has proceeded in recent years, etching of the interlayer insulating film at a high aspect ratio is frequently required. It is known that when dry etching of the silicon oxide film at a high aspect ratio is performed under the condition where a high etching selective ratio with respect to the silicon nitride film is permitted, residues such as fluorocarbon are left in the opening portion during the progress of the etching operation. Thus, etching is interrupted.

As a technology for forming a multilayered metallization, double-trench metallization (called a "dual-damascene structure" in this industrial field) is employed frequently. When fabrication of the interlayer insulating film having the dual-damascene structure is performed, miniaturized dry etching process technology is required which is a combination of trench formation for burying two layered metallizations and contact hole formation for connecting the two layered metallizations to each other.

Hitherto, it is very difficult to control the depth of the trenches in the surface of the wafer when the trenches are formed in the interlayer insulating film. To realize the control, a method has been employed with which a silicon nitride film is inserted into the interlayer insulating film constituted by the silicon oxide film, so that the silicon nitride film is used as the stopper for the dry etching. When the dual-damascene structure having a complicated shape is formed, the stopper constituted by the silicon nitride film is required to control the depth of the trench metallization of the upper layer after the contact hole has been formed.

In the foregoing case, the silicon nitride film, which has a dielectric constant higher than that of the silicon oxide film, is contained adjacent to the metallization. Therefore, the wiring capacitance is enlarged excessively, causing the operation speed of the semiconductor device to be reduced. When the trenches are formed, partial etching of the interlayer insulating film constituted by the silicon oxide film occurs. Thus, ions are concentrated in the bottom corners of each trench, causing a shape called "trenching" to be formed in the corners of each trench. Therefore, the wiring metal cannot be easily buried in the trench.

Hitherto, an LSI of a type having a mixed structure so that a DRAM (Dynamic Random Access Memory) and a logic are mounted on one chip is structured such that the alignment margin (a fringe) in the logic portion is about ¼ of the alignment margin in the DRAM, owing to the difference in the design rule between the DRAM section and the logic section.

In an example case in which a contact hole is formed in an interlayer insulating film having the dual-damascene structure, the following step is employed: a dry etching condition where a high selectivity with respect to the etching stopper constituted by the silicon nitride film on the lower trench metallization is used to form the contact hole in the interlayer insulating film constituted by the silicon oxide film. Then, the silicon nitride film is removed, and then the wiring metal is buried in the contact hole and trenches of the upper metallization.

In the logic section, having a small alignment margin, a portion of the opening of the contact hole is sometimes deviated to the outside of the stopper constituted by the silicon nitride film which covers the lower trench metallization. Therefore, the interlayer insulating film constituted by the silicon oxide film which buries the side surface of the lower trench metallization easily encounters borderless etching that is cut during the step of forming the contact hole. Therefore, there arises a problem in that a fault in burying and a short-circuit fault of the wiring metal occur.

Hitherto, polysilane anti-reflective film is formed below the resist in the lithography step. When the resist is removed by performing $O_2$ ashing after the pattern has been formed, a phenomenon undesirably occurs in that polysilane is oxidized. Thus, oxidized polysilane cannot easily be removed.

Also, with progress in the miniaturization and operating speed of semiconductor devices, the wiring structure has progressed from a single layer structure into a multi-layered structure so as to arrive at the stage that a semiconductor device having a multi-layered wiring structure including five or more layers has been developed and manufactured. However, with progress in the degree of miniaturization, the operating speed and the multi-layered structure, the signal transmission delay caused by the so-called "inter-wiring parasitic capacitance" and the wiring resistance is brought about as a serious problem.

Various measures are taken for avoiding the signal transmission delay. For example, Cu having a resistivity lower than that of Al is used as a wiring material in order to decrease the wiring resistance. Since it is very difficult to process a Cu film into the shape of the wiring by the dry etching process as in the prior art, a damascene structure is employed in the case of a Cu wiring. On the other hand, a so-called "low-k material" having a dielectric constant lower than that of $SiO_2$ is used as an insulating material in order to decrease the inter-wiring parasitic capacitance.

However, with further progress in the degree of miniaturization of the semiconductor device in the future, it is expected that it will be difficult to cope with the signal transmission delay caused by the inter-wiring parasitic capacitance and the wiring resistance by simply employing the wiring structure using the low-k material and Cu in combination. Also, an additional problem is generated that the processing of the insulating film and the burying of the wiring material will be rendered difficult.

BRIEF SUMMARY OF THE INVENTION

As described above, the conventional manufacturing method of semiconductor devices by using dry etching technology suffers from problems that etching at a high aspect ratio cannot easily be performed, smoothing of the overall surface of the wafer cannot easily be performed when the device region has some deviation in density of devices, the surface roughness causes defective fabrication when a miniaturized gate electrode is formed and short-circuit fault easily occurs in the edge line portion of the gate electrode when the SAC hole is formed.

Moreover, there arises a problem in that etching is interrupted owing to residues produced in the dry etching step when etching of an interlayer insulating film at a high aspect ratio is performed. Another problem arises in that a necessity for stacking a silicon nitride film to serve as an etching stopper to make the depths of the formed trenches uniform and to prevent borderless etching reduces the operation speed of the semiconductor device. In addition, trenching occurring when the trenches are formed causes a fault in burying of the wiring metal. Since the alignment margin in the logic section is too small, borderless etching easily occurs when a mixed memory logic LSI is manufactured. Another problem arises in that polysilane used to form the reflection preventing film for the resist cannot easily be removed.

Also, with further progress in the degree of miniaturization in the wiring structure of an LSI, a problem is generated that it will be difficult to cope with the signal transmission delay caused by the inter-wiring parasitic capacitance and the wiring resistance by simply employing the wiring structure using the low-k material and Cu in combination.

Thus, the conventional manufacturing method of semiconductor devices by using dry etching technology suffers from a multiplicity of problems.

To overcome the above-mentioned problems, an aspect of the present invention is to provide a method of forming a multilayered insulating film by using an organic polysilicon film made of, for example, polysilane, a removing method and a method of forming an etching mask.

The manufacturing method of semiconductor devices by using dry etching technology uses an organic silicon film made of, for example, polysilane, which is able to easily form a smooth surface by a coating process and which can easily be dry-etched and smoothed. The organic silicon film is laminated with an insulating film such as a silicon oxide film or a silicon nitride film, a metallic film for use in metallization or the like. Alternatively, the organic silicon film is formed on a semiconductor substrate such that the organic silicon film forms a portion of the foregoing element. While using the obtained structure as a suppression layer or the like for improving the processing shape of the insulating film portion, the organic silicon film is microfabricated. Thus, a portion comprising an interlayer insulating film having a complicated dual-damascene structure is formed. Then, for example, oxygen is introduced into the organic silicon film so as to change the organic silicon film into an insulating film constituted by an organic silicon film oxide film and the like. Thus, a required constituting element of a semiconductor device is provided.

For example, some of the organic silicon film, which has the silicon and silicon bonds as the main chain thereof, has anti-reflective property. The organic silicon film cannot be used, as it is, as an insulating film of a semiconductor device. When a step of introducing oxygen or the like is performed, such organic silicon film can be employed as the insulating film of the semiconductor device.

As described above, according to the present invention, control of the shape and the depth of the metallization trench, formation of a contact hole having a high aspect ratio, prevention of borderless etching and improvement of problems occurring in a smoothing step, which have been difficult for the conventional dry etching step, can be performed. Moreover, a new method of removing polysilane employed as an anti-reflective film is provided.

Further, the present invention provides a semiconductor device having a wiring structure capable of coping with further progress in the degree of miniaturization and in the number of layers included in the multi-layered structure, and a method of manufacturing the particular semiconductor device.

Specifically, a manufacturing method of semiconductor devices by using dry etching technology according to an aspect of the present invention comprising the steps of: forming a organic silicon film on a semiconductor substrate, dry-etching the organic silicon film to form a portion that must be formed by the insulating film of the semiconductor device by using the organic silicon film, and changing the organic silicon film into an insulating film so that the portion of the semiconductor device constituted by the insulating film is formed.

According to another aspect of the present invention, there is provided a semiconductor device, comprising: a first wiring structure formed on a semiconductor substrate and including a first plug and a first wiring formed on the first plug; and a second wiring structure formed on the semiconductor substrate belonging to the wiring layer equal to the first wiring structure and including a second plug and a second wiring formed on the second plug; wherein the upper surface of the first wiring is positioned higher than the upper surface of the second wiring, and the lower surface of the first wiring is positioned flush with or lower than the upper surface of the second wiring.

According to still another aspect of the present invention, there is provided a method of manufacturing a semiconductor device, comprising forming a first insulating film on a semiconductor substrate; selectively etching the first insulating film so as to form a first wiring trench on the surface of the first insulating film, a first contact hole extending through that portion of the first insulating film which is positioned between the bottom of the first wiring trench and the semiconductor substrate, and a second contact hole extending through the first insulating film; burying a first conductive film in the first wiring trench, the first contact hole and the second contact hole; forming a second insulating film on the first insulating film having the first conductive film buried therein; selectively etching the second insulating film so as to form in the second insulating film a second wiring trench connected to the second contact hole and positioned substantially in parallel to the first wiring trench; and burying a second conductive film in the second wiring trench.

BRIEF DESCRIPTION OF THE SEVERAL VIEWS OF THE DRAWING

FIGS. 3A and 3B are cross sectional views showing steps of a manufacturing method of semiconductor devices according to a second embodiment;

FIGS. 4A and 4B are cross sectional views showing steps for describing effects of the manufacturing method of semiconductor devices according to a second embodiment;

DETAILED DESCRIPTION OF THE INVENTION

Figure 1A:
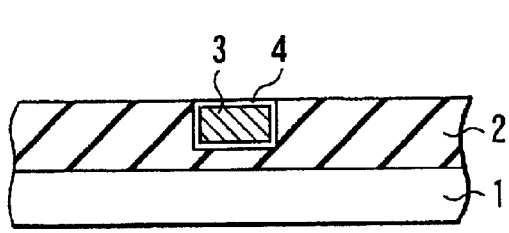
FIGS. 1A to 1F are cross sectional views showing steps of a manufacturing method of semiconductor devices according to a first embodiment.

Referring to the drawings, embodiments of the present invention will now be described.

<First embodiment>

Figure 1D:
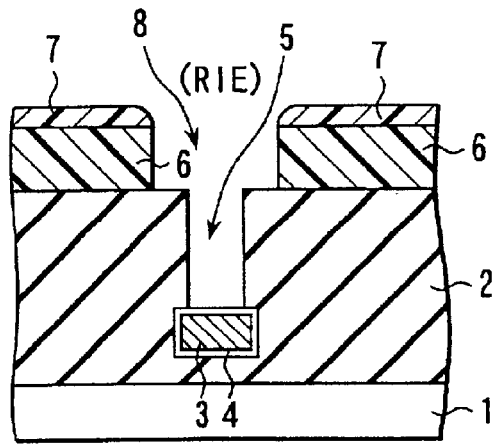
Figure 1B:
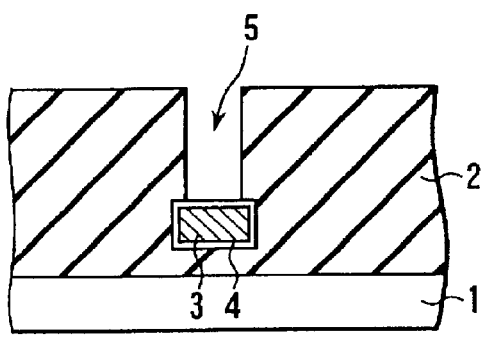
Figure 1E:
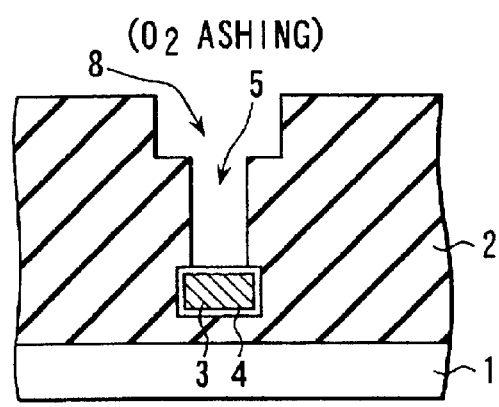
Figure 1C:
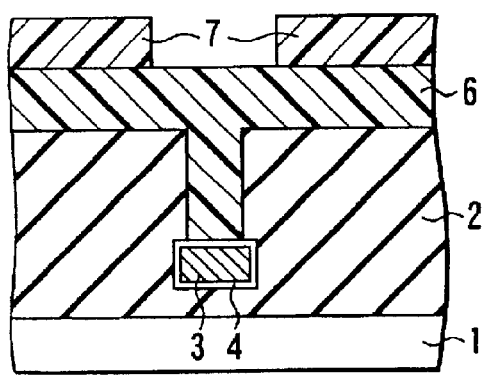
Figure 1F:
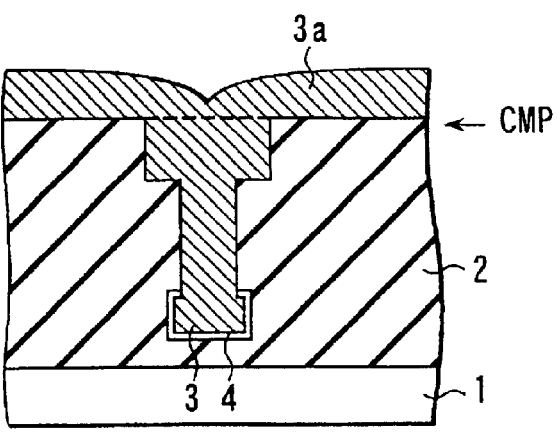
Figure 2A:
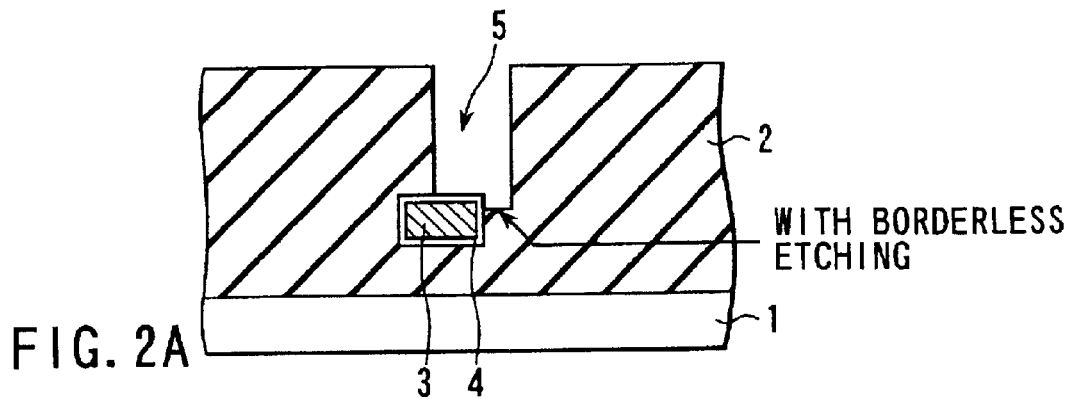
FIGS. 2A to 2C are cross sectional views showing steps for describing effects of a manufacturing method of semiconductor devices according to a first embodiment.
Figure 2B:
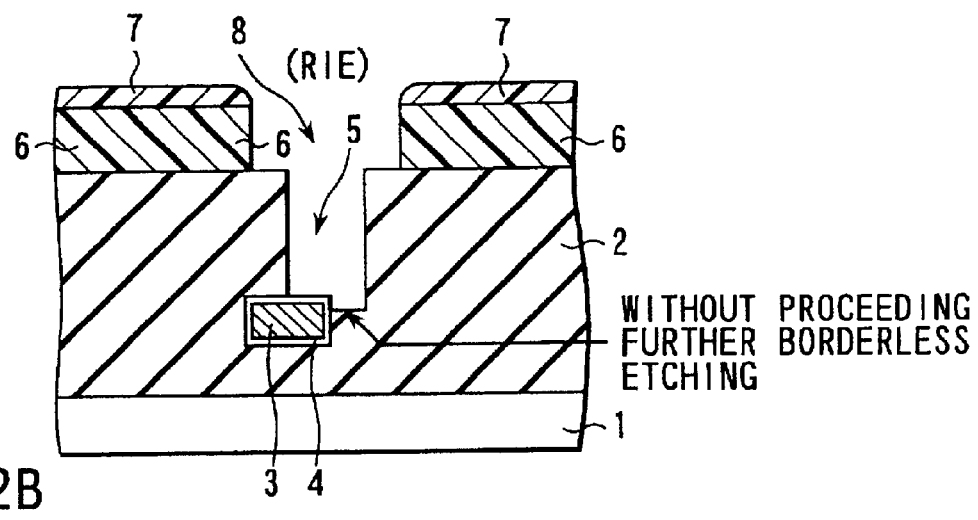
Figure 2C:
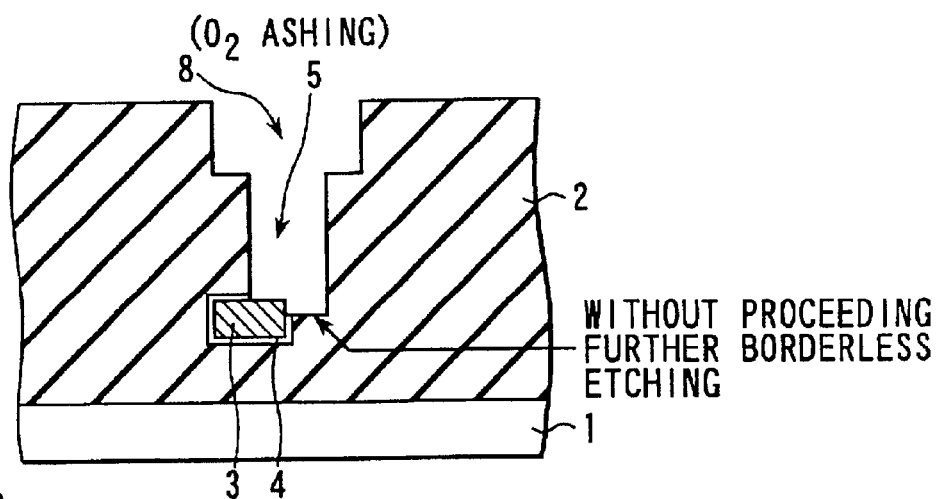

Referring to FIGS. 1A to 1F and FIGS. 2A to 2C, a first embodiment of the present invention will now be described. FIGS. 1A to 1F are diagrams showing the structure of an interlayer insulating film having a contact hole that is required to constitute a dual-damascene structure. FIGS. 2A to 2C are diagrams showing a method of forming the dual-damascene structure by performing dry etching and problems experienced with the method.

The interlayer insulating film for forming the dual-damascene structure is subjected to first trench formation for forming a first trench metallization, second trench formation for forming a second trench metallization and formation of a contact hole for connecting the first and second trench portions to each other.

As shown in FIG. 1A, an insulating film 2 is formed on a silicon substrate 1. To bury the first trench formed in the insulating film 2, a wiring metal 3 having the periphery coated with a silicon nitride film 4 is formed. The material of the insulating film 2 is usually a silicon oxide film. The surface of the insulating film 2 is smoothed by CMP by using the silicon nitride film 4 as a stopper (a suppression layer for use in a polishing step). Since the step of forming the trench metallization in the first layer shown in FIG. 1A is not directly related to the first embodiment, the step is omitted from description.

Then, an insulating film made of the same material as that of the smoothed insulating film 2 is stacked on the insulating film 2, as shown in FIG. 1B. Then, anisotropic etching is performed by RIE so that a contact hole 5 is formed. At this time, the silicon nitride film 4 serves as an etching stopper (a suppression layer against etching).

Then, as shown in FIG. 1C, the overall surface is coated with polysilane 6. The thickness of the polysilane 6 is made to be the same as the second trench. Since the polysilane 6 flows, the inside portion of the contact hole 5 is buried with the polysilane 6. Moreover, the surface of the polysilane 6 is sufficiently smoothed in a coating step so that the depth of the second trench is uniformed over the surface of the wafer.

Then, a resist 7 is applied to form the second trench in the polysilane 6. To form the second trench, an opening portion is formed. The resist 7 is used as a mask, the polysilane 6 is anisotropically etched by RIE under condition that the polysilane 6 has a high etching selective ratio with respect to the insulating film 2. Thus, as shown in FIG. 1D, the second trench 8 can be formed by using the insulating film 2 and the silicon nitride film 4 as etching stoppers, the formation being enabled without any exertion of an influence on the shape of the contact hole 5.

The RIE etching conditions were such that the pressure in a chamber was 75 mTor, the high frequency power was 300 W, and flux ratio of mixed gas $Cl_2/O_2$ was 75 sccm/10 sccm. Under the foregoing conditions, a high etching selective of about 100 was realized between the insulating film 2 constituted by a silicon oxide film ($SiO_2$) and the polysilane 6.

The polysilane 6 can easily and precisely be anisotropically etched by the RIE. Moreover, an etching selective ratio of about 50 can be realized with respect to the silicon nitride film 4. Therefore, the polysilane 6 which buries the inside portion of the contact hole 5 can completely be removed such that the silicon nitride film 4 is left.

Then, an $O_2$ ashing step is performed to remove the resist 7. At this time, the temperature of the silicon substrate 1 is raise to about 250° C. so that oxygen is introduced into the polysilane 6 via thermal diffusion. Therefore, the polysilane 6 is changed to a silicon oxide film so as to be a portion of the insulating film 2. The silicon oxide film changed from the polysilane 6 has a crystal structure near $SiO_2$ if the degree of oxidation is intense. Also from a viewpoint of electrical properties, the silicon oxide film can be considered as an insulating film constituted by $SiO_2$.

Thus, the polysilane 6 is formed into a portion of the insulating film 2, as shown in FIG. 1E. Thus, the interlayer insulating film 2 having the dual-damascene structure incorporating the contact hole 5 and the second trench 8 can precisely be formed.

Then, as shown in FIG. 1F, the silicon nitride film 4 covering the upper portion of the wiring metal 3 is removed by the RIE etching conditions with respect to a silicon nitride film. The material of the wiring metal is deposited to bury the contact hole 5 and the second trench 8. The material of the wiring metal may be Al-Cu or Cu. Then, the insulating film 2 is used as a stopper to remove an excess metallization portion 3a by CMP. Thus, an excellent dual-damascene structure having a shape that is controlled precisely can be formed.

Referring to FIGS. 2A to 2C, other important advantages of the method of forming the interlayer insulating film having the dual-damascene structure will now be described. Referring to FIG. 2A, a situation in which misalignment of the etching mask takes place when the contact hole 5 of the insulating film 2 is formed will now be described.

If etching stoppers are unevenly distributed in the plane when the surface of the insulating film made of $SiO_2$ and the like is smoothed by the CMP, the overall surface of the wafer cannot uniformly be smoothed.

Therefore, the step of forming the contact hole 5, when allowed to proceed to a state shown in FIG. 2A, encounters a fact that the thickness of the insulating film 2 in a state before the contact hole is formed varies.

To form the contact hole 5, which is able to reliably reach the silicon nitride film 4 that covers the wiring metal 3, in the insulating film thickness variation, excessive anisotropic RIE must be performed to realize a thickness larger than a predetermined thickness by 20% to 30%.

If the etching mask encounters misalignment, the silicon nitride film 4 cannot serve as the etching stopper in the misaligned portion. Therefore, excessive etching occurs as shown in FIG. 2A, causing a fault in wiring. The above-mentioned excessive etching occurring in the bottom of the contact hole is called "borderless etching".

Hitherto, the interlayer insulating film having the dual-damascene structure has been performed such that the thickness of the insulating film 2 is the thickness shown in FIG. 1E. Moreover, the contact hole 5 is formed by the anisotropic RIE until the silicon nitride film 4 is exposed to the outside. Then, the second trench 8 is formed by the anisotropic RIE.

Therefore, the thickness of the insulating film 2, when the contact hole 5 is formed, is enlarged excessively. Thus, the anisotropic RIE which must be carried out excessively is performed. Since anisotropic RIE is further performed when the second trench 8 is formed, the borderless etching is subjected to two times the anisotropic RIE operations. As a result, the occurrence of borderless etching is a critical problem that must be solved when the step of forming the interlayer insulating film having the dual-damascene structure is performed.

In the first embodiment, the second trench 8 is formed by using the polysilane 6. Therefore, the thickness of the insulating film 2 when the contact hole 5 is formed is small. Hence it follows that borderless etching of the insulating film 2 shown in FIG. 2A can be prevented. Since the insulating film 2 is formed by using the polysilane that can easily be fabricated and a high etching selective ratio is realized with respect to the insulating film 2, there is no apprehension that borderless etching continues during anisotropic RIE for removing the polysilane in the contact hole 5, as shown in FIG. 2B.

Then, as shown in FIG. 2C, $O_2$ ashing is performed to remove the resist 7 and oxidation of the polysilane 6 are simultaneously be performed. Then, the wiring metal is buried and smoothing is performed so that dual-damascene structure free of excessive borderless etching is formed.

The organic silicon having the main chains that are the bondings of silicon and silicon cannot be employed as the material of the interlayer insulating film as it is. If $O_2$ is introduced into the material by using a method such as $O_2$ ashing, the organic silicon such as polysilane is changed to an insulating material near $SiO_2$ from electrical and mechanical viewpoints. Therefore, the changed material can be used to form a required interlayer insulating film.

The first embodiment is effective as a method of manufacturing a mixed memory logic LSI incorporating a DRAM section and a logic section as mounted on one chip. Since the alignment margin in the logic section is smaller than that in the memory section as described above, borderless etching easily occurs in the logic section. When the structure according to the first embodiment is employed, the mixed memory logic LSI can be manufactured with a high manufacturing yield.

<Second embodiment>

Referring to FIGS. 3A, 3B, 4A and 4B, a second embodiment of the present invention will now be described. As shown in FIG. 3A, a trench metallization in the first layer is formed in the insulating film 2. The silicon nitride film 4 is used as a stopper to perform a smoothing step, and the overall surface is coated with the polysilane 6. The resist 7 and the anisotropic RIE are employed to form the contact hole 5 in the polysilane 6. Then, the resist 7 is removed by performing $O_2$ ashing. Simultaneously, the polysilane 6 is changed to the insulating film 2 constituted by the silicon oxide film. Thus, the shape of the insulating film 2 shown in FIG. 1B according to the first embodiment is formed. The foregoing insulating film 2 is used to perform the steps following the step shown in FIG. 1.

A situation is shown in FIGS. 4A AND 4B in which misalignment has occurred when the resist mask 7 for the contact hole 5 is formed by the method according to the second embodiment. In the second embodiment, the contact hole 5 is formed in the polysilane 6 if the misalignment shown in FIG. 4A occurs. Therefore, a satisfactorily high etching selective ratio can be realized with respect to the insulating film 2. Thus, the insulating film 2 serves as the etching stopper so that the controllability of the anisotropic RIE is improved. As a result, borderless etching can be prevented.

Then, as shown in FIG. 4B, the $O_2$ ashing step is performed to remove the resist 7. Simultaneously, the polysilane 6 is changed to the silicon oxide film to make the silicon oxide film to be a portion of the insulating film 2. Then, the silicon nitride film 4 covering the upper portion of the silicon nitride film 4 is removed. As a result, the steps for forming the dual-damascene structure following the step shown in FIG. 2C according to the first embodiment can be employed.

FIG. 4B shows a characteristic that any borderless etching as shown in FIG. 2C does not occur. Although the area of connection between the wiring metal for burying the contact hole 5 and the wiring metal 3 in the first layer is reduced, the defective wiring due to borderless etching can significantly be prevented.

When the structure according to the second embodiment is employed, the deterioration in the manufacturing yield of the logic section of the mixed memory logic LSI owing to the borderless etching can be significantly suppressed.

Although the second embodiment has been described as a method of forming the contact hole 5 having the dual-damascene structure, the present invention is not limited to the foregoing description. The structure may be applied to formation of a contact hole having a usual multilayered metallization.

<Third embodiment>

Referring to FIGS. 5A to 5D, a third embodiment of the present invention will now be described. The third embodiment is different from the second embodiment in the insulating film 2 shown in FIG. 3A is constituted by polysilane 6.

Figure 5A:
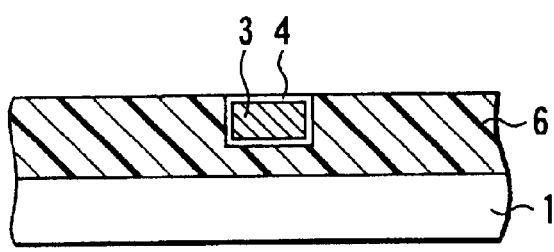
FIGS. 5A to 5D are cross sectional views showing steps of a manufacturing method of semiconductor devices according to a third embodiment.

As shown in FIG. 5A, the silicon substrate 1 is coated with the polysilane 6. Since the silicon substrate 1 has been subjected to a wafer process, a variety of elements of the semiconductor device have been mounted. Therefore, the surface of the silicon substrate 1 usually has complicated step differences.

Since the polysilane 6 flows, the step differences are buried by coating. Moreover, any surface polishing is not required because the overall surface of the wafer has satisfactory flatness to permit execution of the dry etching process.

Then, the resist (not shown) is used as a mask to perform the anisotropic RIE to form the first trench in the polysilane 6. As described above, the polysilane can easily be subjected to the anisotropic RIE and the surface of the polysilane is flat. Therefore, any etching stopper is not required to form the first groove having uniform depths, and from a viewpoint of practical use can be formed by only controlling the conditions of the RIE process.

The step of covering the wiring metal 3, the step of burying the silicon nitride film 4 and the step of removing excess wiring metal and silicon nitride film left on the polysilane 6 are combined so that the first trench metallization shown in FIG. 5A is formed.

As shown in FIG. 5A, the polysilane 6 is changed to the silicon oxide film in the step of removing the resist (not shown) for use to form the first trench by $O_2$ ashing. To describe the difference from the second embodiment, the silicon oxide film is illustrated as the polysilane 6.

Figure 5B:
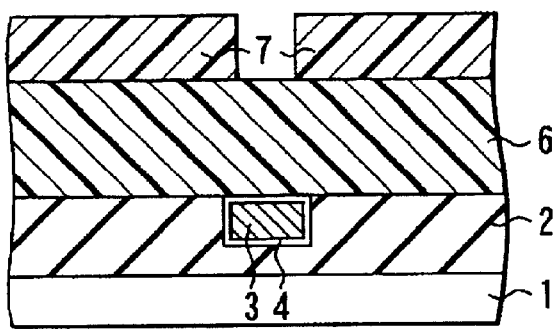

Then, as shown in FIG. 5B, the wiring metal 3 covered with the insulating film 2 constituted by the silicon oxide film and the silicon nitride film 4 is coated with the polysilane 6. Then, the pattern of the resist 7 is formed to align the opening position of the contact hole.

Figure 5C:
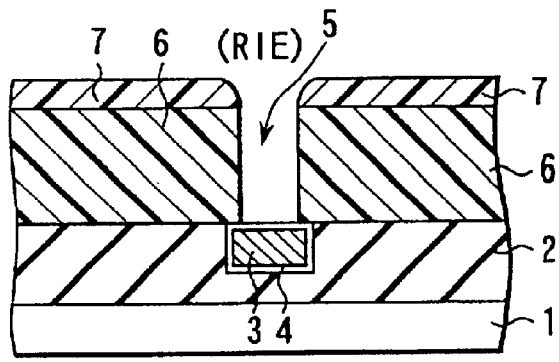
Figure 5D:
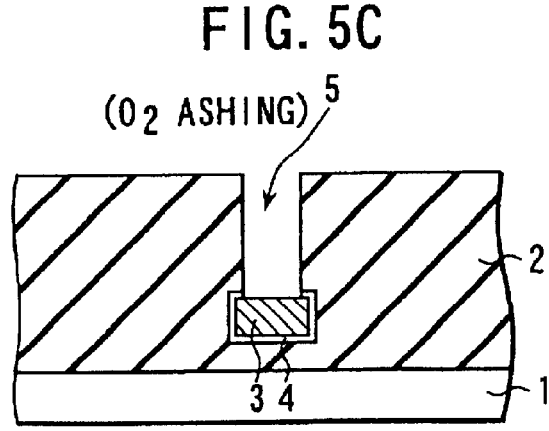

Then, as shown in FIG. 5C, the resist 7 is used as a mask to form the contact hole 5, which reaches the silicon nitride film 4, in the polysilane 6. The resist 7 is removed by $O_2$ ashing. Simultaneously, the polysilane 6 is changed to the insulating film 2 constituted by the silicon oxide film. Moreover, the silicon nitride film 4 on the wiring metal 3 is removed. Thus, as shown in FIG. 5D, all of the structures of the insulating film 2 shown in FIG. 3B according to the second embodiment can be formed by using polysilane 6 as the material.

Since the polysilane 6 changed to the insulating film 2 has material properties similar to those of the integrated insulating film 2, the manufacturing process following the process shown in FIG. 1C according to the first embodiment can be employed.

The merit of the third embodiment obtainable from formation of the first trench metallization shown in FIG. 5A with polysilane lies in that a flat surface constituted by the polysilane can be obtained if the surface of the silicon substrate 1 has step differences. The conventional method with which the insulating film 2 is deposited cannot prevent formation of a stepped portion also on the surface of the insulating film 2. Therefore, the first trench having a uniform width and depth cannot be formed.

When the insulating film 2 is deposited thick and the surface is smoothed by performing CMP, the shape of the first trench can be improved. However, the problem of uneven density of the stoppers for use in the polishing step remains to be solved. Therefore, the overall surface of the wafer cannot easily be smoothed in ordinary cases. When the polysilane 6 is applied, the foregoing problem can considerably be easily prevented. As a matter of course, the third embodiment attains a similar resilt of preventing borderless etching to that obtainable from the second embodiment.

<Fourth embodiment>

A fourth embodiment of the present invention will now be described with reference to FIGS. 6A to 6I. Hitherto, formation of a contact hole having a high aspect ratio or formation of a trench encounters film thinning of the resist that is used as the mask for the anisotropic RIE step. As a result, there arises a problem where the thickness of the residual film of the resist to serve as the mask is excessively reduced.

To prevent the foregoing problem, a method may be employed which has the steps of: forming a reversed pattern of the opening portion of the contact hole; changing the surface of the polysilane existing in the outer portion of the exposed opening portion to the insulating film constituted by the silicon oxide film by performing $O_2$ RIE or implantation of $O_2$ ions, and opening the polysilane by using the insulating film as a mask. Thus, a satisfactory contact hole and the trench can be formed.

Figure 6A:
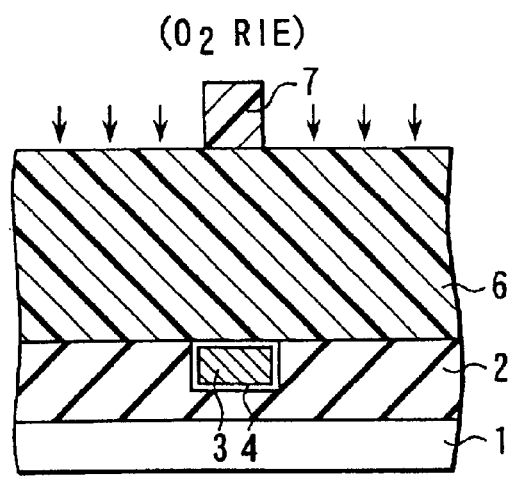
FIGS. 6A to 6I are cross sectional views showing steps of a manufacturing method of semiconductor devices according to a fourth embodiment.

That is, as shown in FIG. 6A, the surface of the first trench metallization constituted by the insulating film 2 on the silicon substrate 1 and the wiring metal 3 covered with the silicon nitride film 4 is coated with the polysilane 6. Then, the pattern of the resist 7 is formed to cover the portion in which the contact hole will be formed.

Figure 6B:
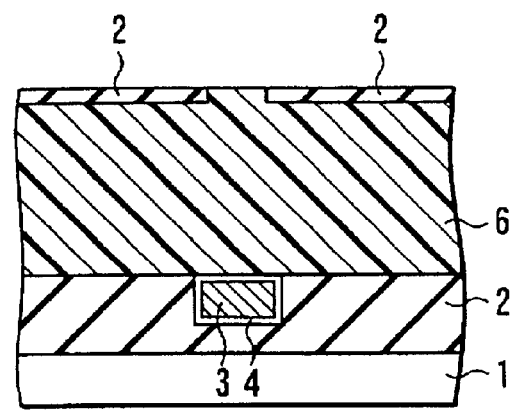

Then, the resist 7 is used as a mask to introduce $O_2$ ions into the surface of the polysilane 6 by using an $O_2$ RIE machine as indicated with an arrow shown in FIG. 6A. Then, $O_2$ ashing is performed to remove the resist 7. Thus, as shown in FIG. 6B, the insulating film 2 constituted by the silicon oxide film is formed on the surface of the polysilane 6. The ashing of the resist 7 is performed minimally to prevent change of the surface of the polysilane 6 covered with the lower portion of the resist 7 to the silicon oxide film.

Figure 6C:
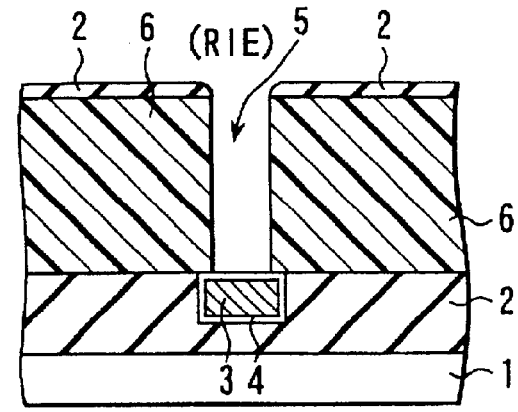

Since the etching selective ratio of the polysilane 6 with respect to the insulating film 2 can be raised as described above, the resist 7 is removed and the anisotropic RIE step is performed by using the insulating film 2 as a mask as shown in FIG. 6C. Thus, the contact hole 5 can be formed in the polysilane 6 by using the silicon nitride film 4 as the etching stopper.

Then, treatment similar to the $O_2$ ashing step is performed in the same chamber in which RIE has been performed so that $O_2$ ions are introduced from the inner surface of the contact hole 5 opened in the polysilane 6. As a result, the overall body of the polysilane 6 can be changed to the insulating film constituted by the silicon oxide film.

Figure 6D:
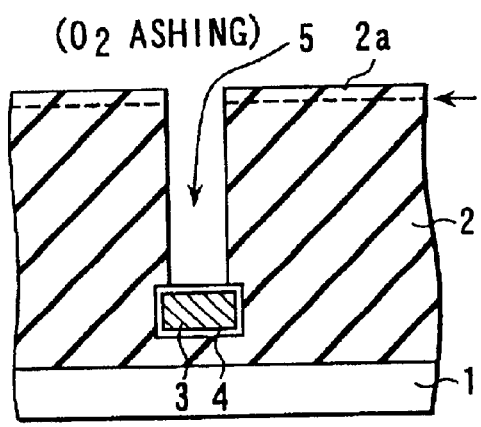

Thus, as shown in FIG. 6D, both of the insulating film 2 for use to form the first trench and the insulating film for performing formation of the contact hole 5 and used as the etching mask can be formed as the integrated insulating film 2 constituted by the silicon oxide film.

At this time, the edge of the periphery of the opening portion of the insulating film 2a used as the mask is rounded by the anisotropic RIE. When rounding excessively occurs and raises a problem in the structure, removal of the insulating film 2a is required by CMP, as shown in FIG. 6D.

Note that attention must be focused on a fact that the rounded portion of the edge adjacent to the opening portion has an effect of smoothing the burying step when the wiring metal is buried in the contact hole and when the contact hole of the insulating film 2 shown in FIG. 6D has a high aspect ratio.

Figure 6G:
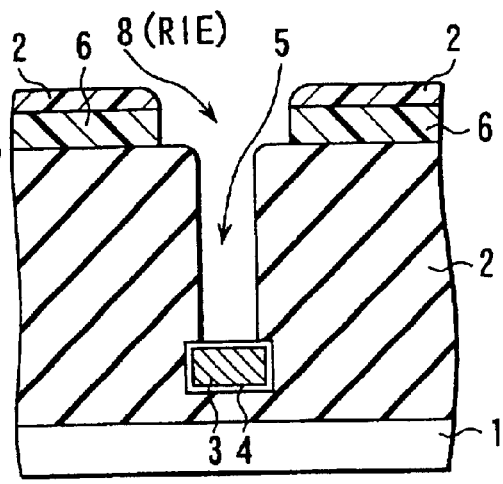
Figure 6E:
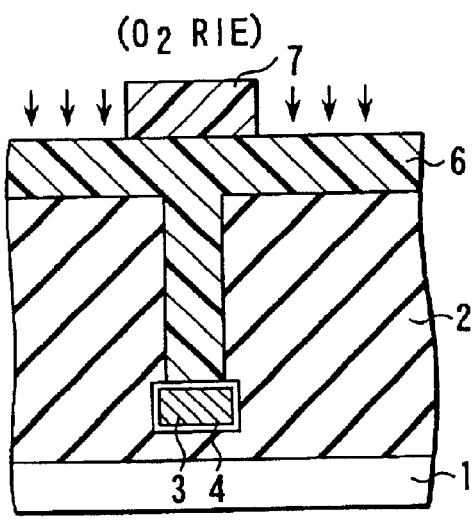

Then, as shown in FIG. 6E, the overall surface is coated with the polysilane 6 such that the contact hole is buried. Then, reversed patterning is performed to cover the opening portion of the second trench by using the resist 7. The resist 7 is used as a mask to introduce oxygen into the surface of the polysilane 6 by using the $O_2$ RIE machine.

Figure 6H:
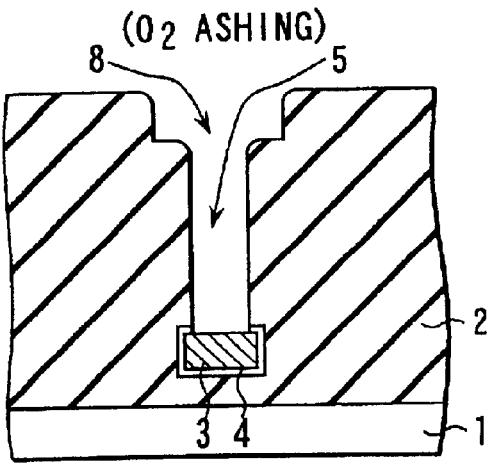
Figure 6F:
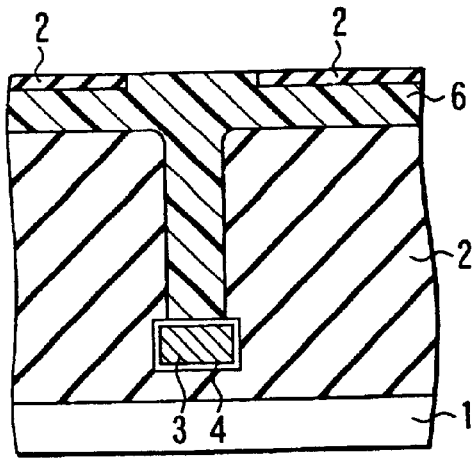

Then, the steps shown in FIGS. 6B and 6C are repeated as shown in FIGS. 6F and 6G so that a treatment similar to the $O_2$ ashing is continuously performed in the same chamber. The insulating film 2 completely constituted by the silicon oxide film and having the dual-damascene structure can be formed on the silicon substrate 1, as shown in FIG. 6H.

Figure 6I:
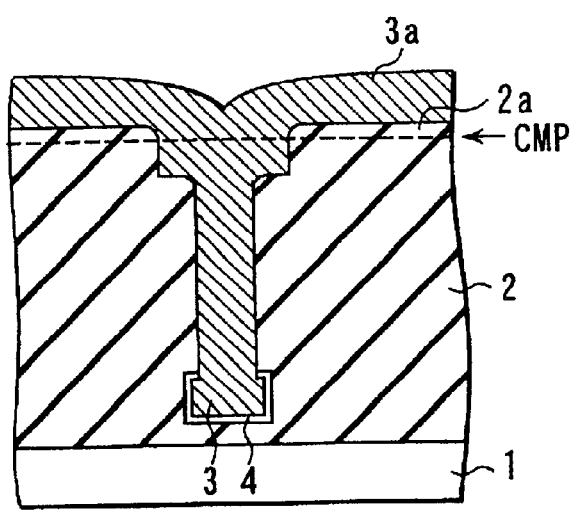

Then, as shown in FIG. 6I, the silicon nitride film 4 on the upper portion of the wiring metal 3 is removed, and the wiring metal is deposited to bury the contact hole 5 and the second trench 8. The wiring metal may be Al-Cu or Cu. Then, the wiring metal removal portion 3a that has excessively been deposited is removed by CMP by using the insulating film 2 as a stopper. Thus, an excellent dual-damascene structure having a shape that is precisely controlled can be formed.

When the anisotropic RIE results in an excessive rounded edge adjacent to the opening portion of the insulating film that was used as the etching mask and a problem in terms of the structure arises, the CMP step is furthermore performed to remove the insulating film removal portion 2a by polishing.

When the second trench 8 shown in FIG. 6H has a high aspect ratio, attention must be focused on the fact that the insulating film removal portion 2a generated adjacent to the opening portion has the effect of smoothing the burying step when the wiring metal is buried in the second trench 8 as shown in FIG. 6I.

<Fifth embodiment>

Figure 7A:
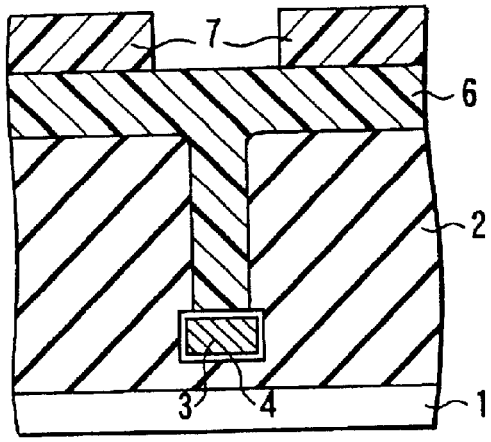
FIGS. 7A to 7C are cross sectional views showing steps of a manufacturing method of semiconductor devices according to a fifth embodiment.
Figure 7B:
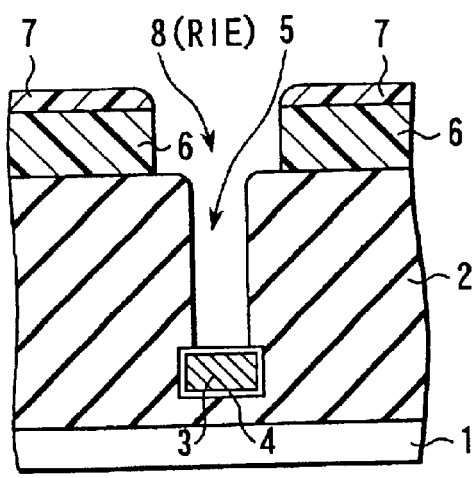
Figure 7C:
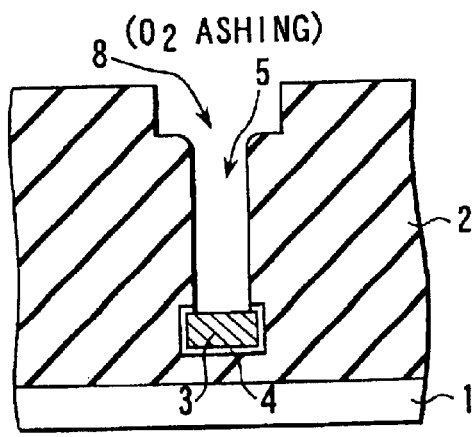

Referring to FIGS. 7A to 7C, a fifth embodiment of the present invention will now be described. Referring to FIG. 7A, the step until the overall surface is coated with the polysilane 6 such that the contact hole is buried is similar to that according to the fourth embodiment shown in FIG. 6E.

In the fourth embodiment, the resist 7 is formed by performing reversed patterning such that the opening portion of the second trench 8 of the polysilane 6 is covered. The fifth embodiment is structured such that the overall surface is coated with the polysilane 6. Then, the resist 7 is used to open the formation position of the second trench 8 by performing a usual patterning.

Since the insulating film 2 can be formed by using the polysilane 6 which can easily be fabricated, the film thinning of the resist mask can be reduced during the anisotropic RIE step. Therefore, as shown in FIG. 7B, the resist 7 can be used as the etching mask to perform the formation of the second trench 8 and remove the polysilane with which the contact hole 5 is filled.

As shown in FIG. 7C, the polysilane 6 is changed to the insulating film 2 constituted by the silicon oxide film simultaneously with the step of removing the resist 7 by $O_2$ ashing. Thus, the interlayer insulating film 2 having the dual-damascene structure on the silicon substrate 1 can be formed into the insulating film constituted by an integrated silicon oxide film.

Since the anisotropic RIE enables the rounded portion generated at the edge adjacent to the opening portion of the resist 7 to be removed together with the resist 7, the foregoing method has a merit when the rounded portion is undesirable as the processed shape. When the step of burying the material of the metallization shown in FIG. 1F is added to be performed successively, a dual-damascene structure can be formed.

In the first to fifth embodiments, the RIE using the $O_2$ plasma or implantation of $O_2$ ions is employed to form the insulating film constituted by the silicon oxide film. The method is not limited to the foregoing methods.

Alternatively, any one of the following methods may be employed: thermal oxidation which is performed in an $O_2$ atmosphere, ashing which uses O3 plasma, irradiation with ultraviolet rays and dipping opening portions into section in which sulfuric acid and hydrogen peroxide are mixed. Also the method enables polysilane to be changed to the insulating film constituted by the silicon oxide film.

The organic silicon film such as polysilane, can be changed to an insulating film in various stages owing to the degree of oxidation which include: an organic silicon oxide film in which carbon is left in the oxide film, an inorganic silicon oxide film from which carbon has been removed, that has a crystal structure having irregularity as compared with $SiO_2$ and which contains OH groups, and a silicon oxide film subjected to further heat treatment to have the crystal structure similar to that of $SiO_2$.

For example, the trench metallization in the first layer and the contact hole are formed by using organic silicon oxide film. Then, organic silicon is applied to form the second trench and ashing is performed in a gas composed of only $O_2$. In this case, carbon may be left in organic silicon by controlling the temperature. Alternatively, heat treatment may be performed in an atmosphere of mixed gas of $O_2$ and $CO_2$ to change the organic silicon constituting the second trench to an organic silicon oxide film having a dielectric constant similar to that of the organic silicon oxide film.

When organic silicon film such as polysilane is subjected to heat treatment that is performed in a mixed gas atmosphere of $O_2$ and $CO_2$, or when the organic silicon is subjected to RIE using CO, or when implantation of CO ions is performed, the organic silicon oxide film having a dielectric constant similar to that of the organic silicon oxide film can be formed.

When organic silicon film such as polysilane is subjected to ashing using a gas containing only $H_2$ or a mixed gas of $H_2$ and $O_2$ when RIE, implantation of ions, or heat treatment is performed, the inorganic silicon oxide film can be formed.

When the organic silicon such as polysilane is subjected heat treatment in a mixed gas atmosphere of $N_2$ and $O_2$ or when ashing, RIE, or implantation of ions is performed by using the foregoing gas, the silicon oxide nitride film or a silicon nitride film can be formed.

The silicon oxide film, the silicon oxide nitride film and silicon nitride film may be employed to a dry etching process of the contact hole and the trench according to the present invention.

<Sixth embodiment>

Figure 8A:
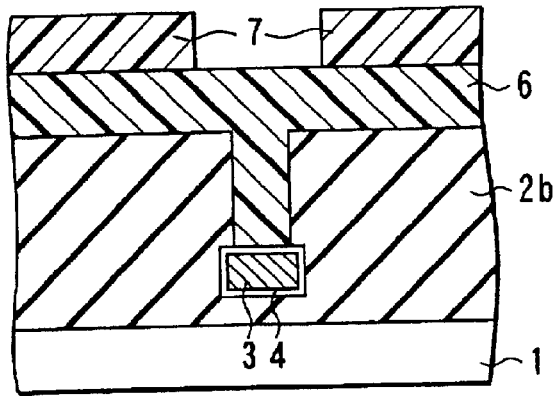
FIGS. 8A to 8C are cross sectional views showing steps of a manufacturing method of semiconductor devices according to a sixth embodiment.
Figure 8B:
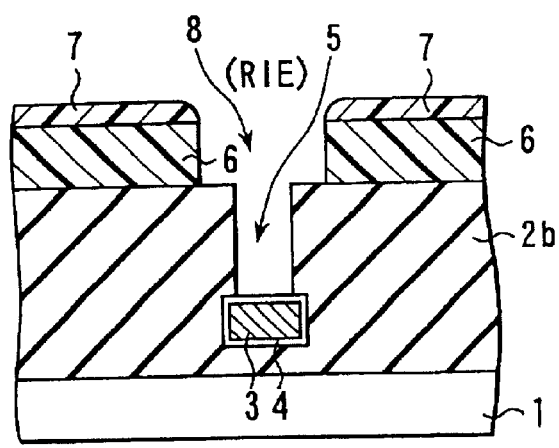
Figure 8C:
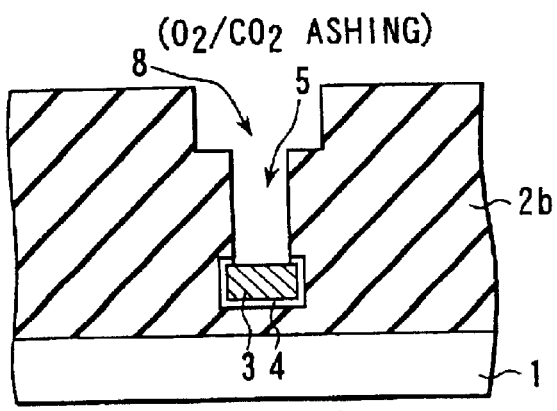

Referring to FIGS. 8A to 8C, a sixth embodiment of the present invention will now be described. As shown in FIG. 8A, the sixth embodiment is structured such that formation of the interlayer insulating film having the dual-damascene structure is performed by using an organic silicon oxide film 2b until the step of formation of the trench metallization in the first layer and the contact hole. Since the organic silicon oxide film 2b is formed by a method similar to that at the third embodiment described with reference to FIGS. 5A to 5D, a detailed description of the method is omitted.

As shown in FIG. 8A, the surface of the organic silicon oxide film 2b is coated with the polysilane 6 to bury the contact hole. The resist 7 is used to open the portion in which the second trench will be formed. Then, as shown in FIG. 8B, the resist 7 is used as the etching mask to perform anisotropic RIE so as to form the second trench 8 in the polysilane 6. Then, the polysilane 6 with which the contact hole 5 is filled is removed until the silicon nitride film 4 is exposed to the outside.

Then, as shown in FIG. 8, ashing is performed by using a mixed gas of $O_2$ and $CO_2$ to remove the resist 7. Simultaneously, change is caused to occur such that the polysilane 6 has a dielectric constant that is the same as the organic silicon oxide film 2b so as to be a portion of the organic silicon oxide film 2b. Thus, an interlayer insulating film having the dual-damascene structure, the overall body of which is made of the organic silicon oxide film, can be formed.

<Seventh embodiment>

Figure 9A:
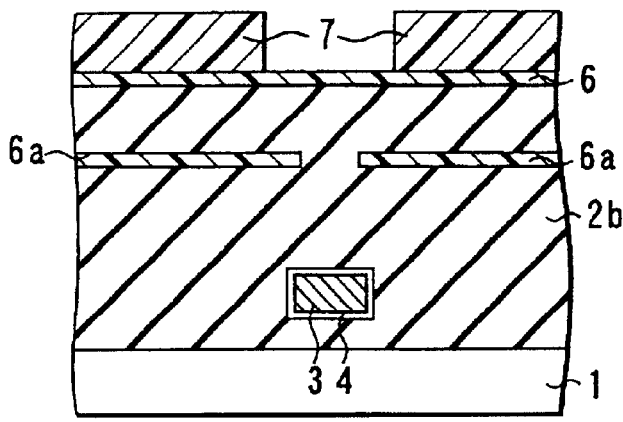
FIGS. 9A to 9C are cross sectional views showing steps of a manufacturing method of semiconductor devices according to a seventh embodiment.
Figure 9B:
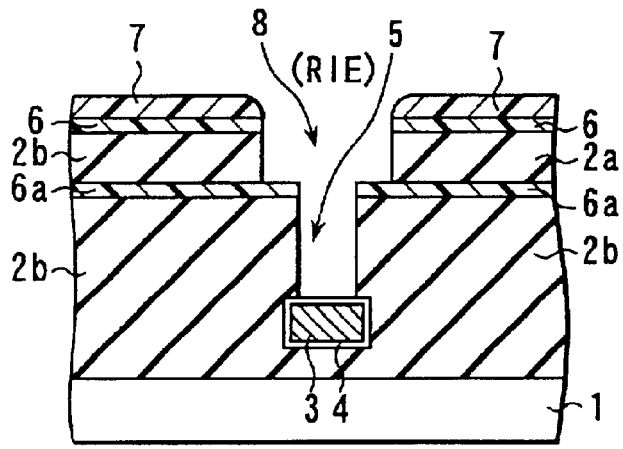
Figure 9C:
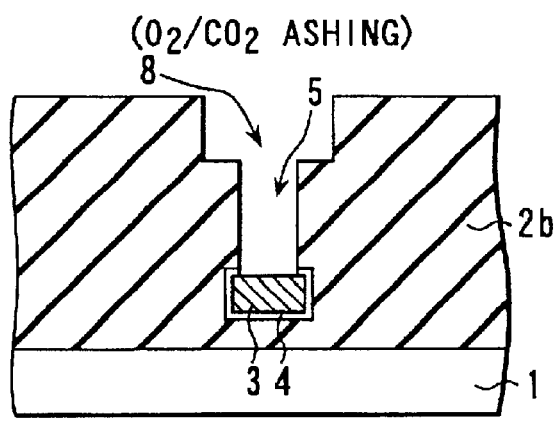

Referring to FIGS. 9A to 9C, a seventh embodiment of the present invention will now be described. In the seventh embodiment, the overall body of the interlayer insulating film having the dual-damascene structure is formed by using the organic silicon oxide film 2b such that the polysilane 6a serving as the etching stopper for forming the second trench is buried.

As shown in FIG. 9A, an opening portion is previously formed in the etching stopper constituted by the polysilane 6a so as to also be used as the etching mask for forming the contact hole. Moreover, the surface of the organic silicon oxide film 2b is coated with the polysilane 6 as the anti-reflective film. The resist 7 is used to form the opening portion in the region in which the second trench will be formed.

Then, as shown in FIG. 9B, RIE is performed to remove the anti-reflective film constituted by the polysilane 6. Then, the RIE conditions for the organic silicon oxide film 2b are employed to perform anisotropic etching to reach the silicon nitride film 4. Thus, only one RIE operation enables the contact hole 5 and the second trench 8 to be formed.

At this time, the anisotropic etching is performed under the RIE conditions that the flow ratio of mixed gas $C_4F_8$/CO/Ar/$O_2$ is 10/50/200/8 sccm, the pressure is 40 mTorr, the high frequency electric power of 1400 W is applied. Thus, the etching selective ratio of the polysilane 6 with respect to the organic silicon oxide film can be made to be 10 or higher. Therefore, the polysilane 6 can be used as the etching mask for the contact hole 5 and the etching stopper when the second trench 8 is formed.

Then, as shown in FIG. 9C, the silicon nitride film 4 covering the upper portion of the wiring metal 3 is removed, and then a mixed gas Of $O_2$ and $CO_2$ is used to perform ashing so that the resist 7 is removed. Simultaneously, the polysilane 6 and polysilane 6a are changed to have the same dielectric constant as that of the organic silicon oxide film 2b as the portion of the organic silicon oxide film 2b. Thus, the interlayer insulating film having the dual-damascene structure, the overall body of which is made of the integrated organic silicon oxide film, can be formed.

In the seventh embodiment, the organic silicon oxide film 2b must be formed to bury the polysilane 6a. That is, oxidation of the polysilane 6a during the process for forming the organic silicon oxide film 2b must be prevented. To prevent oxidation of the polysilane 6a, for example, a method may be employed where an intermediate process is performed such that the surface of the polysilane 6a is covered with a thin plasma $SiO_2$ film and a barrier against introduction of $O_2$ is formed.

The thin $SiO_2$ film is removed from the surface of the polysilane 6a in the step show in FIG. 9B. Therefore, change of the polysilane 6a to a portion of the organic silicon oxide film in the step shown in FIG. 9C is not obstructed.

In the seventh embodiment, the material of the interlayer insulating film is organic silicon oxide film. Note that the material is not limited to the organic silicon oxide film. When the inorganic silicon oxide film or silicon oxide film is employed as the material of the interlayer insulating film, the polysilane 6a is similarly employed as the etching stopper and the etching mask.

At this time, polysilane is employed as the anti-reflective film 6. Note that the material is not limited to polysilane. For example, an organic anti-reflective film may be employed. When the organic anti-reflective film is employed, the anti-reflective film can also be removed when the resist 7 is removed by ashing.

<Eighth embodiment>

Figure 10A:
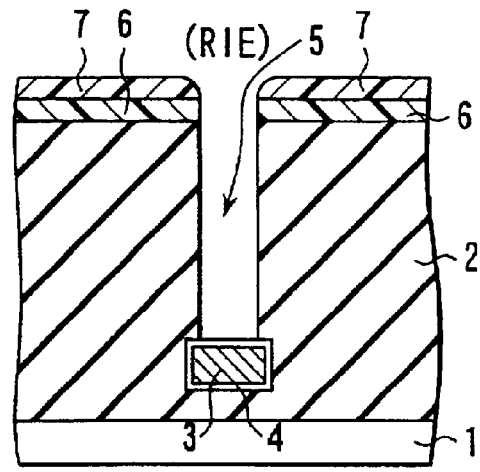
FIGS. 10A to 10C are cross sectional views showing steps of a manufacturing method of semiconductor devices according to an eighth embodiment.
Figure 10B:
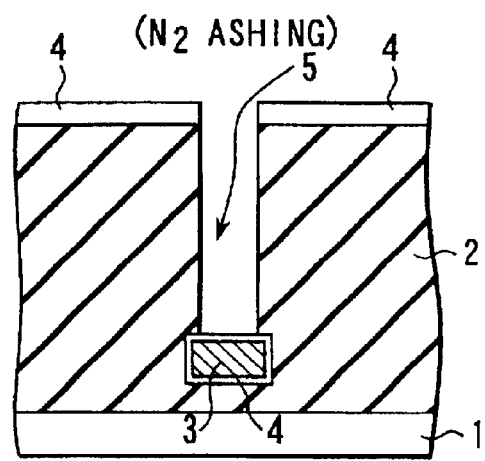
Figure 10C:
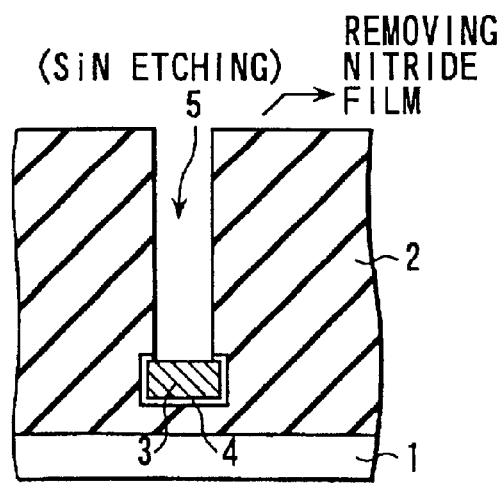

Referring to FIGS. 10A to 10C, an eighth embodiment of the present invention will now be described. In the eighth embodiment, the polysilane is changed to the silicon nitride film so as to be used as a mask when a contact hole having a high aspect ratio is formed.

As shown in FIG. 10A, the trench metallization in the first layer is formed by using the insulating film 2. Then, the insulating film 2 is again deposited on the first trench metallization to bury the first trench metallization with the thick insulating film 2 so that the surface is smoothed. Then, the polysilane 6 is applied, and then the pattern of the resist 7 for forming the opening portion of the contact hole having the high aspect ratio is formed. The polysilane 6 is an anti-reflective film in an exposing step in the lithography process for opening the resist 7.

Then, the resist 7 is used as the etching mask when the contact hole 5 is formed in the insulating film 2 by anisotropic RIE. Thus, the silicon nitride film 4 covering the wiring metal 3 is exposed to the outside. At this time, the silicon nitride film 4 serves as a stopper for use in the anisotropic RIE step.

Then, as shown in FIG. 10B, the resist 7 is removed by $N_2$ ashing. Simultaneously, the anti-reflective film constituted by the polysilane 6 is changed to the silicon nitride film 4. The silicon nitride film 4 and the silicon nitride film 4 covering the wiring metal 3 are removed by hot phosphoric acid etching or by CDE (Chemical Dry Etching). Thus, as shown in FIG. 10C, the contact hole 5 having a high aspect ratio reaches the wiring metal 3 and the first layer can be formed.

The eight embodiment is characterized in that the anti-reflective film constituted by the polysilane 6, which is left on the surface and which cannot therefore easily be removed by the $O_2$ ashing for removing the resist 7, is changed to the silicon nitride film simultaneously with removal of the resist 7 by performing $N_2$ ashing. Thus, the removal can easily be performed by wet etching or the CDE.

<Ninth embodiment>

Figure 11A:
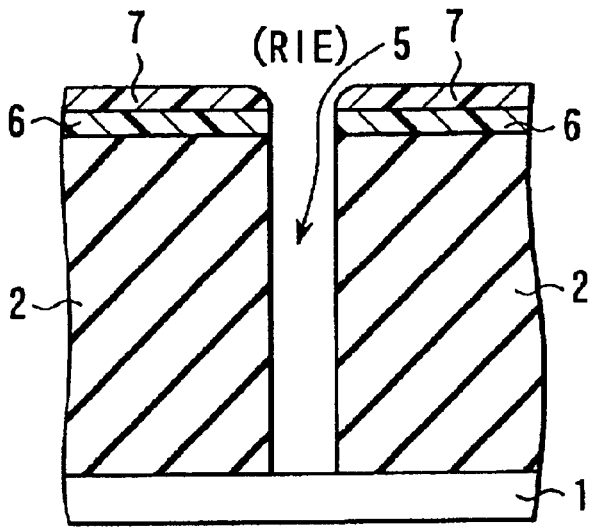
FIGS. 11A to 11C are cross sectional views showing steps of a manufacturing method of semiconductor devices according to a ninth embodiment.
Figure 11B:
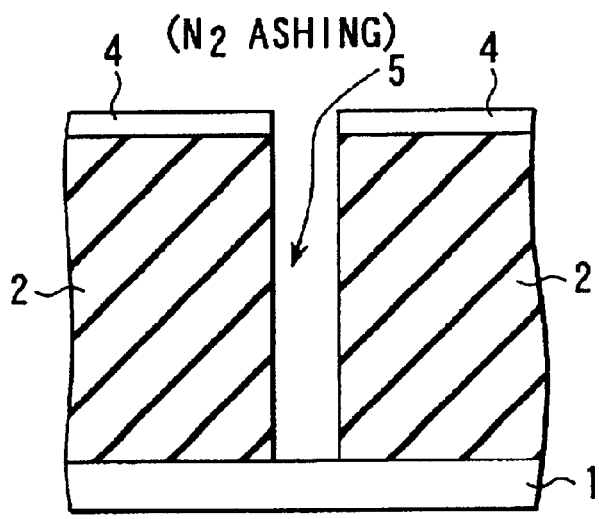
Figure 11C:
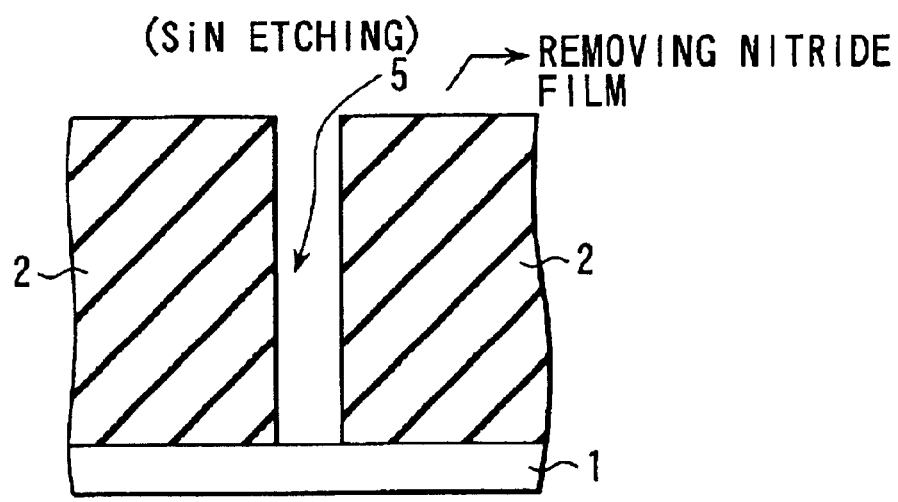

Referring to FIGS. 11A to 11C, a ninth embodiment of the present invention will now be described. The ninth embodiment is a modification of the eighth embodiment, in which a contact hole having a high aspect ratio is formed to directly reach the silicon substrate 1.

As shown in FIG. 11A, a thick insulating film 2 is directly formed on the silicon substrate 1. Then, an anti-reflective film constituted by the polysilane 6 is applied. Then, the pattern of a resist 7 having an opening portion of the contact hole is formed on the anti-reflective film.

The resist 7 is used as the etching mask to perform anisotropic RIE to form the contact hole 5 that reaches the surface of the silicon substrate 1. Then, as shown in FIG. 11B, $N_2$ ashing is performed to remove the resist 7. Simultaneously, the anti-reflective film constituted by the polysilane 6 is changed to the silicon nitride film 4.

The anti-reflective film changed to the silicon nitride film 4 is removed by a hot phosphoric acid treatment. Thus, the contact hole having a high aspect ratio which reaches the surface of the silicon substrate shown in FIG. 11C can be formed.

<Tenth embodiment>

Figure 12A:
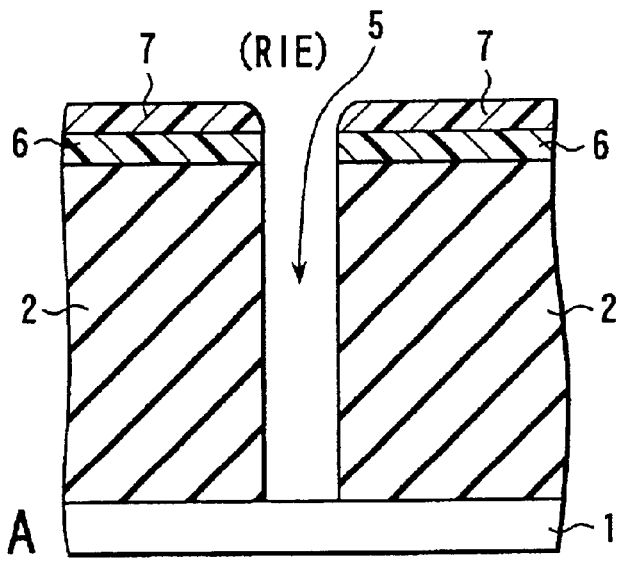
FIGS. 12A and 12B are cross sectional views showing steps of a manufacturing method of semiconductor devices according to a tenth embodiment.
Figure 12B:
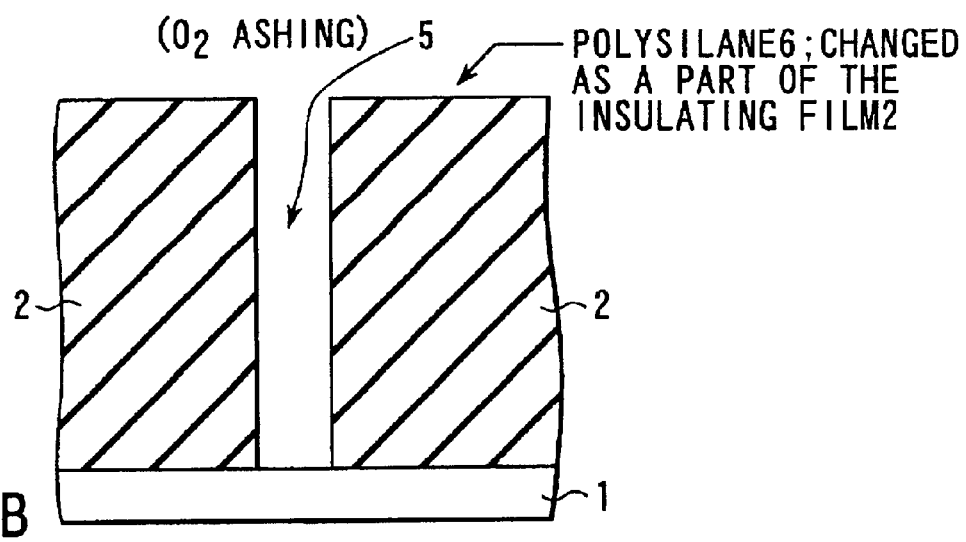

Referring to FIGS. 12A and 12B, a tenth embodiment of the present invention will now be described. The tenth embodiment is different from the eighth embodiment in that the anti-reflective film constituted by the polysilane 6 is made to be a portion of the insulating film 2 after the contact hole 5 has been formed.

As shown in FIG. 12A, a thick insulating film 2 is directly formed on the silicon substrate 1. Then, the anti-reflective film constituted by the polysilane 6 is applied. Then, the pattern of the resist 7 having an opening portion of the contact hole is formed on the anti-reflective film.

The resist 7 is used as the etching mask to perform anisotropic RIE to open the contact hole 5 that reaches the surface of the silicon substrate 1. Then, as shown in FIG. 12B, $O_2$ ashing is performed to remove the resist 7. Simultaneously, the polysilane 6 is changed to the silicon oxide film. Thus, the anti-reflective film can be formed to be a portion of the insulating film 2.

In the tenth embodiment, the insulating film 2 that is first formed on the silicon substrate 1 is the insulating film obtained by oxidizing the polysilane. Thus, the contact hole which reaches the silicon substrate 1 as shown in FIG. 12B can be formed as the insulating film constituted by an integrated silicon oxide film including the anti-reflective film.

When a silicon nitride film changed from the polysilane is employed as the insulating film 2 which is formed on the silicon substrate 1 and the resist 7 is removed by $N_2$ ashing, the polysilane 6 employed as the anti-reflective film is changed to the silicon nitride film. Therefore, the contact hole can be formed as the insulating film constituted by the integrated silicon nitride film including the anti-reflective film.

Although the tenth embodiment has been described about formation of the contact hole that reaches the silicon substrate 1, the contact hole for the trench metallization in the first layer can be formed by a similar process.

<Eleventh embodiment>

Figure 13A:
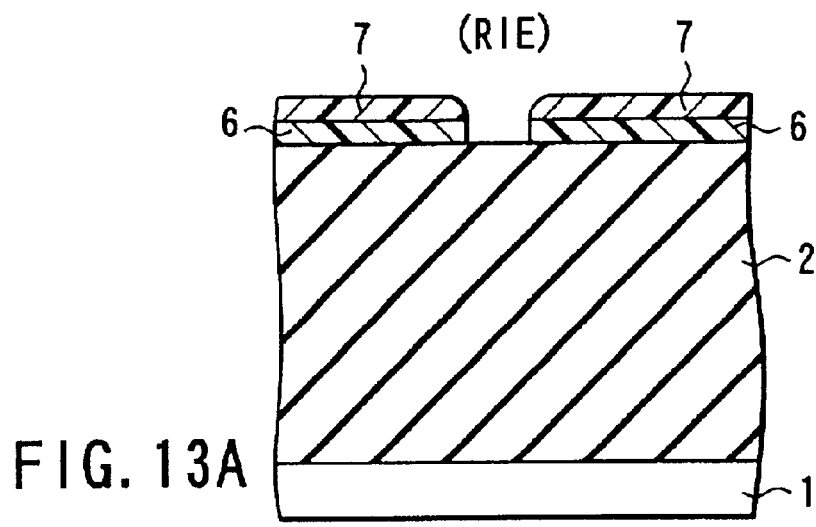
FIGS. 13A to 13C are cross sectional views showing steps of a manufacturing method of semiconductor devices according to an eleventh embodiment.
Figure 13B:
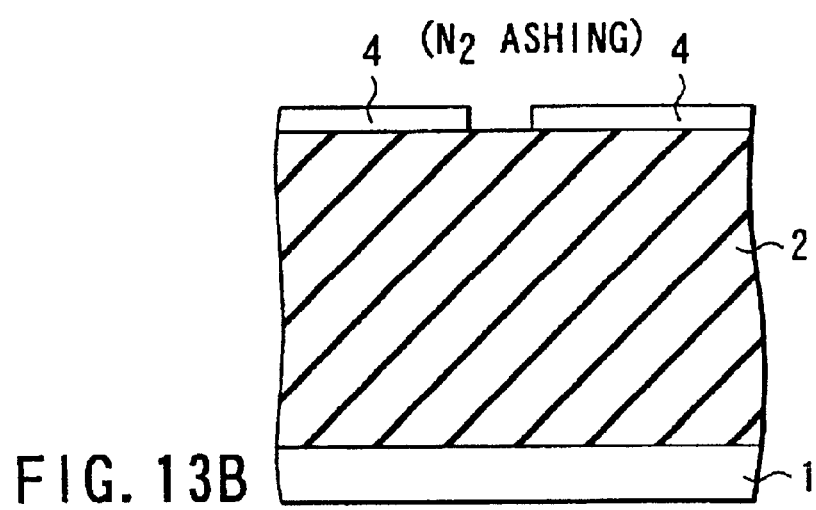
Figure 13C:
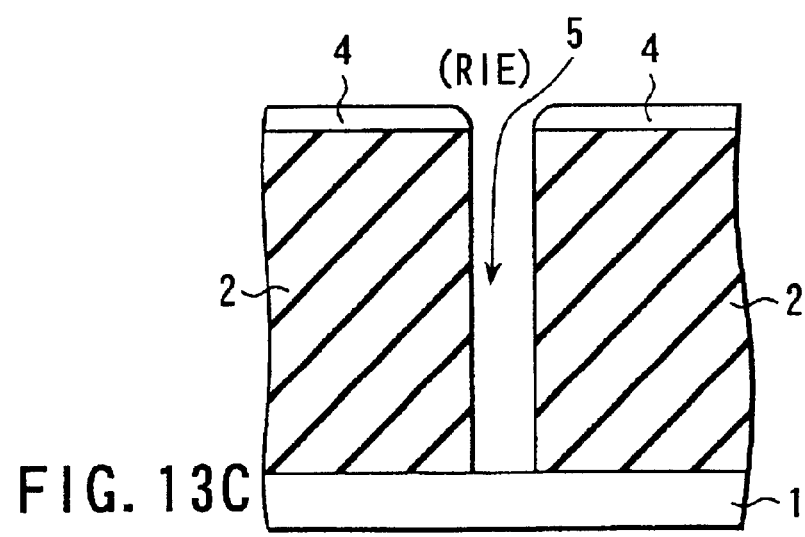

Referring to FIGS. 13A to 13C, an eleventh embodiment of the present invention will now be described. As shown in FIG. 13A, the thick insulating film 2 is formed on the silicon substrate 1. Then, an anti-reflective film constituted by the polysilane 6 is applied. Then, the pattern of the resist 7 having the opening portion of the contact hole is formed. Then, the resist 7 is used as a mask when the anisotropic RIE is performed to open the polysilane 6. Then, as shown in FIG. 13B, $N_2$ ashing is performed to remove the resist 7. Simultaneously, the polysilane 6 is changed to the silicon nitride film.

Then, as shown in FIG. 13C, the silicon nitride film 4 is used as the mask when the anisotropic RIE is performed to form the contact hole having a high aspect ratio which reaches the silicon substrate 1.

When a resist mask is directly used to form the contact hole having the high aspect ratio by the anisotropic RIE, the film thinning of the resist mask occurs. On the other hand, the eleventh embodiment in which the silicon nitride film 4 is used as the mask when the anisotropic RIE is performed enables a high etching selective ratio to be realized with respect to the insulating film 2 constituted by $SiO_2$ or the like. Therefore, the problem of the film thinning can be prevented.

The silicon nitride film 4 on the insulating film 2 shown in FIG. 13C may be removed by the hot phosphoric acid. Alternatively, the insulating film 2 may be integrated with a portion of the insulating film 2 as a silicon nitride film changed from polysilane. The rounded portion formed adjacent to the opening portion of the silicon nitride film 4 enables the wiring metal to be smoothly buried in the contact hole 5.

<Twelfth embodiment>

Figure 14A:
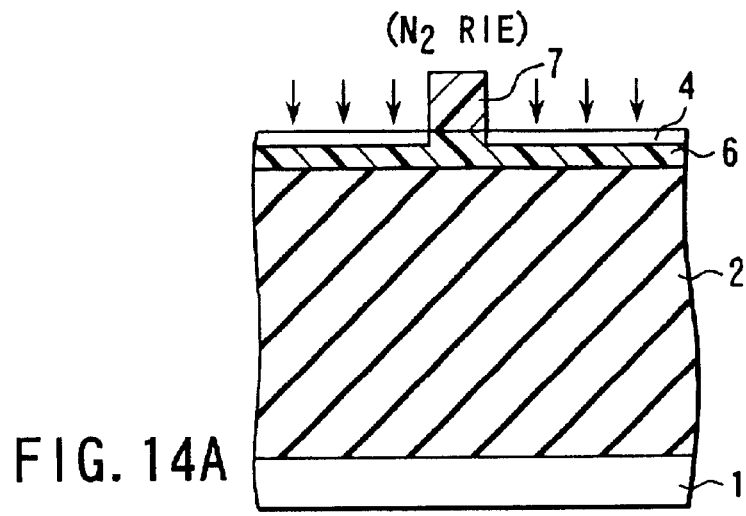
FIGS. 14A to 14C are cross sectional views showing steps of a manufacturing method of semiconductor devices according to a twelfth embodiment.
Figure 14B:
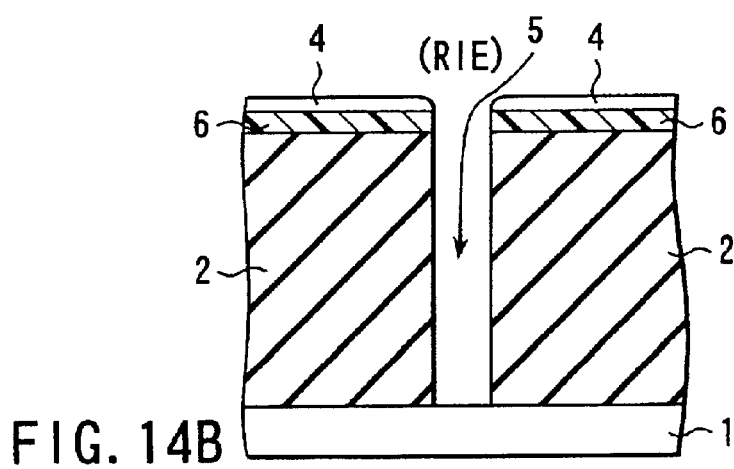
Figure 14C:
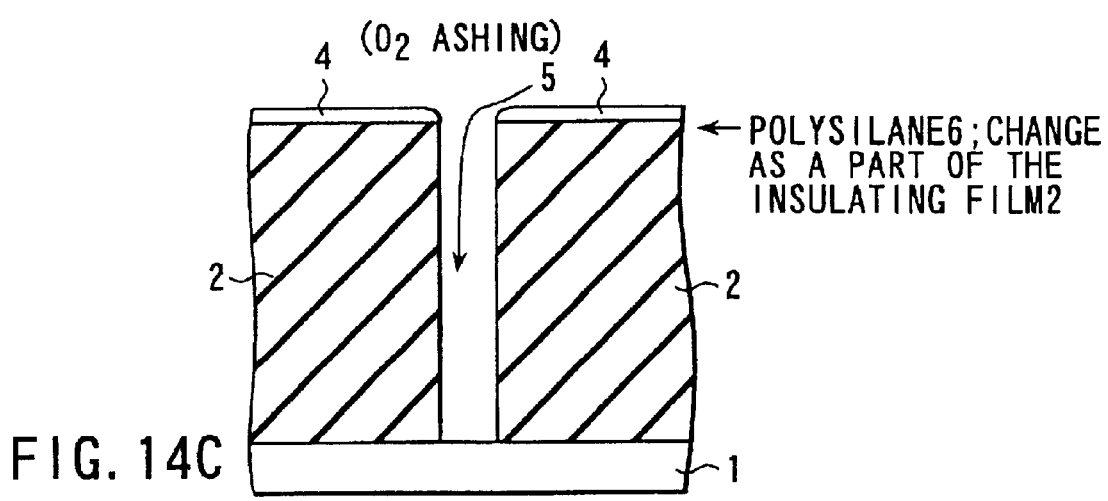

Referring to FIGS. 14A to 14C, a twelfth embodiment of the present invention will now be described. As shown in FIG. 14A, the insulating film 2 constituted by the thick silicon oxide film is formed on the silicon substrate 1. Then, the anti-reflective film constituted by the polysilane 6 is applied to the surface of the insulating film 2. The resist 7 is used to form a reversed pattern of the resist 7 such that the opening portion of the contact hole is covered. Then, RIE using $N_2$ is performed to change the exposed surface of the silicon nitride film 4, and then the resist 7 is removed.

Then, as shown in FIG. 14B, the silicon nitride film 4 is used as a mask to perform the anisotropic RIE to open the contact hole, which reaches the silicon substrate 1, in the insulating film 2 constituted by the polysilane 6 and the silicon oxide film.

Then, a treatment similar to the $O_2$ ashing step is performed to change the polysilane 6 to the silicon oxide film. Thus, the polysilane 6 is integrated as a portion of the insulating film 2, as shown in FIG. 14C.

Then, hot phosphoric acid is used to remove the silicon nitride film 4 employed as the mask so that a contact hole having a high aspect ratio which reaches the silicon substrate 1 is formed in the insulating film 2 constituted by the silicon oxide film. Also the twelfth embodiment employs the silicon nitride film as the etching mask for forming the contact hole having the high aspect ratio. Therefore, the problem of the film thinning can be prevented.

<Thirteenth embodiment>

Figure 15A:
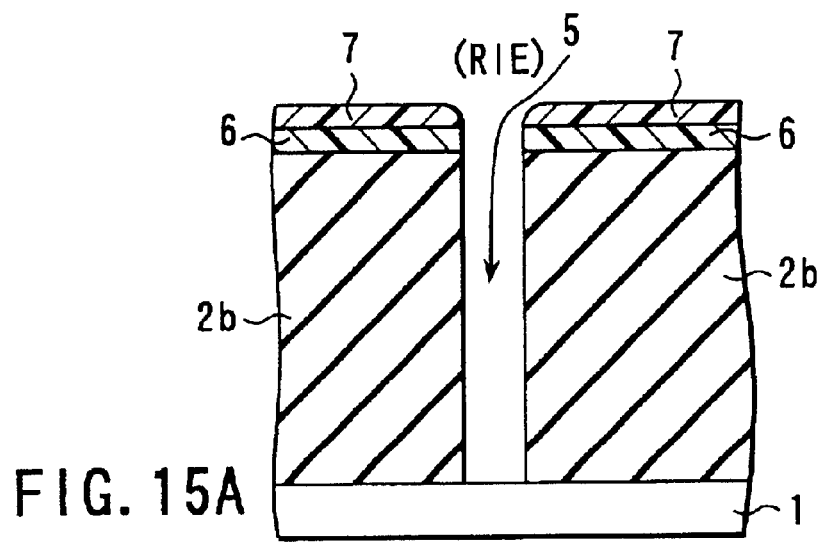
FIGS. 15A to 15C are cross sectional views showing steps of a manufacturing method of semiconductor devices according to a thirteenth embodiment.
Figure 15B:
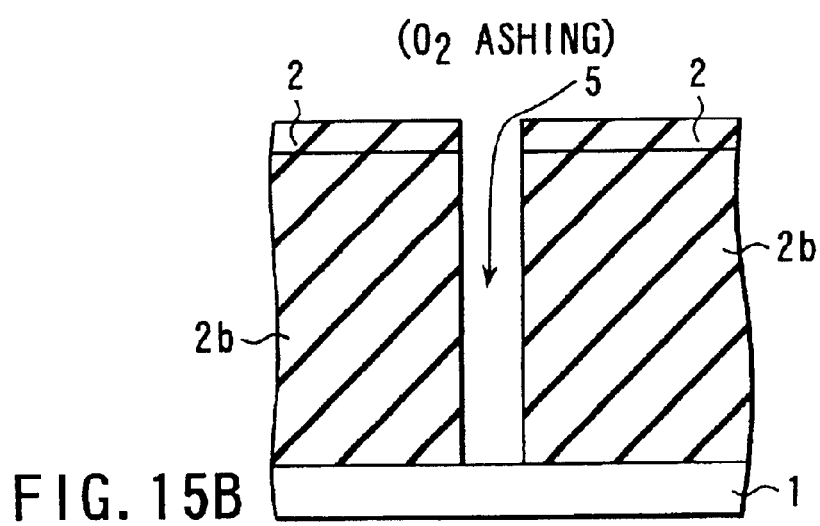
Figure 15C:
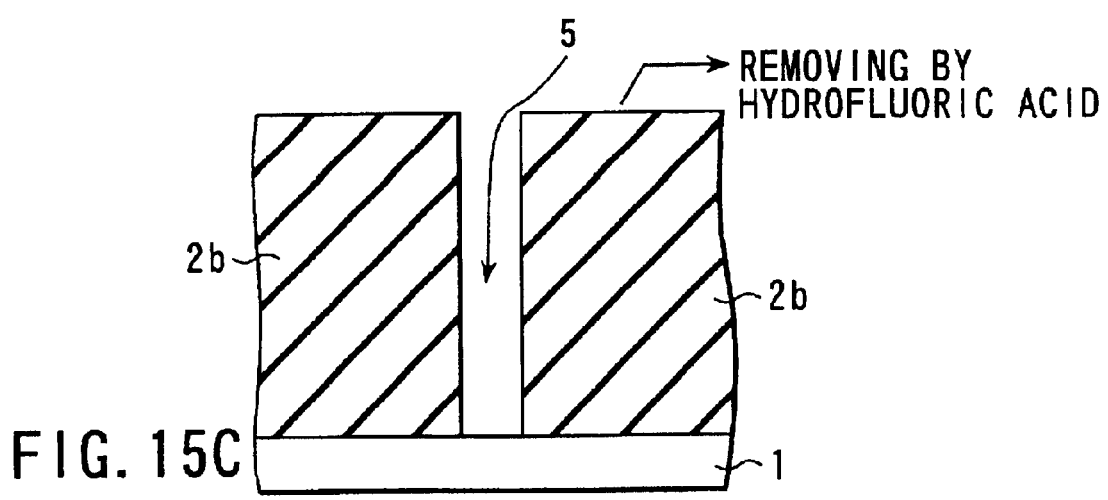

Referring to FIGS. 15A to 15C, a thirteenth embodiment of the present invention will now be described. As shown in FIG. 15A, a thick organic silicon oxide film 2b is formed on the silicon substrate 1. Then, the anti-reflective film constituted by the polysilane 6 and the resist 7 having an opened portion for forming the contact hole 5 are provided. Then, the resist 7 is used as the mask when the anisotropic RIE is performed to form the contact hole which reaches the silicon substrate 1. Then, as shown in FIG. 15B, $O_2$ ashing is performed to remove the resist 7.

In the $O_2$ ashing step, the polysilane 6 is changed to the insulating film 2 constituted by the silicon oxide film. At this time, only the insulating film 2 constituted by the silicon oxide film changed from the polysilane 6 can easily be removed by using dilute hydrofluoric acid as shown in FIG. 15C because the portion between the organic silicon oxide film 2b and the insulating film 2 constituted by the silicon oxide film has etching selectivity with respect to dilute hydrofluoric acid.

In the eleventh to thirteenth embodiments, the contact hole that reaches the silicon substrate 1 is formed. As a matter of course, the contact hole for the trench metallization in the first layer can similarly be formed.

In the first to thirteenth embodiment, the method has mainly been described in which the organic silicon film is employed in the interlayer insulating film having the dual-damascene structure and the fabricated portion of the contact hole. The present invention is not limited to this. The organic silicon film such as polysilane, can widely be applied to a manufacturing method of semiconductor devices by using dry etching technology. The foregoing facts will now be described as the following embodiments.

<Fourteenth embodiment>

Referring to FIGS. 16A to 16E, a fourteenth embodiment will now be described. The fourteenth embodiment is structured such that the device isolation region and the device region are smoothed by using polysilane.

Figure 16A:
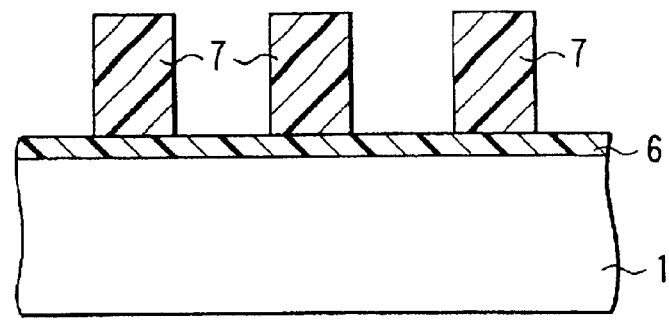
FIGS. 16A to 16E are cross sectional views showing steps of a manufacturing method of semiconductor devices according to a fourteenth embodiment.
Figure 16B:
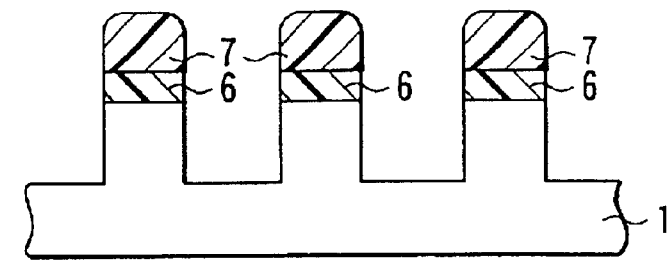

As shown in FIG. 16A, the silicon substrate 1 is coated with the polysilane 6 to form the pattern of the resist 7 such that the device region for forming a MOS (Metal-Oxide-Semiconductor) transistor is covered. Then, a mixed gas of $Cl_2$, the flow rate of which is 75 sccm, and $O_2$, the flow rate of which is 10 sccm is used to perform anisotropic RIE by using the resist 7 as a mask as shown in FIG. 16B under conditions that the pressure is 75 mTorr and the high frequency electric power is 300 W. Thus, the polysilane 6 and the silicon substrate 1 are etched.

Figure 16C:
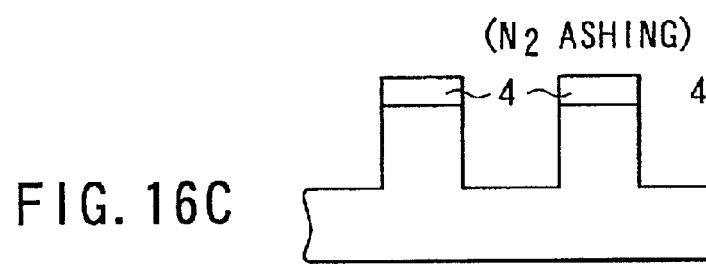
Figure 16D:
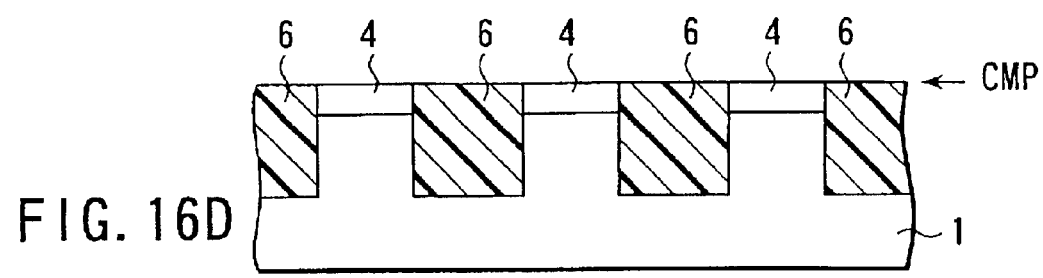

Then, as shown in FIG. 16C, $N_2$ ashing is performed to remove the resist 7. Simultaneously, the polysilane 6 is changed to the silicon nitride film 4. Then, as shown in FIG. 16D, the overall surface is coated with the polysilane 6 such that the isolation trench for isolating devices formed in the silicon substrate 1 is buried.

Since the polysilane 6 flows, the surface of the polysilane 6 is smoothed owing to the coating. Moreover, CMP is performed to remove the excess polysilane 6 on the silicon nitride film 4 by using the silicon nitride film 4 as the stopper. Thus, the opening portion of the isolation trench is filled with the polysilane 6 so as to be smoothed.

Figure 16E:
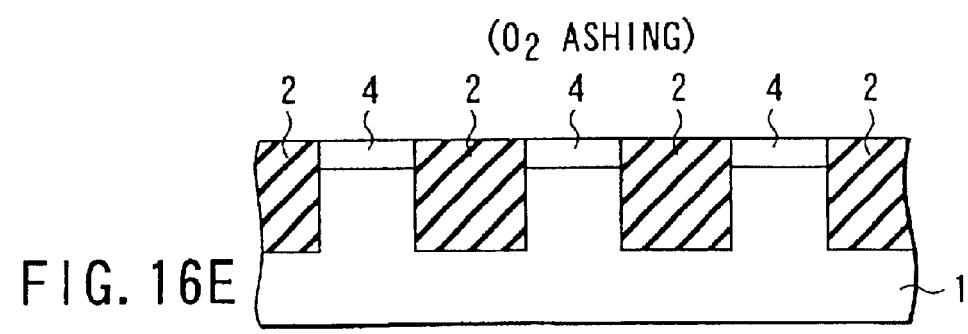

Then, as shown in FIG. 16E, a treatment similar to $O_2$ ashing is performed so that the polysilane 6 with which the isolation trench is filled is changed to the insulating film 2 constituted by the silicon oxide film. Although the foregoing embodiment has the structure that the polysilane is employed to bury the isolation trench, the present invention is not limited to this. Also an organic silicon oxide film or an inorganic silicon oxide film which can be formed by coating can be used to bury the isolation trench.

As described before, the conventional step of forming the isolation trench has been performed by thick deposition of the insulating film constituted by $SiO_2$ which cannot easily be processed as compared with polysilane. Then, the surface of the insulating film having a great uneven surface along the isolation trench is smoothed by CMP by using the silicon nitride film constituted by $Si_3N_4$ as the stopper. Therefore, a problem arises according to the distribution of density of the device regions covered with the stoppers. That is, polishing proceeds excessively in a field region where stoppers are distributed at a low density and thus the surface is formed into a concave shape.

On the other hand, the fourteenth embodiment has the structure that polysilane which can easily be polished is applied as a substitute for $SiO_2$. Therefore, the surface can be smoothed from the initial stage. Since only polysilane in the form of a thin film left on the silicon nitride film in a small quantity is required to be removed by CMP, the surface smoothness realized after CMP has been completed can be considerably improved as compared with the conventional method.

<Fifteenth embodiment>

Referring to FIGS. 17A to 17D, a fifteenth embodiment of the present invention will now be described. The fifteenth embodiment has the structure that the polysilane according to the present invention is employed in a portion which is formed between gate electrodes of a MOS transistor formed on the silicon substrate 1 and in which dry etching of SAC is performed to form the contact hole which reaches the source/drain diffusion layer 9 in a self-alignment manner.

Figure 17A:
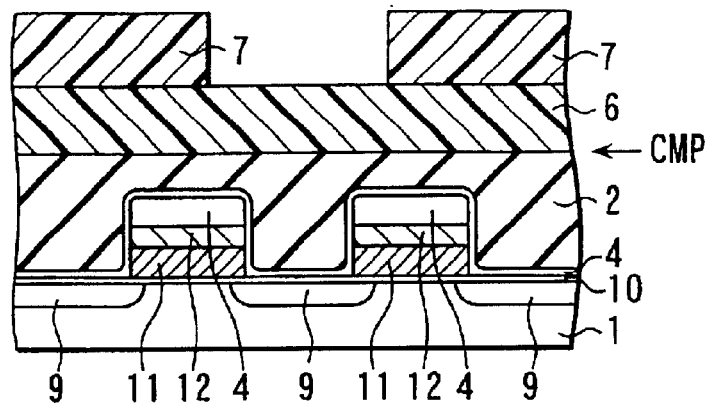
FIGS. 17A to 17D are cross sectional views showing steps of a manufacturing method of semiconductor devices according to a fifteenth embodiment.

As shown in FIG. 17A, a gate oxide film 10 is formed on the silicon substrate 1 on which the source/drain diffusion layer 9 of the MOS transistor is formed. Then, polysilicon 11, tungsten 12 and the silicon nitride film 4 are stacked on the gate oxide film 10. Then, a pattern is formed so that the gate electrode of the MOS transistor is formed such that the portion around the gate electrode is covered with the silicon nitride film 4.

Then, the insulating film 2 made of, for example, $SiO_2$ is deposited on the overall surface of the silicon substrate 1 on which the gate electrode has been formed. Then, CMP is performed to smooth the surface of the insulating film 2. Then, polysilane 6 is further applied to the smoothed insulating film 2, and then the pattern of resist 7 is formed having an opening portion in which a self-aligned contact hole will be formed.

Figure 17B:
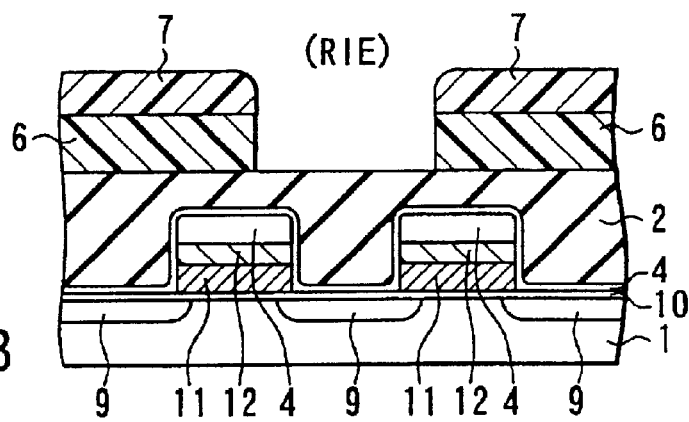
Figure 17C:
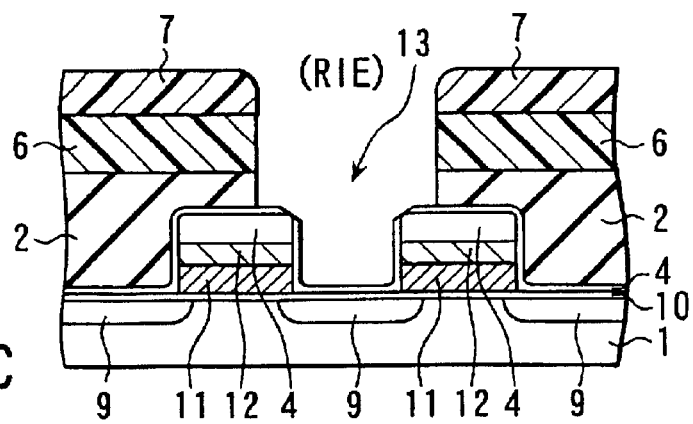

Then, as shown in FIG. 17B, polysilane 6 serving as a mask is opened by anisotropic RIE. Then, as shown in FIG. 17C, the self-aligned contact hole 13 is formed by anisotropic RIE to reach the etching stopper constituted by the silicon nitride film 4 which covers the portion around the gate electrode.

At this time, the etching selective ratio of the silicon nitride film 4 covering the portion around the gate electrode with respect to the insulating film 2 is lowered in the edge line portion of the gate electrode exposed to the inside portion of the self-aligned contact hole 13. Therefore, the corner of the edge line portion of the silicon nitride film 4 is, as shown in FIG. 17C, cut owing to the anisotropic RIE of the self-aligned contact hole 13.

Since cutting of the corners of the gate electrode is protected by the silicon nitride film 4 in the uppermost layer of the gate electrode, there arises no problem when the depth of etching of the insulating film 2, which cannot easily be fabricated as compared with the polysilane 6, is small.

That is, the fifteenth embodiment has the structure that the thickness of the insulating film 2 is reduced to stack the polysilane 6 on the insulating film 2. Thus, the depth of etching of the insulating film 2 can be minimized until the edge line portion of the gate electrode is exposed.

Figure 17D:
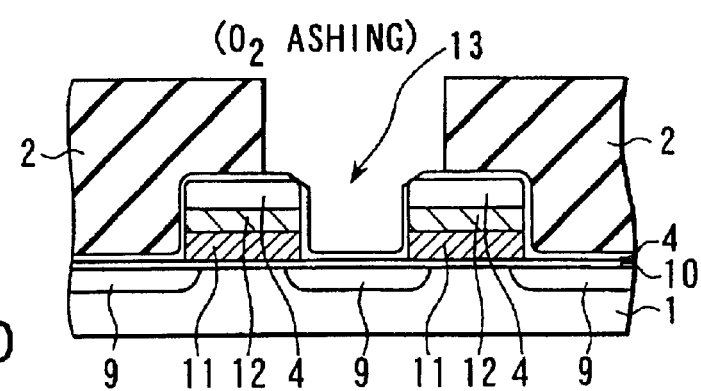

In the fifteenth embodiment, as shown in FIG. 17D, $O_2$ ashing is performed to remove the resist 7. Simultaneously, the polysilane 6 is changed to be the silicon oxide film which forms a portion of the insulating film 2. Then, the silicon nitride film 4 and the gate oxide film 10 covering the source/drain diffusion layer 9 are removed. Then, wiring metal is buried in the self-aligned contact hole 13. Thus, a SAC connected to the source/drain diffusion layer 9 is formed.

When the thickness of the insulating film 2 shown in FIG. 17A is enlarged to the total thickness of the insulating film 2 and the polysilane 6 as employed by the conventional technology, further intense anisotropic RIE is required to etch the insulating film 2 as compared with the anisotropic RIE required to etch the polysilane 6. Therefore, the amount of cutting of the edge line portion of the gate electrode is enlarged. If tungsten 12 of the gate electrode is exposed, the gate electrode and the source/drain diffusion layer 9 are short-circuited in the step of burying the wiring metal in the self-aligned contact hole 13.

That is, the fifteenth embodiment is characterized in that the insulating film 2 and the polysilane 6 are stacked; and the polysilane 6 is changed to be a portion of the insulating film 2 to substantially reduce the amount of fabrication of the insulating film 2 by the anisotropic RIE so as to prevent short circuit between the gate electrode and the source/drain diffusion layer 9 so that the manufacturing yield of the semiconductor devices is improved.

<Sixteenth embodiment>

Figure 18A:
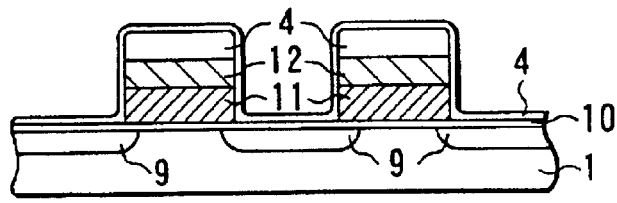
FIGS. 18A to 18E are cross sectional views showing steps of a manufacturing method of semiconductor devices according to a sixteenth embodiment.

Referring to FIGS. 18A to 18E, a sixteenth embodiment of the present invention will now be described. As shown in FIG. 18A, a gate oxide film 10 is formed on the silicon substrate 1 having the source/drain diffusion layer 9. The pattern of a gate electrode having the laminated polysilicon 11, tungsten 12 and the silicon nitride film 4 is formed. Then, the portion around the gate electrode is coated with the silicon nitride film 4. The foregoing steps are the same as those shown in FIG. 17A.

Figure 18B:
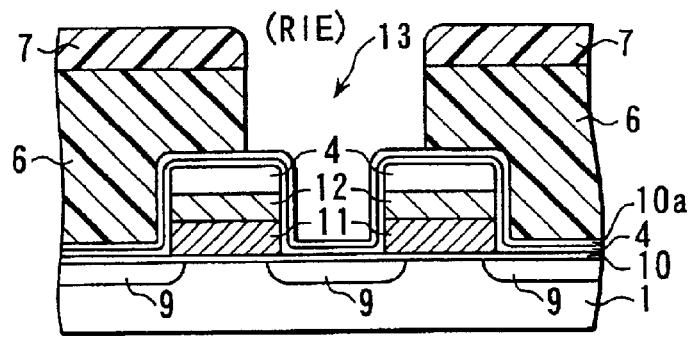

Then, as shown in FIG. 18B, the surface of the silicon nitride film 4 covering the gate electrode is covered with a silicon oxide film 10a. Then, the polysilane 6 is applied thickly to the overall upper surface of the silicon substrate 1 subjected to the foregoing step. The sixteen embodiment is characterized in that the insulating film in which the gate electrode is buried is substantially constituted by the polysilane 6.

The pattern of the opening portion in the resist 7 is formed at the position at which the self-aligned contact hole 13 will be formed. The resist 7 is used as a mask to open the self-aligned contact hole 13 in the thick polysilane film 6. Since the polysilane 6 can easily be removed by anisotropic RIE, the silicon oxide film 10a covering the gate electrode serves as a stopper to completely prevent erosion of the edge line portion of the gate electrode and improve the manufacturing yield of the semiconductor devices.

Figure 18C:
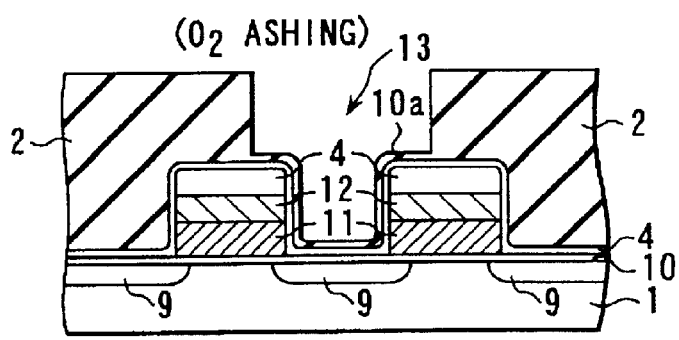

Then, as shown in FIG. 18C, the polysilane 6 is changed to the silicon oxide film simultaneously with removal of the resist 7 by performing $O_2$ ashing.

Figure 18D:
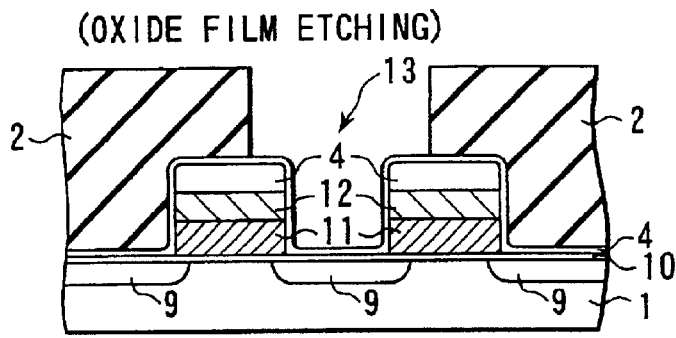

Then, as shown in FIG. 18D, the silicon oxide film 10a covering the gate electrode is removed by etching. For maximum prevention of erosion of the edge line portion of the silicon nitride film 4 covering the gate electrode, the silicon oxide film is etched under RIE conditions where the selective ratio with respect to the silicon nitride film can be raised. Since a satisfactory high etching selective ratio can be realized between the insulating film 2 changed from the polysilane 6 and the silicon oxide film 10a covering the gate electrode, only the silicon oxide film 10a can be removed by etching.

Figure 18E:
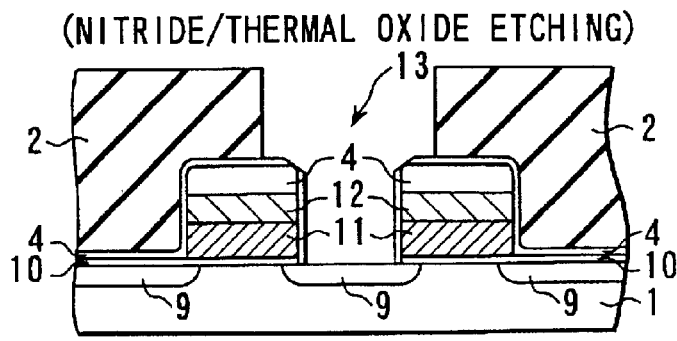

Then, as shown in FIG. 18E, anisotropic RIE is performed to remove the silicon nitride film 4 covering the source/drain diffusion layer 9 and the gate oxide film 10. At this time, the silicon nitride film 4 covering the edge line portion of the gate electrode is somewhat eroded. Since the amount of dry etching is very small, there is no apprehension that a short circuit will occur between the gate electrode and the source/drain diffusion layer 9.

<Seventeenth embodiment>

Figure 19A:
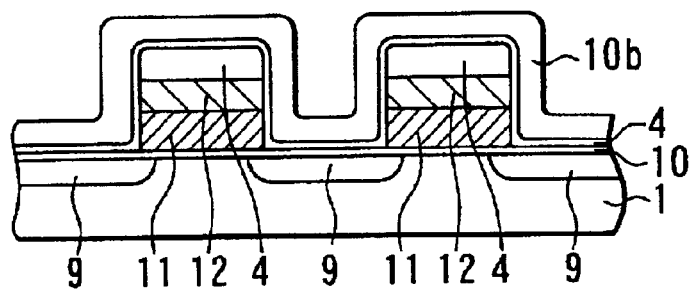
FIGS. 19A to 19D are cross sectional views showing steps of a manufacturing method of semiconductor devices according to a seventeenth embodiment.
Figure 19B:
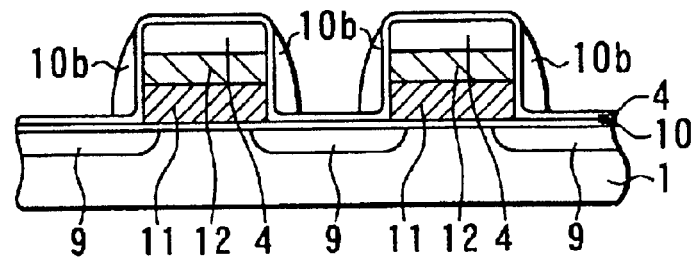

Referring to FIGS. 19A to 19D, a seventeenth embodiment of the present invention will now be described. The seventeenth embodiment is a modification of the sixteenth embodiment. As shown in FIG. 19A, the gate electrode on the silicon substrate 1 subjected to the step shown in FIG. 18A is covered with a thicker oxide film 10b. As shown in FIG. 19B, anisotropic RIE is performed to carry out etching back so that an oxide film 10b of the gate sidewall is formed.

Figure 19C:
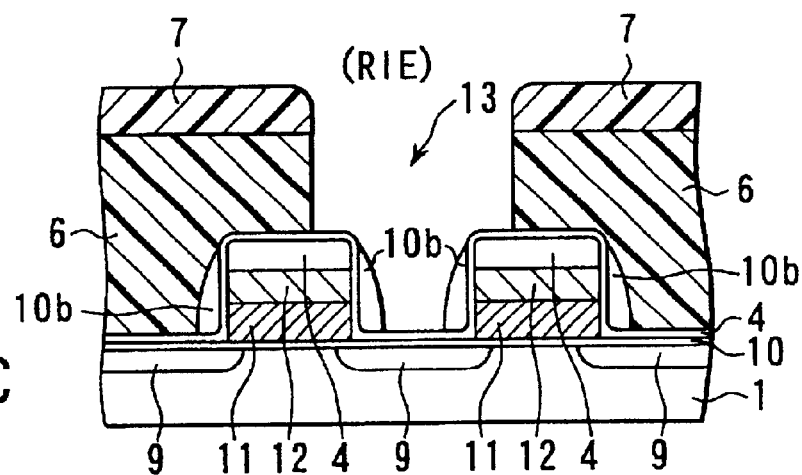
Figure 19D:
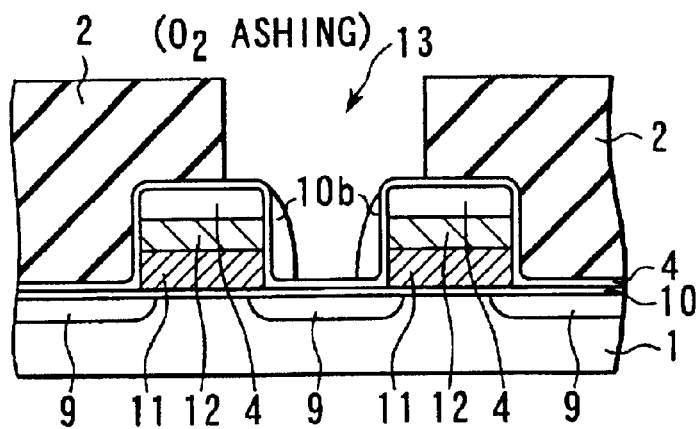

Then, as shown in FIG. 19C, a thick polysilane 6 is applied to form the pattern of the resist 7 having an opening corresponding to the self-aligned contact that will be established. The resist 7 is used as a mask when the anisotropic RIE is performed to form the self-aligned contact hole 13 in the polysilane 6. Since the oxide film 10b of the gate sidewall serves as an etching stopper in the anisotropic RIE step of the polysilane, erosion of the edge line portion of the gate electrode can be prevented.

Then, $O_2$ ashing is performed to remove the resist 7. Simultaneously, the polysilane 6 is changed to the insulating film 2 constituted by the silicon oxide film. The following steps similar to the steps following the step shown in FIG. 18C are performed so that a SAC connected to the source/drain diffusion layer 9 is formed.

A step has been described with which the thick oxide film 10b covering the gate is etched back to be the oxide film 10b of the gate sidewall shown in FIG. 19B. The etching back is not always required. If the etching conditions are optimized, a similar effect can be obtained when the thick oxide film 10b is employed as it is.

<Eighteenth embodiment>

Figure 20A:
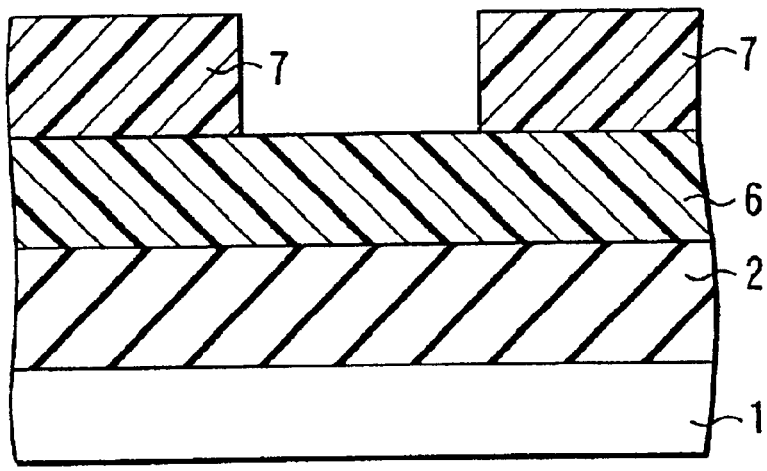
FIGS. 20A to 20C are cross sectional views showing steps of a manufacturing method of semiconductor devices according to an eighteenth embodiment.
Figure 20B:
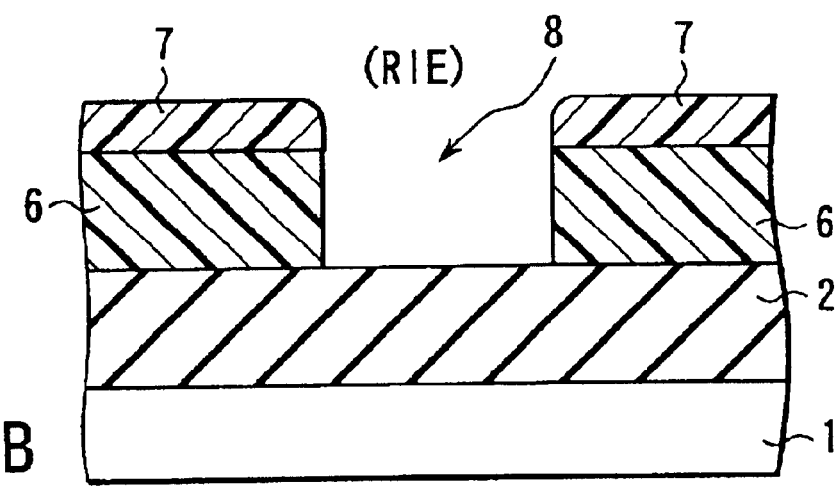
Figure 20C:
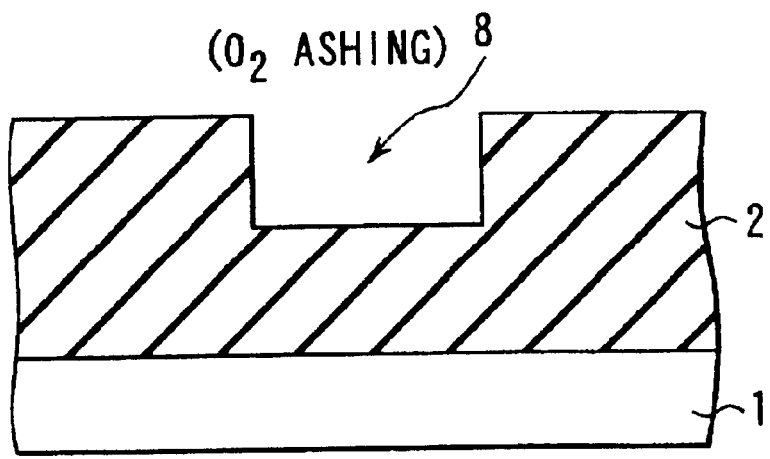

Referring to FIGS. 20A to 20C, an eighteenth embodiment of the present invention will now be described. In the eighteenth embodiment, polysilane is used to form the trench. As shown in FIG. 20A, the insulating film 2 constituted by the silicon oxide film is formed on the silicon substrate 1. Then, the surface of the insulating film 2 is coated with the polysilane 6.

The resist 7 is opened at the position on the polysilane 6 at which the metallization trench will be formed. The resist 7 is used as a mask to form the trench 8 by performing anisotropic RIE, as shown in FIG. 20B. Since the etching selective ratio of the polysilane 6 with respect to the insulating film 2 constituted by the silicon oxide film is very high, the insulating film 2 serves as the stopper in the anisotropic RIE step. As a result, the depth of the second trench 8 can be uniformed.

Then, as shown in FIG. 20C, $O_2$ ashing is performed to remove the resist 7. Simultaneously, the polysilane 6 is changed to a portion of the insulating film 2 constituted by the silicon oxide film. As described above, the polysilane 6 can be smoothed by coating. If the anisotropic RIE conditions are controlled, the etching stopper constituted by the insulating film 2 is not always required to form the trench 8 in the polysilane 6.

In general, a furthermore precise trench metallization in the first layer is required. If an aspect ratio (the ratio of the width of the metallization and the height of the same) higher than a predetermined value is required, a further satisfactory result can be realized when the insulating film 2 is employed as the etching stopper as described in the eighteenth embodiment.

Although the eighteenth embodiment has the structure that the silicon oxide film is employed as the etching stopper, a similar effect can be obtained when an organic silicon oxide film or an inorganic silicon oxide film is employed. When the type of the polysilane 6 is selected to correspond to the base material, a furthermore satisfactory result can be obtained.

<Nineteenth embodiment>

Referring to FIGS. 21A to 21E, a nineteenth embodiment of the present invention will now be described. In the nineteenth embodiment, a method of forming an opening portion in the insulating film mask having a high aspect ratio for use to form a deep silicon trench in the silicon substrate will now be described.

Figure 21A:
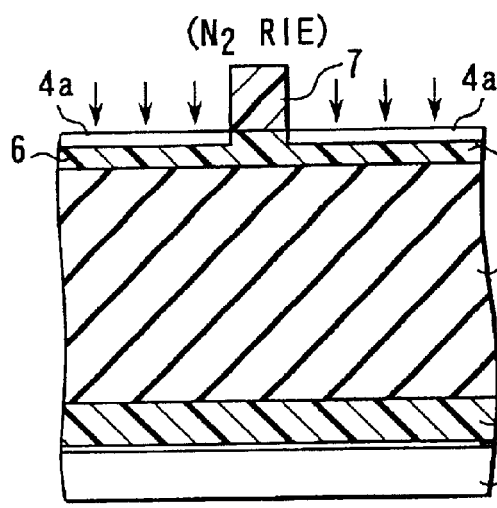
FIGS. 21A to 21E are cross sectional views showing steps of a manufacturing method of semiconductor devices according to a nineteenth embodiment.

As shown in FIG. 21A, a thermal oxide film 10 serving as an etching stopper is formed on the silicon substrate 1. Then, the polysilane 6 which is a lower layer is formed on the thermal oxide film 10. Then, an insulating film 2 constituted by, for example, a silicon oxide film, is deposited on the polysilane 6 which is the lower layer. Then, the polysilane 6a which is an upper layer and which serves as an etching stopper is again applied. Thus, a reversed pattern of the resist 7 is formed to cover the position at which the deep trench will be formed. The resist 7 is used as a mask when $N_2$ RIE or implantation of $N_2$ ions is performed so that the exposed surface of the polysilane 6a, which is the upper layer, is changed to the silicon nitride film 4a.

After the resist 7 has been removed, the silicon nitride film 4a is used as a mask when anisotropic RIE is performed under conditions that the flow rate ratio of $Cl_2/O_2$ is 75/10 sccm, the pressure is 75 mTorr and the applied high frequency electric power is 300 W with which the etching selective ratio of the polysilane is high with respect to the silicon nitride film. Thus, the polysilane 6a, which is the upper layer and which serves as the anti-reflective film, is opened.

Then, anisotropic RIE of the silicon nitride film 4a is performed under conditions that the flow rate ratio of $C_4F_8/CO/Ar$ is 10/50/200 sccm, the pressure is 40 mTorr and the applied high frequency electric power is 1400 W with which a high etching selective ratio of the insulating film 2 constituted by the silicon oxide film with respect to the silicon nitride film 4a can be realized. Thus, a trench 14a that reaches the lower polysilane 6 is formed, as shown in FIG. 21B.

Since a required etching selective ratio with respect to the polysilane 6 can be realized, the lower polysilane 6 serves as the etching stopper. Thus, the trench 14a can be formed with a satisfactory controllability.

Figure 21D:
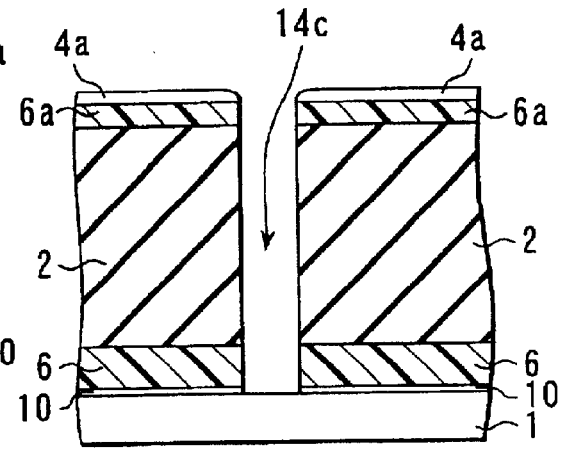
Figure 21B:
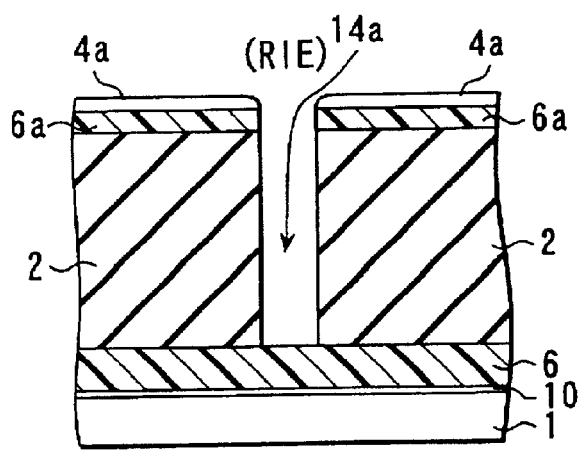
Figure 21E:
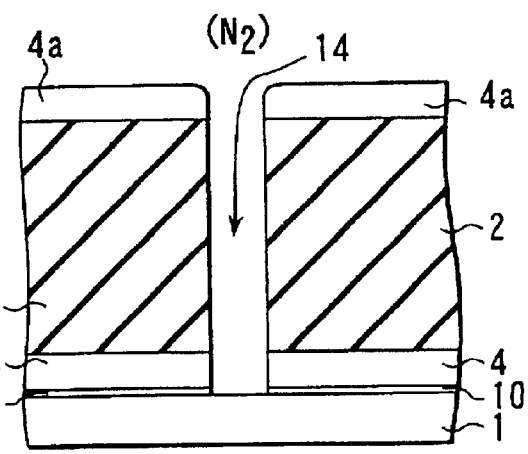
Figure 21C:
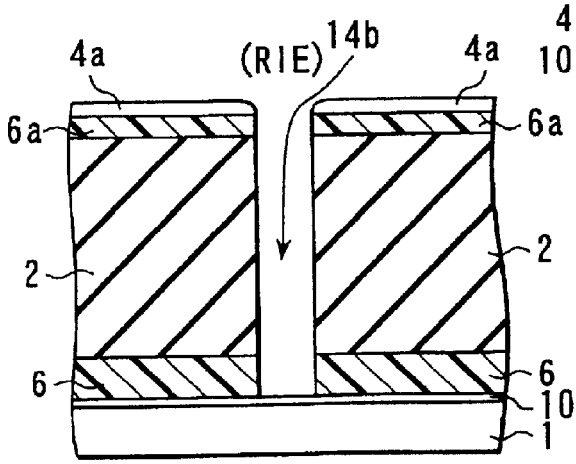

Then, conditions under which a high etching selective ratio of the lower polysilane 6 with respect to the silicon nitride film 4a and the thermal oxide film 10 can be realized are employed to form the trench 14b such that the thermal oxide film 10 is used as an etching stopper, as shown in FIG. 21C.

Then, conditions under which a high etching selective ratio of the thermal oxide film 10 with respect to the silicon nitride film can be realized are employed to remove the thermal oxide film 10, as shown in FIG. 21D. At this time, the surface of the silicon substrate 1 serves as a stopper to form the trench 14c which reaches the surface of the silicon with a satisfactory controllability.

Finally, as shown in FIG. 21E, heat treatment is performed in a $N_2$ atmosphere to change the upper and lower polysilane portions 6a and 6 into silicon nitride films 4a and 4. Thus, a deep trench mask 14 can be formed in which a trench having a high aspect ratio is formed in the insulating film 2 vertically sandwiched by the silicon nitride films 4a and 4 through the silicon thermal oxide film 10. Note that the final process may be performed before the thermal oxide film 10 is removed. The upper silicon nitride film 4a may be removed.

The method of forming the deep trench mask according to the nineteenth embodiment is characterized in that the process is controlled several times by the etching stopper during the anisotropic RIE step. The method enables the trench process of the etching mask to a depth that has been impossible to be performed with a satisfactory accuracy using conventional technology.

As an alternative to the heat treatment that is performed finally in the $N_2$ atmosphere, the continuous process is performed under a condition in which $N_2$ radicals are increased by changing the anisotropic RIE conditions to conditions so that the flow rate of $N_2$ is 100 sccm, the pressure is 150 mTorr, and the applied high frequency electric power is 100 W. Thus, the polysilane portions 6a and 6 are changed to the silicon nitride films. In the foregoing case, the number of processing steps can be reduced.

<Twentieth embodiment>

Figure 22A:
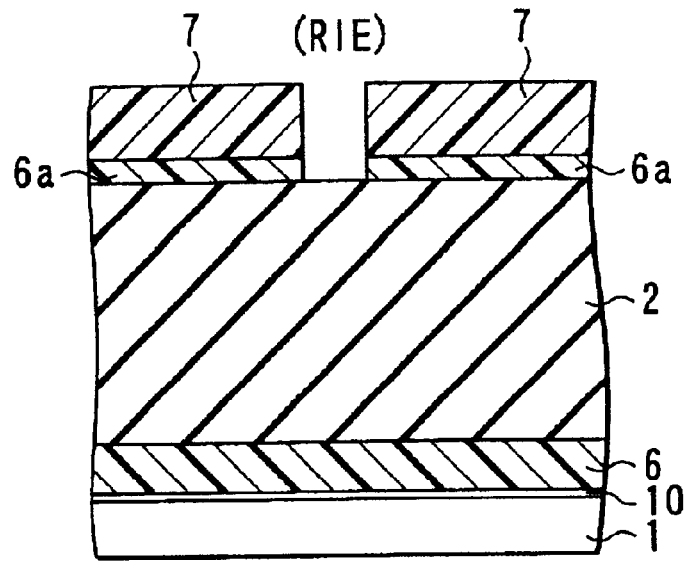
FIGS. 22A to 22C are cross sectional views showing steps of a manufacturing method of semiconductor devices according to a twentieth embodiment.
Figure 22B:
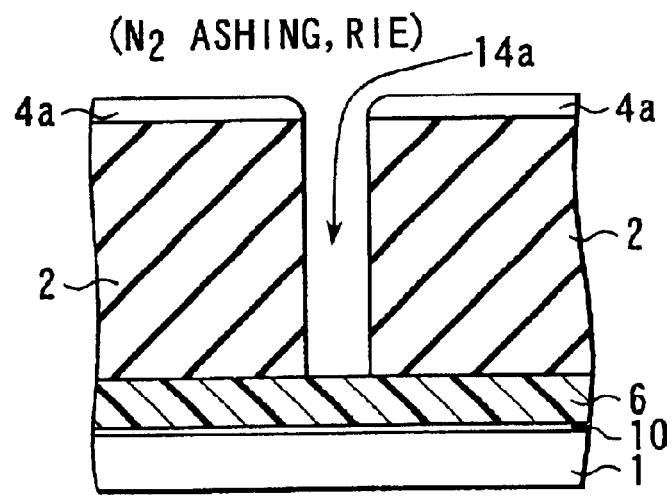
Figure 22C:
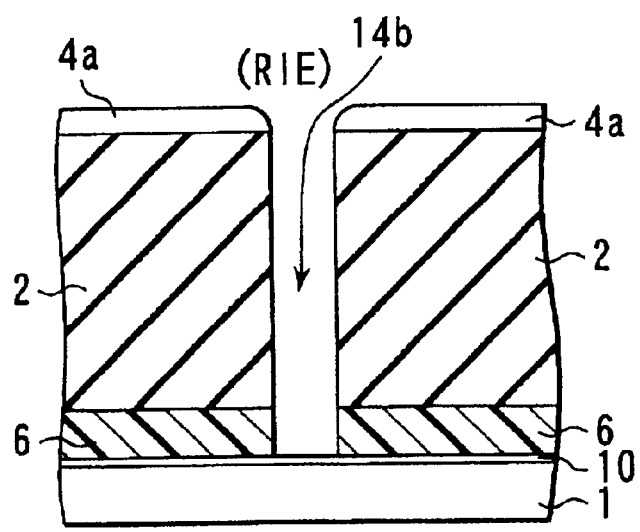

Referring to FIGS. 22A to 22C, a twentieth embodiment of the present invention will now be described. As shown in FIG. 22A, the thermal oxide film 10 serving as the etching stopper is formed on the silicon substrate 1. Then, the lower polysilane 6 is applied, and the insulating film 2 constituted by the silicon oxide film is deposited. Then, the upper polysilane 6a serving as the anti-reflective film is applied so that the pattern of the resist 7 having an opening corresponding to the portion in which the trench will be formed is formed. Then, the resist 7 is used as the etching mask so that the upper polysilane 6a which serves as the anti-reflective film is opened.

Then, as shown in FIG. 22B, $N_2$ ashing is performed to remove the resist 7. Simultaneously, the upper polysilane 6a is changed to the silicon nitride film 4a. The silicon nitride film 4a is used as a mask when the anisotropic RIE step is performed to form the trench 14a which reaches the lower polysilane 6.

Then, as shown in FIG. 22C, the conditions under which the anisotropic RIE is performed are changed to form the trench 14b in the lower polysilane 6 such that the thermal oxide film 10 is used as the etching stopper. Then, a process similar to the $N_2$ ashing is performed to change the lower polysilane 6 into the silicon nitride film. Finally, the thermal oxide film 10 is removed so that the deep trench mask which reaches the surface of the silicon substrate 1 is formed. Note that the $N_2$ ashing step may be performed after the thermal oxide film 10 has been removed.

The step of changing the dry etching conditions according to the twentieth embodiment may be performed by the method according to the nineteenth embodiment. Since each layer serves as the etching stopper, an etching mask exhibiting a satisfactory controllability and having a high aspect ratio can be formed similarly to the nineteenth embodiment.

<Twenty-first embodiment>

Figure 23A:
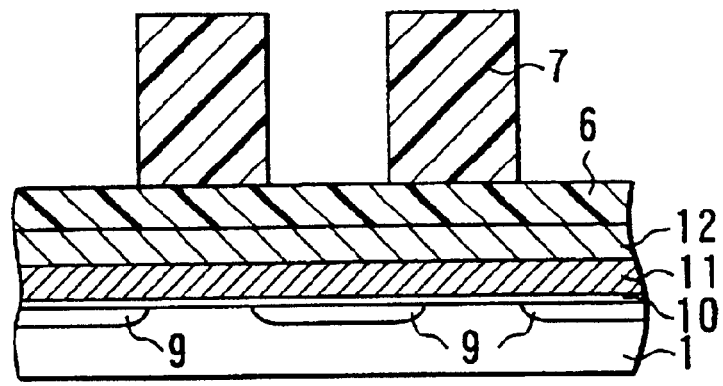
FIGS. 23A to 23C are cross sectional views showing steps of a manufacturing method of semiconductor devices according to a twenty-first embodiment.
Figure 23B:
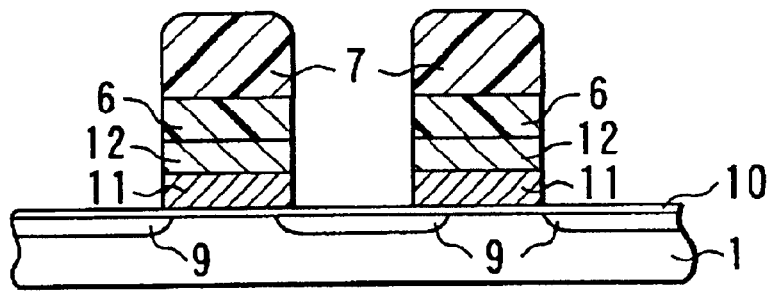
Figure 23C:
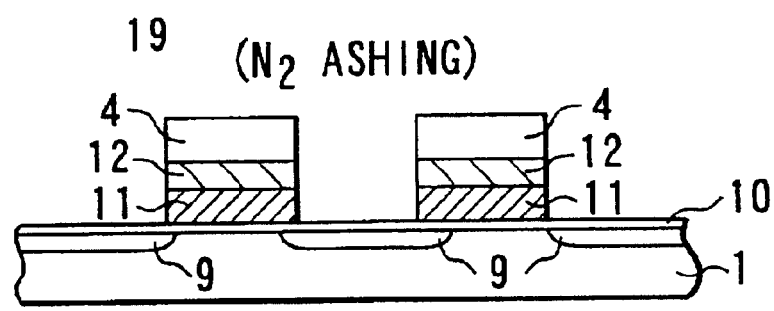

Referring to FIGS. 23A to 23C, a twenty-first embodiment will now be described. The twenty-first embodiment is structured such that the pattern of the gate electrode of the MOS transistor is formed on the silicon substrate 1 by using the polysilane 6.

As shown in FIG. 23A, a gate insulating film constituted by the thermal oxide film 10 is formed on the surface of the silicon substrate 1. Then, a film composed of the polysilicon 11 and tungsten 12 is, as the material of the gate electrode, formed on the gate insulating film. Then, the overall surface of the film is coated with the polysilane 6. Then, the pattern of the resist 7 is formed to cover the portion in which the gate electrode will be formed.

Then, as shown in FIG. 23B, the resist 7 is used as the etching mask when the anisotropic RIE step is performed so that the pattern of a laminated film composed of the polysilicon 11, the tungsten 12 and the polysilane 6 is formed as the gate electrode.

Then, as shown in FIG. 23C, $N_2$ ashing is performed to remove the resist 7. Simultaneously, the polysilane 6, the pattern of which has been formed on the uppermost layer of the gate electrode, is changed to the silicon nitride film 4. The gate electrode having the silicon nitride film 4 is used as the mask of the gate electrode to form the source/drain diffusion layer 9 in a self-aligned manner by performing implantation of ions and hydrogen. As a result, a MOS transistor on the silicon substrate can be obtained. Note that the polysilicon 11 and the tungsten 12 of the gate electrode are converted to tungsten silicide because of the heat treatment.

The conventional technology requires two steps of processes with which the resist is used as a mask to form the pattern of the silicon nitride film and the patterns of tungsten and polysilicon are formed by using the silicon nitride film as the mask to form the pattern of a laminated film composed of polysilicon, tungsten and the silicon nitride film as the gate electrode.

In the twenty-first embodiment, the conditions under which the polysilane 6 is etched are such that the flow rate ratio of $Cl_2/O_2$ is 75 sccm/10 sccm, the pressure is 75 mTorr and the applied high frequency electric power is 300 W. Under the foregoing conditions, the patterns of the tungsten 12 and the polysilicon 11 can be simultaneously formed. As a result, the number of processing steps can be reduced and the gate electrode can be fabricated with satisfactory controllability. Note that the formation of the tungsten silicide may be performed first to simultaneously form the patterns of the polysilicon layer and the tungsten silicide.

A semiconductor device according to each of twenty-second to twenty-ninth embodiments of the present invention and the manufacturing method thereof will now be described. The semiconductor device in each of these embodiments includes a wiring structure having a small inter-wiring parasitic capacitance in the single layer or multi-layered damascene metallization. Particularly, these embodiments are intended to demonstrate that the use of an interlayer insulating film using an organic silicon compound as a raw material is effective for decreasing the inter-wiring parasitic capacitance.

<Twenty-second embodiment>

FIGS. 24A to 24M are cross sectional views collectively showing a method of manufacturing a semiconductor device according to a twenty-second embodiment of the present invention. In this embodiment, a magnetron RIE apparatus is used as an etching apparatus for performing the etching employed in the present invention. The specific construction of the magnetron RIE apparatus will be described herein later.

Figure 24A:
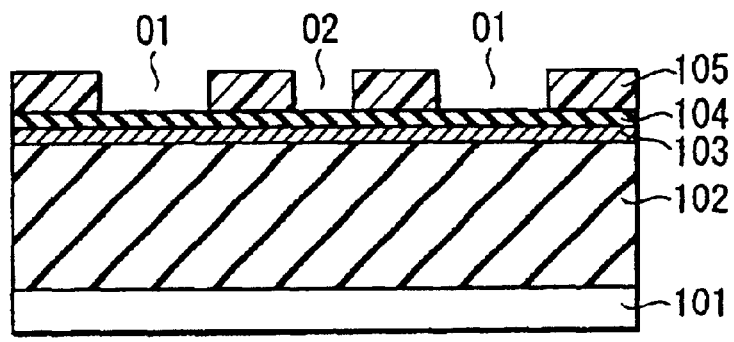
FIGS. 24A to 24M are cross sectional views collectively showing a method of manufacturing a semiconductor device according to a twenty-second embodiment.

In the first step, a $SiO_2$ film 102 acting as an interlayer insulating film is formed on a silicon substrate 101 having semiconductor elements formed therein in a manner to form an integrated circuit, as shown in FIG. 24A. Then, a polysilicon film 103 is formed on the $SiO_2$ film 102 as a hard mask of the $SiO_2$ film 102. Further, an anti-reflection film 104 (e.g., a carbon film) is formed on the polysilicon film 103, followed by forming a resist pattern 105 on the anti-reflection film 104. As shown in the drawing, the resist pattern 105 includes a first open portion O1 corresponding to a first wiring trench and a second open portion $O_2$ corresponding to a second contact hole.

Figure 24B:
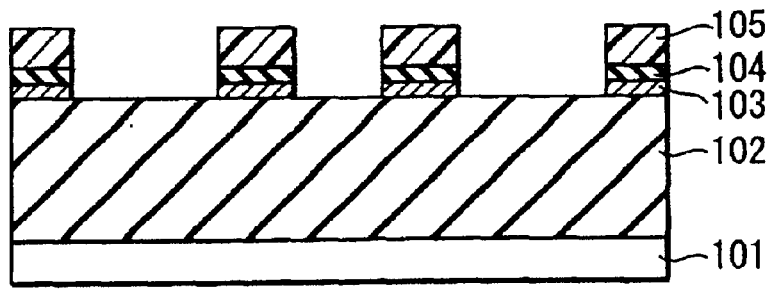

In the next step, the anti-reflection film 104 and the polysilicon film 103 are selectively etched with the resist pattern 105 used as a mask so as to transfer the resist pattern 105 onto these films 103 and 104, as shown in FIG. 24B. The etching in this step is carried out under, for example, the pressure of 75 mTorr, the power supply of 300 W, and the flow ratio of the etching gases $Cl/O_2$ of 75/10 sccm. Where the etching is carried out under the conditions given above, the etching selectivity ratio of the polysilicon film 103 relative to the $SiO_2$ film 102 is rendered very high, i.e., about 100. Therefore, the $SiO_2$ film 102 acts as an etching stopper and, thus, the $SiO_2$ film 102 is prevented from being etched excessively.

Figure 24C:
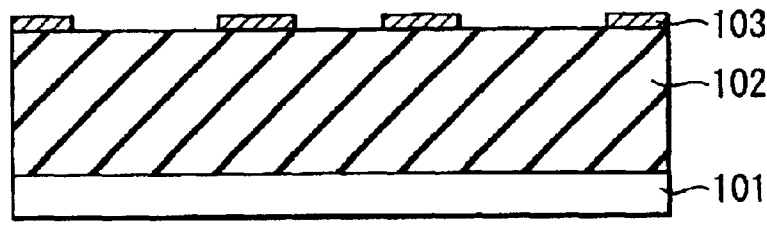
Figure 24D:
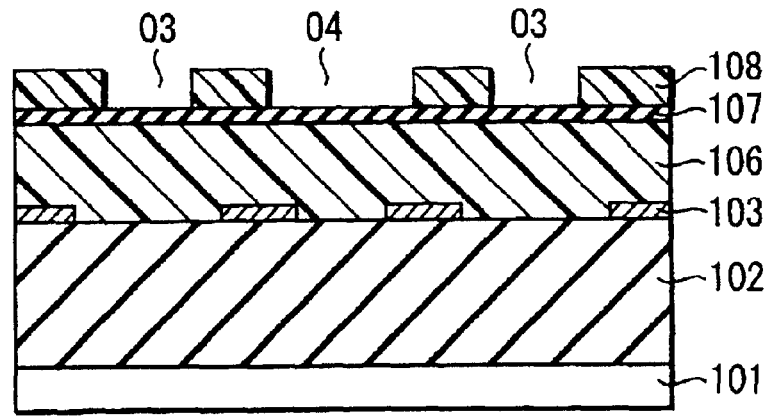

In the next step, the resist pattern 105 and the anti-reflection film 104 are removed as shown in FIG. 24C. After removal of the resist pattern 105 and the anti-reflection film 104, a resist film 106 is formed in a thickness of about 700 nm on the entire surface, followed by forming an SOG film 107 by a coating method in a thickness of about 100 nm on the resist film 106, as shown in FIG. 24D. Then, a resist film is formed on the SOG film 107 in a thickness of about 300 nm, followed by applying a light exposure and development to the resist film so as to form a resist pattern 108. In this case, the SOG film 107 performs the function of an anti-reflection film in the light exposure step. The resist pattern 108 includes a third open portion O3 corresponding to the first contact hole and a fourth open portion O4 corresponding to a second wiring trench.

In the next step, the resist film 106 is selectively etched with the resist pattern 108 and the SOG film 107 used as a mask.

In this case, the SOG film 107 is etched with the resist pattern 108 used as a mask. The etching in this step is carried out under, for example, the pressure of 20 mTorr, the power supply of 1000 W, and the flow ratio of the etching gases $CF_4/O_2$ of 60/10 sccm.

Figure 24E:
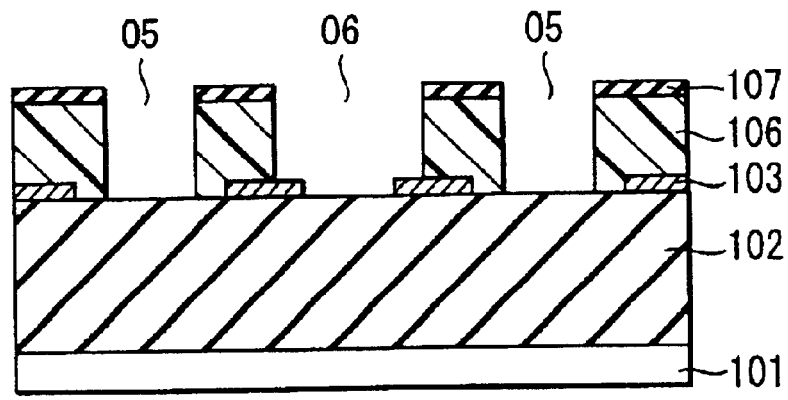

The resist film 106 is etched in the initial stage with the resist pattern 108 used as a mask. However, the resist pattern 108 is etched away completely during the etching process, with the result that the resist film 106 is etched finally with the SOG film 107 used as a mask. FIG. 24E is a cross sectional view showing the state in this stage. As shown in the drawing, a fifth open portion O5 corresponding to the first contact hole and a sixth open portion O6 corresponding to the second wiring trench are formed in the resist film 106. The etching in this stage is carried out under, for example, the pressure of 40 mTorr, the power supply of 500 W, and the flow ratio of the etching gases $N_2/O_2$ of 150/10 sccm.

Where the etching is carried out under the conditions given above, the etching selectivity ratio of the resist film 106 relative to the SOG film 107 is 50 or more. Also, the etching selectivity ratio of the $SiO_2$ film 102 relative to the resist film 106 is very high, i.e., 100 or more. The etching selectivity ratio of the resist film 106 relative to the polysilicon film 103 is also rendered high, with the result that the polysilicon film 103 performs the function of the etching stopper.

Figure 24F:
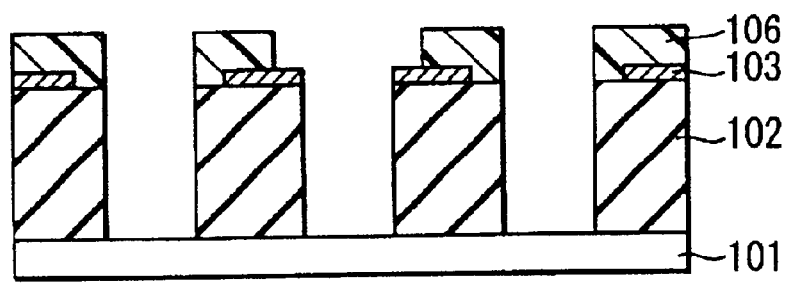

In the next step, the $SiO_2$ film 102 is selectively etched with the SOG film 107, the resist film 106 and the polysilicon film 103 used as a mask so as to form first and second contact holes in the $SiO_2$ film 102. These first and second contact holes are connected to first and second conductive regions (not shown), e.g., diffusion layers, respectively, formed in the surface region of the silicon substrate 101. The SOG film 107 is etched away during the etching process, with the result that the $SiO_2$ film 102 is etched finally with the resist film 106 and the polysilicon film 103 used as a mask. FIG. 24F is a cross sectional view showing the state in this stage.

The $SiO_2$ film 102 is etched under, for example, the pressure of 20 mTorr, the power supply of 1,400 W, and the flow ratio of the etching gases $C_4F_8/CO/O_2/Ar$ of 10/50/5/100 sccm. Where the $SiO_2$ film 102 is etched under the conditions given above, the etching selectivity ratio of the $SiO_2$ film 102 relative to the resist film 106 is about 15, and the etching selectivity ratio of the resist film 106 relative to the polysilicon film 103 is about 40.

Incidentally, the description given above covers the case where the conductive region such as a diffusion layer formed in a surface region of the substrate constitutes the underlying layer. However, it is also possible for the metal wiring layer formed on the silicon substrate 101 to constitute the underlying layer. In this case, the wiring layer employed in this embodiment is in the form of a multi-layered wiring film comprising a plurality of layers.

Figure 24G:
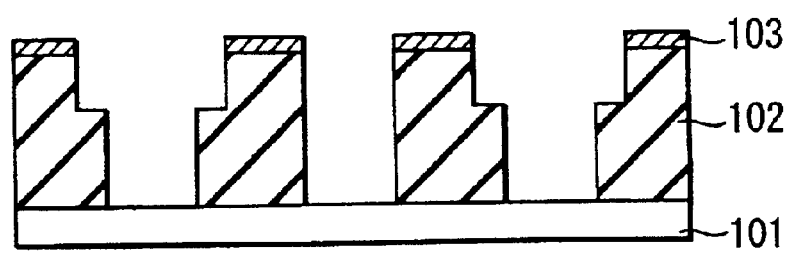
Figure 24H:
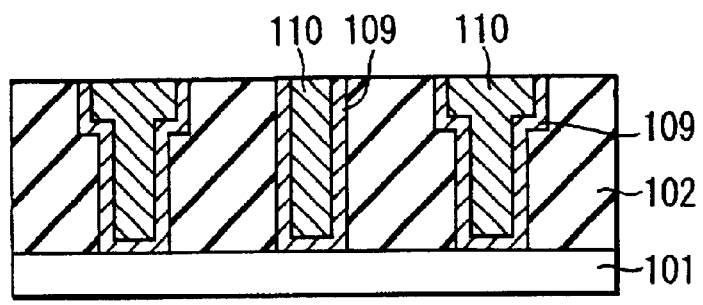

In the next step, the resist layer 106 is removed by $O_2$ RIE, followed by etching the $SiO_2$ film with the polysilicon film 103 (hard mask) used as a mask so as to form a first wiring trench on the surface of the $SiO_2$ film 102, as shown in FIG. 24G. The etching conditions in this step are equal to the etching conditions in the previous step of forming the first and second contact holes.

After the etching of the $SiO_2$ film 102, a metal film forming a barrier metal film or a liner film 109 (intermediate film) and a plug or a plug/wiring 110 is deposited on the entire surface, followed by applying a CMP treatment so as to remove the undesired barrier metal film 109 and the undesired metal film outside the first wiring trench and the first and second contact holes and to planarize the surface. As a result, formed are two dual-damascene structures and a single plug between the two dual-damascene structures.

Incidentally, the plug or the plug/wiring 110 includes the plug (plug body that does not include the intermediate film) of the wiring structure (first wiring structure) having a high wiring upper surface, the plug (plug body that does not include the intermediate film) of the wiring structure (second wiring structure) having a low wiring upper surface, and the wiring (wiring body that does not include the intermediate film). In the following description, the plug 110 represents the plug of the first wiring structure, and the wiring 110 represents the wiring of the second wiring structure.

Where the plug or the plug/wiring 110 is formed of a Cu or an Al-Cu material, it is possible for the barrier metal film or the liner film 109 to be formed of, for example, a conductive film such as a Ti film, a TiN film, a Ta film, a TaN film, or a Ti/TiN film or an insulating thin film having a thickness that permits assuring the electrical connection.

The material of the plug or the plug/wiring 110 is not limited to the Cu or Al-Cu material. It is also possible to use, for example, W, polysilicon, Al, Al-Si-Cu, Ag, Au or WSi for forming the plug or the plug/wiring 110. Depending on the material used for forming the plug or the plug/wiring 110, it is unnecessary to use the barrier metal film or the liner film 109.

Also, where the plug or the plug/wiring 110 is formed of Al, it is possible for the barrier metal film or the liner film 109 to be formed of, for example, a Nb film or a NbN film.

Figure 24I:
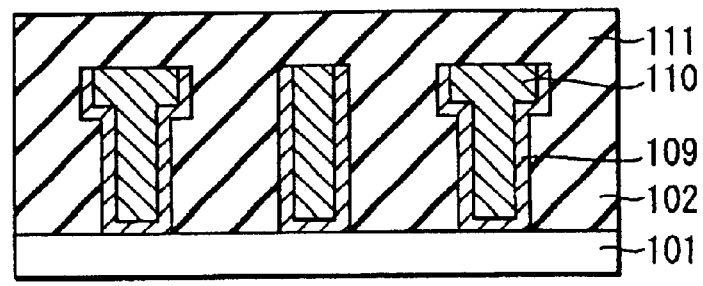
Figure 24J:
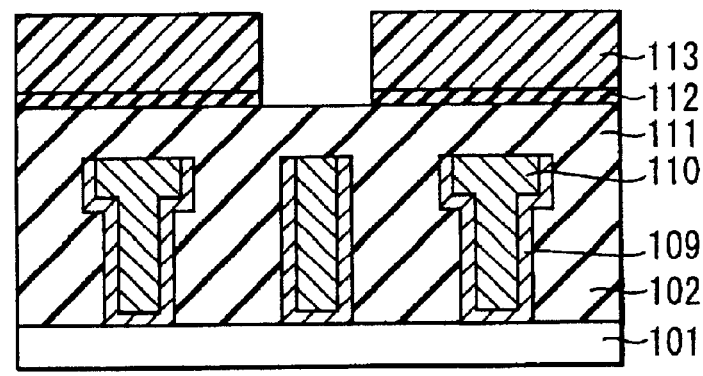

In the next step, a $SiO_2$ film 111 forming an interlayer insulating film is deposited on the entire surface, as shown in FIG. 24I. After formation of the $SiO_2$ film 111, an anti-reflection film 112 and a resist pattern 113 are formed successively on the $SiO_2$ film 111, as shown in FIG. 24J. The resist pattern 113 has an open portion corresponding to the second wiring trench.

Figure 24K:
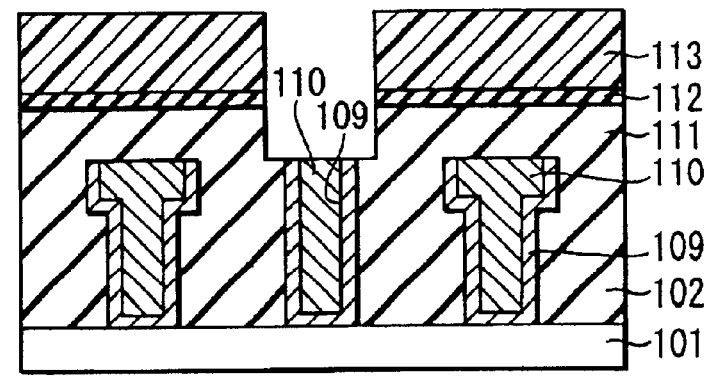

Further, the $SiO_2$ film 111 is etched with the resist pattern 113 used as a mask so as to form in the $SiO_2$ film 111 a second wiring trench connected to the barrier metal or the liner film 109 and the plug 110, as shown in FIG. 24K. The second wiring trench is substantially parallel to the first wiring trench.

The drawing covers the case where the bottom of the second wiring trench is flush with the upper surface of the wiring 110, i.e., the drawing covers an ideal case. However, it is practically possible for the bottom of the second wiring trench to be lower than the upper surface of the wiring 110. As a result, the bottom surface of the wiring (including the barrier metal film or the liner film, if such a film is formed) formed within the second wiring trench in the subsequent step is actually rendered lower than the upper surface of the wiring 110 in many cases.

Figure 24L:
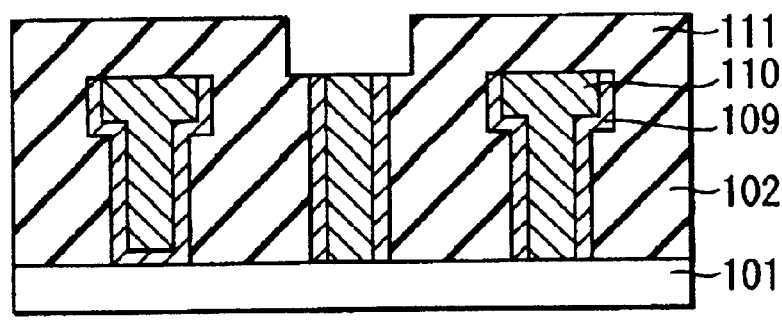

In the next step, the resist pattern 113 and the anti-reflection film 112 are removed as shown in FIG. 24L. If the anti-reflection film 112 is a film containing carbon as a main component, the resist pattern 113 and the anti-reflection film 112 can be peeled off simultaneously by an asher.

Figure 24M:
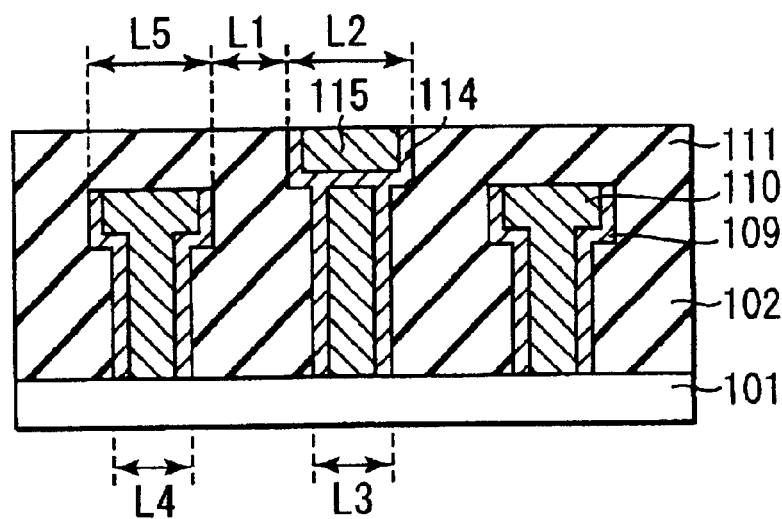

Finally, a metal film forming a barrier metal film or a liner film 114 and a wiring 115 (wiring body) is deposited on the entire surface, followed by applying a CMP treatment so as to remove the undesired metal film or the liner film 114 and the metal film outside the wiring trench so as to form the metal wiring 115 and to planarize the surface, as shown in FIG. 24M.

As a result, formed are two dual damascene wirings differing from each other in height and constituting a wiring layer of an identical wiring level (a first level in this case). It should be noted, however, that it is necessary in terms of the manufacturing process to carry out twice the burying step of the conductive material etc. for forming the high dual damascene wiring and, thus, the high dual damascene wiring cannot be correctly called a dual damascene wiring. In the present invention, these wirings differing from each other in height are called the dual damascene wiring for the sake of convenience because these wirings also differ from the so-called "single damascene wiring".

The materials of the barrier metal film or the liner film 114 and the wiring 115 are equal to the materials of the barrier metal film or the liner film 109 and the plug or the plug/wiring 110, respectively. It may be possible, however, to use different materials for these portions. For example, the wiring 115 may be formed of Ag or Au and the wiring portion of the plug/wiring 110 may be formed of Cu. It may be unnecessary to form the barrier metal film or the liner film 114 depending on the material of the wiring 115.

Figure 25A:
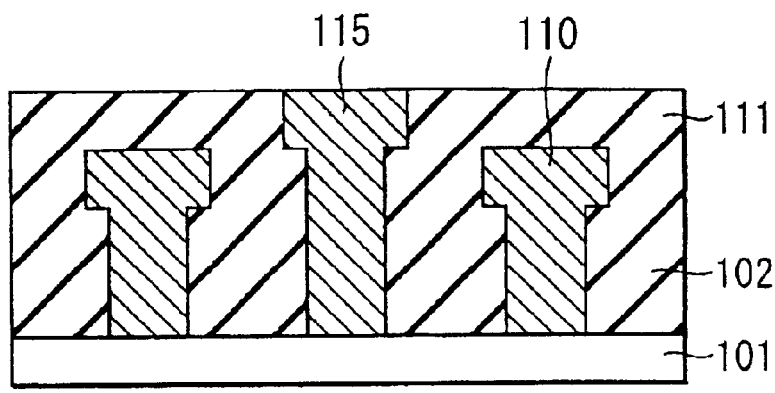
FIGS. 25A to 25C are cross sectional views showing a method of manufacturing a semiconductor device according to a first modification of the twenty-second embodiment.
Figure 25B:
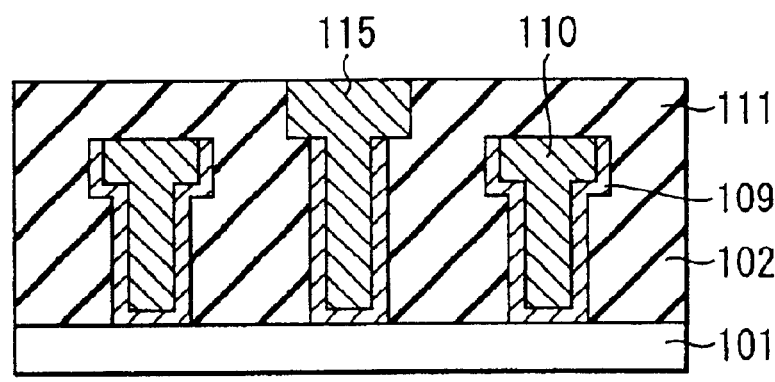
Figure 25C:
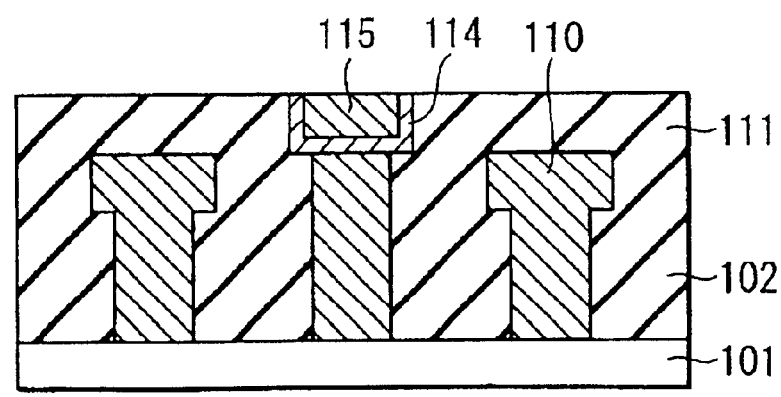

A first modification of the twenty-second embodiment is shown in FIGS. 25A to 25C. Various combination of portions, where the barrier metal films or the liner films are formed to cover the plug or the plug/wiring, is presented as far as the manufacturing step shown in FIG. 24M.

In FIG. 25A, the barrier metal films or the liner films 109 and 114 are not formed to cover the plug or the plug/wiring 110, 115. When the plug or the plug/wiring 110, 115 is formed of Al, the barrier metal films or the liner films for preventing Al thermal diffusion into the $SiO_2$ films 102 and 111 and for enhancing adhesion to the $SiO_2$ films 102 and 111 are not needed, because Al is a low melting point metal and has excellent adhesive properties to the $SiO_2$ films 102 and 111.

The barrier metal films or the liner films 109 are formed to cover the plug and plug/wiring 110 and are not formed to cover the wiring 115 in FIG. 25B. For example, when the plug or the plug/wiring 110 is formed of a metal which is needed to prevent the thermal diffusion or to enhance adhesion and the wiring 115 is formed of other metal which is of no problem concerning to the thermal diffusion and adhesion, the wiring structure as shown in FIG. 25B is possible.

The barrier metal films or the liner films 109 are formed to cover only the wiring 115 in FIG. 25C. For example, when the wiring 115 is formed of a metal which is needed to prevent the thermal diffusion or to enhance adhesion and the plug or the plug/wiring 110 is formed of other metal which is of no problem concerning to the thermal diffusion and adhesion, the wiring structure as shown in FIG. 25C is possible.

As described above, it is possible for the materials of the barrier metal film or the liner film 114 and the wiring 115 to be different from the materials of the barrier metal or the liner film 109 and the plug or the plug/wiring 110, respectively. For example, it is possible for the plug or the plug/wiring 110 to be formed of Cu and for the wiring 115 to be formed of Al, Cu, Ag or Au, and vice versa. In other words, it is possible to use different materials for forming the first and second wirings.

In FIGS. 25A to 25C of the first modified example, when the plug or the plug/wiring 110 is formed of a Cu or an Al-Cu material, it is possible for the barrier metal film or the liner film 109 to be formed of, for example, a conductive film such as a Ti film, a TiN film, a Ta film, a TaN film, or a Ti/TiN film or an insulating thin film having a thickness that permits assuring the electrical connection.

The material of the plug or the plug/wiring 110 is not limited to the Cu or Al-Cu material. It is also possible to use, for example, W, polysilicon, Al, Al-Si-Cu, Ag, Au or WSi for forming the plug or the plug/wiring 110. Depending on the material used for forming the plug or the plug/wiring 110, it is unnecessary to use the barrier metal film or the liner film 109. Also, where the plug or the plug/wiring 110 is formed of Al, it is possible for the barrier metal film or the liner film to be formed of, for example, a Nb film or a NbN film.

As described above, it is possible in this embodiment to obtain a wiring layer in which the wiring structures differing from each other in the height of the wiring (plug+wiring) are formed alternately. In other words, it is possible to obtain a wiring layer in which the side surfaces of the two adjacent wirings of the different wiring structures are not positioned to face each other. As a result, the wiring is positioned to face the adjacent plug so as to increase the wiring distance between the adjacent wiring structures so as to lower the inter-wiring parasitic capacitance.

It should also be noted that this embodiment is directed to the case where the cross sectional shape of the first wiring having the high upper surface of the wiring is equal to the cross sectional shape of the second wiring having the low upper surface of the wiring. However, it is not absolutely necessary for the cross sectional shapes of the first and second wirings to be equal to each other in order to obtain the effect of decreasing the inter-wiring parasitic capacitance.

As will be described in a second modification of this embodiment, where the cross sectional area of the first wiring is larger than the cross sectional area of the second wiring, where the first wiring width is larger than the second wiring width, or even where the thickness of the first wiring is larger than the thickness of the second wiring, it is possible to obtain a similar effect, as long as the lower surface of the first wiring is not higher than the upper surface of the second wiring. This applies to all the embodiments relating to the wiring structure described in the following.

Figure 26A:
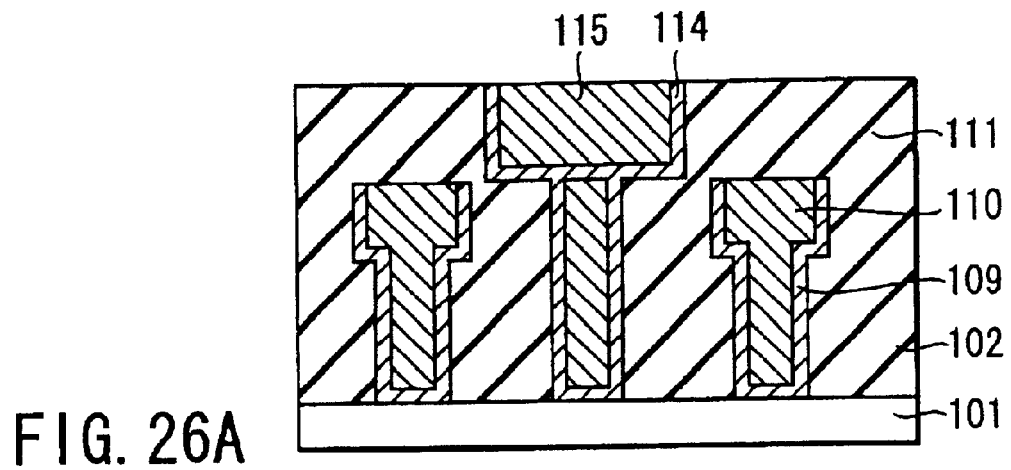
FIGS. 26A to 26C are cross sectional views showing a method of manufacturing a semiconductor device according to a second modification of the twenty-second embodiment.
Figure 26B:
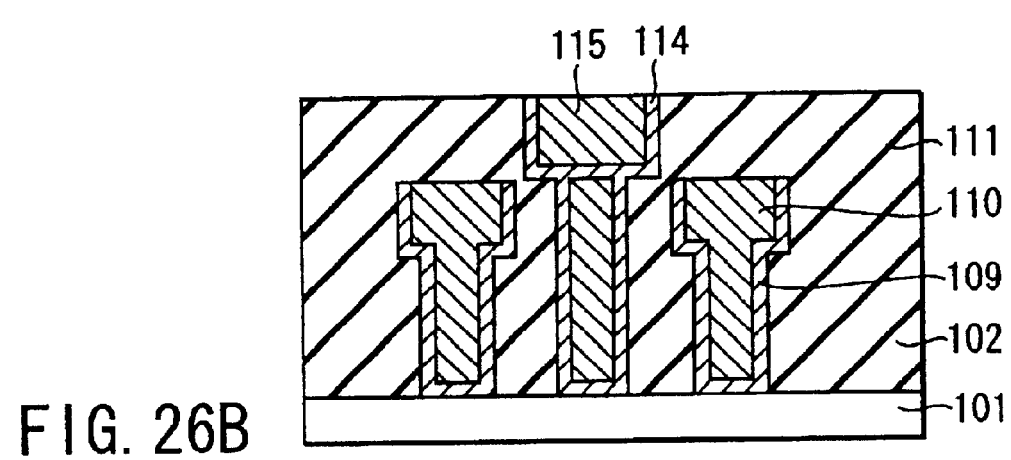
Figure 26C:
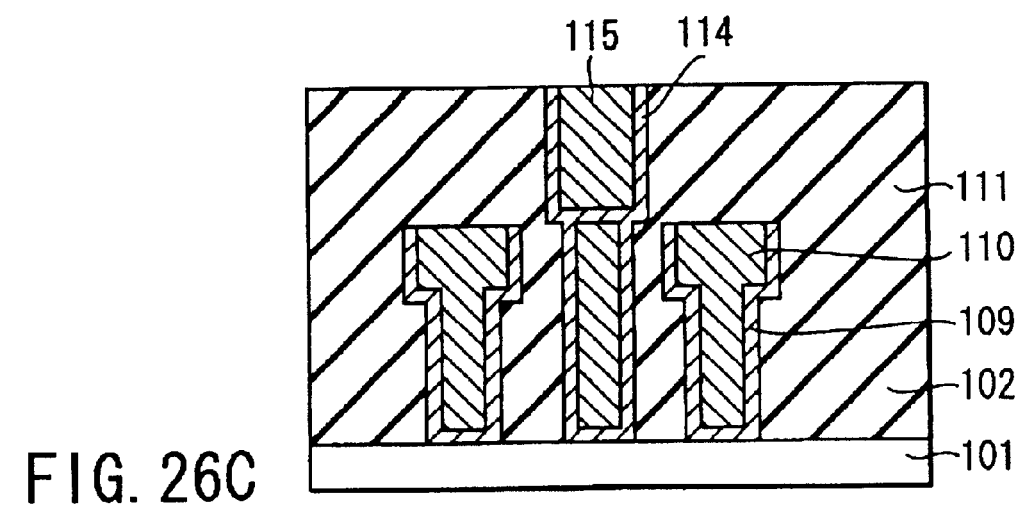

FIGS. 26A to 26C collectively show a second modification of this embodiment. The wiring structure shown in FIG. 26A differs from this embodiment in that the size of the wiring 115 in the lateral direction (wiring width direction) is larger than that in this embodiment. As a result, the cross sectional area of the wiring 115 is rendered larger than that of the wiring 110.

The wiring structure shown in FIG. 26B differs from this embodiment in that the distance between the two adjacent wiring in the wiring width direction is decreased within a range that the high wiring 115 is not brought into an electrical contact with the low wiring 110.

The wiring structure shown in FIG. 26C differs from this embodiment in that the wiring 115 extends in a vertical direction.

Figure 27A:
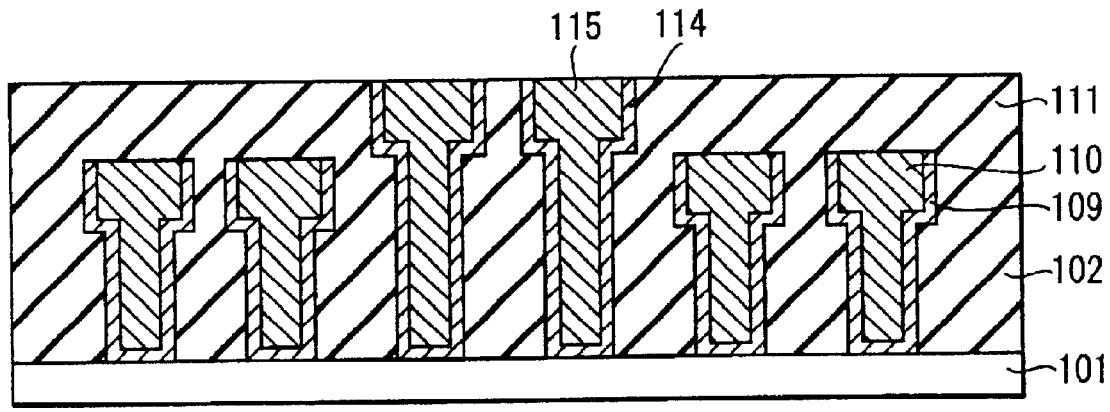
FIGS. 27A and 27B are cross sectional views showing a method of manufacturing a semiconductor device according to a third modification of the twenty-second embodiment.
Figure 27B:
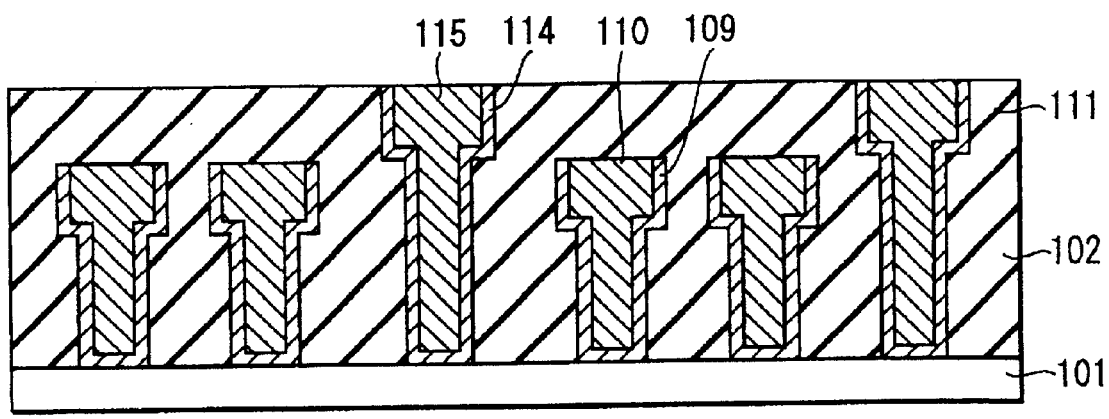

FIGS. 27A and 27B show a third modification of this embodiment. The wiring structures shown in FIGS. 27A and 27B differ from this embodiment in that a single high wiring 115 and a single low wiring 110 are not formed alternately. FIG. 27A shows an example that two high wirings 115 and two low wirings 110 are formed alternately, and FIG. 27B shows an example that a single high wiring 115 and two low wirings 110 are formed alternately. What should be noted is that it suffices for a single high wiring 115 and a plurality of low wirings 110 to be formed alternately, for a plurality to high wirings 115 and a single low wiring 110 to be formed alternately, or for a plurality of high wirings 115 and a plurality of low wirings 110 to be formed alternately.

As described above, it is possible to suppress effectively the signal transmission delay caused by the inter-wiring parasitic capacitance which is rendered prominent with the decrease in the distance between the adjacent wirings. By contraries, if the distance between the adjacent wirings is the same, the signal transmission speed is increased.

The wiring structures shown in FIGS. 25A to 25C, 26A to 26C and descriptions in the first and second modifications of this embodiment also apply to the wiring structures shown in FIGS. 27A and 27B. According to this embodiment, it suffices to change alternately the heights of the wirings, and the conventional wiring pattern as viewed from above can be left unchanged, with the result that the pattern of the wiring layer can be designed easily.

In FIG. 24M, it is desirable for the distance L1 in the wiring width direction, between the two adjacent wirings of the wiring structures differing from each other in height, to be not larger than 0.13 µm. In the case of such a fine wiring, the influence of the parasitic capacitance is large, which greatly improves the effect of the present invention. The lower limit of the distance L1 noted above is not smaller than zero.

Also, the ratio of size L2 (L5) in the width direction of the wiring (wiring body+intermediate film) to the size L3 (L4) in the wiring width direction of the plug (plug body+ intermediate film), i.e., the ratio L2/L3 (L5/L4), should typically be 10 or less in each of the wiring structures differing from each other in height. On the other hand, the lower limit of the ratio noted above is larger than 1.

Also, in this embodiment, the wiring 115 is arranged in an upper portion so as to make it possible to set the ratio L2/L1 at a value not smaller than 1, i.e., 1 $\mu$L2/L1. In the conventional case, the ratio L2/L1 is set at 1.

It is possible to decrease the length L1 to 0.01 µm. On the other hand, the minimum wiring width that can be achieved nowadays is 0.13 µm. It follows that the present technology makes it possible to decrease the ratio of L2/L1 to 13.

In this embodiment, the polysilicon film 103 is used as the hard mask. Alternatively, it is possible to use a silicon nitride film, an SiC film, a tungsten film or a WSi film as the hard mask. Also, the $SiO_2$ film (silicon oxide film) 102 is used as the interlayer insulating film in this embodiment. However, it is also possible to use an inorganic silicon oxide film, a low-k film or an organic silicon oxide film in place of the $SiO_2$ film.

Incidentally, the organic silicon oxide film and the inorganic silicon oxide film can be formed easily by forming the portion of the interlayer insulating film by using an organic silicon film in place of the $SiO_2$ film, followed by introducing oxygen into the organic silicon film in the processing step of the interlayer insulating film by the dry etching process so as to convert the organic silicon film into an organic silicon oxide film and an inorganic silicon oxide film, as already described in conjunction with the first embodiment. Incidentally, it is possible to use an organic silicon film containing oxygen as a constituting element in place of the $SiO_2$ film.

In this case, it is possible to decrease the dielectric constant of the organic silicon oxide film and the inorganic silicon oxide film, compared with the dielectric constant of the $SiO_2$ film 102, by controlling the degree of oxidation of the organic silicon film, so as to make it possible to suppress effectively the signal transmission delay caused by the inter-wiring parasitic capacitance.

The low-k films having a particularly small value of the dielectric constant include, for example, an organic silicon oxide film such as a polysiloxane film or a benzocyclobutene film (BCB), an inorganic silicon oxide film such as a hydrogen-silsesque oxane film, and a CF-based organic silicon film such as a polyarylene ether film, a Parylene film or a polyimide fluoro polymer film.

<Twenty-third embodiment>

FIGS. 28A to 28F are cross sectional views collectively showing a method of manufacturing a semiconductor device according to a twenty-third embodiment of the present invention. In the twenty-third embodiment, the portions corresponding to the twenty-second embodiment shown in FIGS. 24A to 24M are denoted by the same reference numerals so as to avoid an overlapping description. It follows that, where the specific thickness, material, operating conditions, produced effects, etc. are not referred to in the following description, the specific thickness, material, operating conditions, produced effects, etc. described previously with reference to FIGS. 24A to 24M are applied in the twenty-third embodiment of the present invention.

Figure 28A:
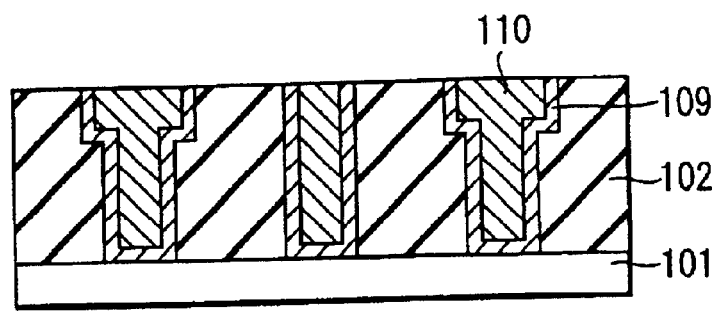
FIGS. 28A to 28F are cross sectional views collectively showing a method of manufacturing a semiconductor device according to a twenty-third embodiment.
Figure 28B:
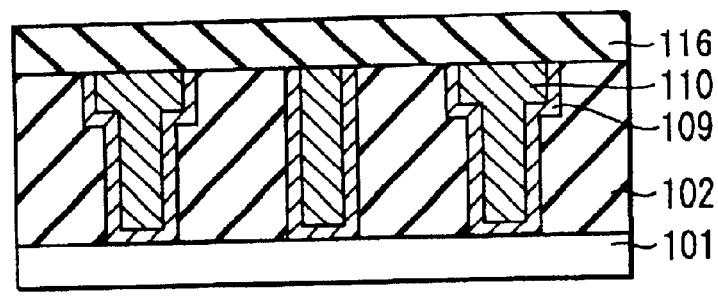
Figure 28C:
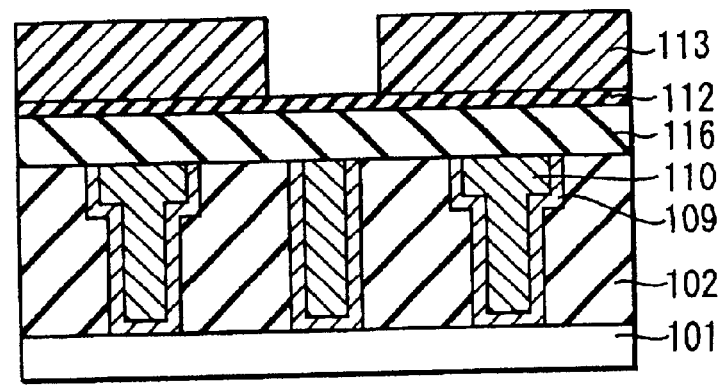
Figure 28D:
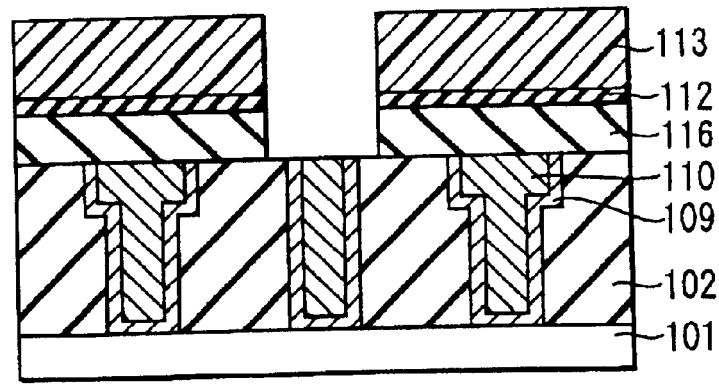
Figure 28E:
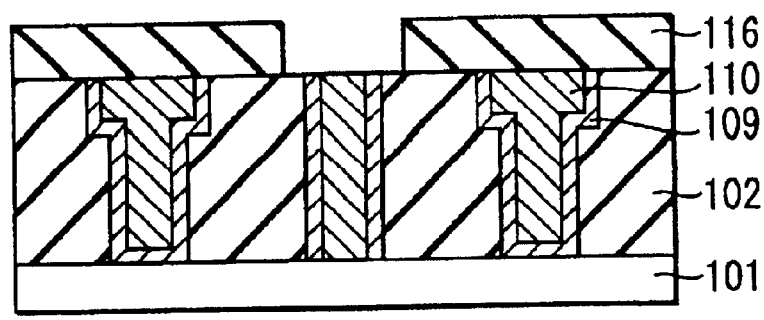

In the first step, the steps shown in FIGS. 24A to 24H included in the twenty-second embodiment described previously are carried out as shown in FIG. 28A. Then, an organic silicon oxide film 116 is deposited on the entire surface as an interlayer insulating film, as shown in FIG. 28B. After deposition of the interlayer insulating film 116, the steps shown in FIGS. 24J to 24M for the twenty-second embodiment are carried out as shown in FIGS. 28C to 28F.

According to the twenty-third embodiment of the present invention, the organic silicon oxide film 116 is used as the interlayer insulating film so as to make it possible to further lower the inter-wiring parasitic capacitance, compared with the twenty-second embodiment. Incidentally, in the twenty-third embodiment of the present invention, the organic silicon oxide film 116 is used as the interlayer insulating film as pointed out above. Alternatively, it is also possible to use a film having a low dielectric constant such as a low-k film or an inorganic silicon oxide film in place of the organic silicon oxide film 116.

Further, the combination of the first insulating film, i.e., the $SiO_2$ film 102 in this case, buried in the plug/wiring 110 and the second insulating film, i.e., the organic silicon oxide film 116 in this case, buried in the wiring 115 is not limited to the combination of the $SiO_2$ film 102 and the organic silicon oxide film 116. In other words, it is possible for each of the first and second insulating films to be formed of any combination of different insulating films selected from the group consisting of the low-k film, the inorganic silicon oxide film and the organic silicon oxide film. What should be noted is that it is possible to form the interlayer insulating film by utilizing the difference in the etching rate as long as the first and second wirings are formed of different materials.

Incidentally, where the parasitic capacitance in the wiring structure having the lower upper surface of the wiring (second wiring structure in the twenty-second embodiment) raises a problem in the twenty-third embodiment, it is possible to use a film having a low dielectric constant such as the organic silicon oxide film 116 in place of the $SiO_2$ film 102, which is opposite to that in the twenty-third embodiment. It is also possible to employ various additional modifications.

The low-k films having a particularly small value of the dielectric constant include, for example, an organic silicon oxide film such as a polysiloxane film or a benzocyclobutene film (BCB), an inorganic silicon oxide film such as a hydrogen-silsesque oxane film, and a CF-based organic silicon film such as a polyarylene ether film, a Parylene film or a polyimide fluoro polymer film.

Where the plug or the plug/wiring 110 is formed of a Cu or an Al-Cu material, it is possible for the barrier metal film or the liner film 109 to be formed of, for example, a conductive film such as a Ti film, a TiN film, a Ta film, a TaN film, or a Ti/TiN film or an insulating thin film having a thickness that permits assuring the electrical connection.

The material of the plug or the plug/wiring 110 is not limited to the Cu or Al-Cu material. It is also possible to use, for example, W, polysilicon, Al, Al-Si-Cu, Ag, Au or WSi for forming the plug or the plug/wiring 110. Depending on the material used for forming the plug or the plug/wiring 110, it is unnecessary to use the barrier metal film or the liner film 109. Where the plug or the plug/wiring 110 is formed of Al, it is possible for the barrier metal film or the liner film to be formed of, for example, a Nb film or a NbN film.

Figure 28F:
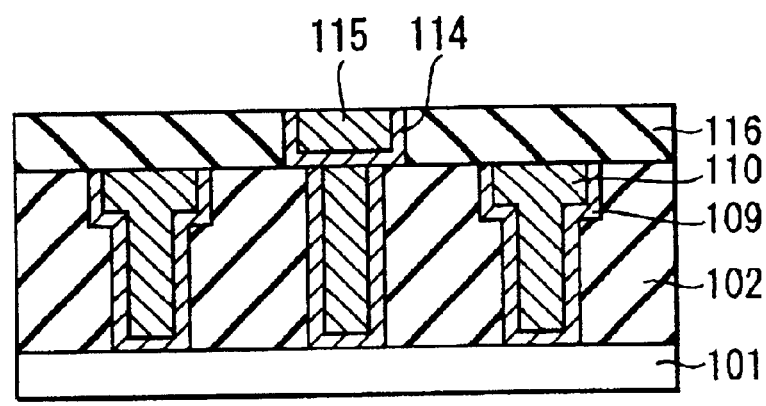

It should be noted that the wiring structures shown in FIGS. 25A to 25C, 26A to 26C and descriptions in the first and second modifications of the twenty-second embodiment also apply to the wiring structure shown in FIG. 28F.

<Twenty-fourth embodiment>

FIGS. 29A to 29F are cross sectional views collectively showing a method of manufacturing a semiconductor device according to a twenty-fourth embodiment of the present invention.

Figure 29A:
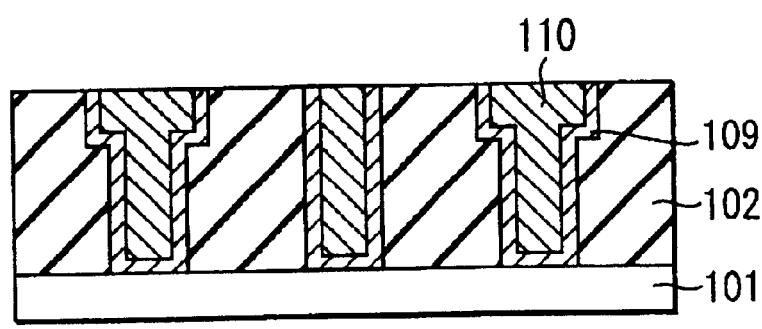
FIGS. 29A to 29F are cross sectional views collectively showing a method of manufacturing a semiconductor device according to a twenty-fourth embodiment.
Figure 29B:
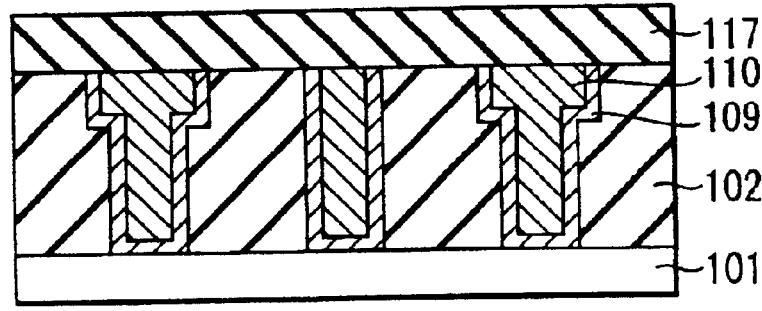

In the first step, the steps of the twenty-second embodiment shown in FIGS. 24A to 24H are carried out, as shown in FIG. 29A. Then, a low-k film 117 is formed on the entire surface, as shown in FIG. 29B. The low-k film 117 is a CF-based film such as a flare film or a silk film. It is also possible to use a carbon-based film that does not contain Si such as a resist film or a carbon film itself as the low-k film, with substantially the same effect.

Figure 29C:
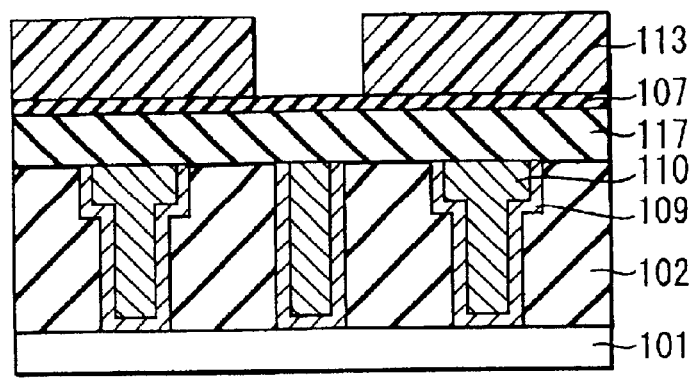

In the next step, an SOG film 107 having a thickness of 100 nm and a resist pattern 113 having a thickness of 300 nm are successively formed on the low-k film 117, as shown in FIG. 29C. Further, an anisotropic etching is applied to the SOG film 107 with the resist pattern 113 used as a mask so as to transfer the pattern of the resist pattern 113 into the SOG film 107, followed by etching the low-k film 117 with the resist pattern 113 and the SOG film 107 used as a mask so as to form a wiring trench in the low-k film 117.

Figure 29D:
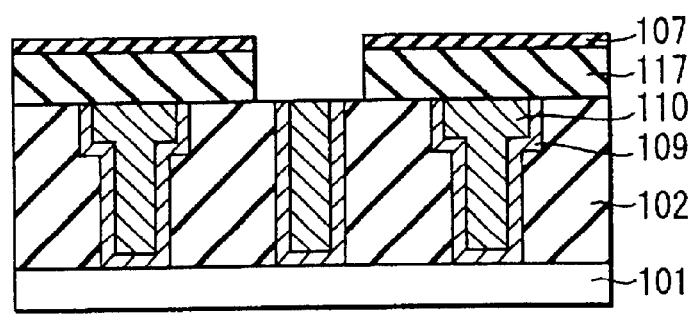

The low-k film is etched in the initial stage with the resist pattern 113 used as a mask. However, since the resist pattern 113 is etched away during the etching process, the low-k film is etched finally with the SOG film 107 used as a mask. FIG. 29D is a cross sectional view showing the state in this stage.

The SOG film 107 is etched under, for example, the pressure of 20 mTorr, the power supply of 1,000 W, and the flow ratio of the etching gases $CF_4/O_2$ of 60/10 sccm. On the other hand, the low-k film 117 is etched under, for example, the pressure of 40 mTorr, the power supply of 500 W and the flow ratio of the etching gases $N_2/O_2$ of 150/10 sccm. Where the etching is carried out under these conditions, the etching selectivity ratio of the low-k film 117 relative to the SOG film 107 is about 50. The etching selectivity ratio of the low-k film 117 relative to the $SiO_2$ film 102 is rendered very high, i.e., 100 or more.

Figure 29E:
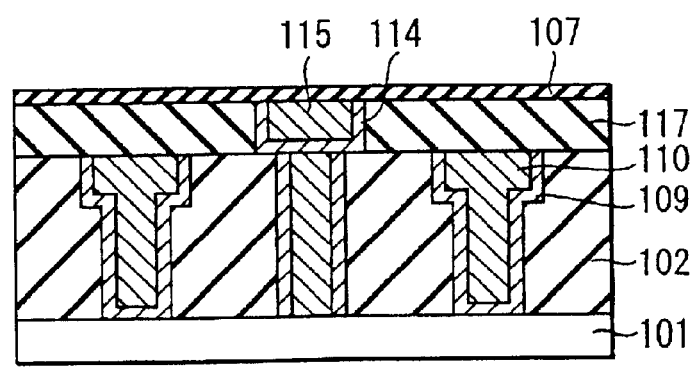

In the next step, a metal film forming a barrier metal film or the liner film 114 and the wiring 115 is deposited on the entire surface, as shown in FIG. 29E, followed by applying a CMP treatment so as to remove the undesired barrier metal film or the liner film 115 and the metal film and the SOG film 107 outside the wiring trench, to form the wiring 115, and to planarize the surface. Then, the SOG film 107 is deposited again on the entire surface. Incidentally, it is possible to finish the wiring formation in this stage without forming an air-bridge wiring described in the subsequent step.

Figure 29F:
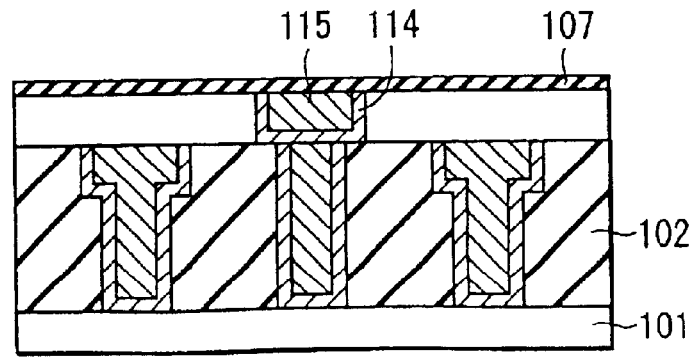

As shown in FIG. 29F, a hole is made in the SOG film 107 formed on the low-k film 117, followed by removing the low-k film 117 by an $O_2$ asher so as to form an air-bridge wiring. By converting the upper wiring 115 into the air-bridge wiring in this fashion, it is possible to suppress more effectively the signal transmission delay caused by the inter-wiring parasitic capacitance.

The role played by the SOG film 107 formed on the low-k film 117 will now be described. If the SOG film 107 is removed after formation of the wiring 115 shown in FIG. 29F, followed by removing the low-k film 117, it is possible to suppress similarly the signal transmission delay caused by the inter-wiring parasitic capacitance. However, if the SOG film 107 is removed, it is impossible to laminate a multi-layered wiring structure on the upper layer. In this fashion, the SOG film 107 plays the role of the supporting substrate in further laminating a multi-layered wiring structure on the upper layer after formation of the air-bridge wiring.

In the twenty-fourth embodiment the low-k films having a particularly small value of the dielectric constant other than the flare film or the silk film include, for example, an organic silicon oxide film such as a polysiloxane film or a benzocyclobutene film (BCB), an inorganic silicon oxide film such as a hydrogen-silsesque oxane film, and a CF-based organic silicon film such as a polyarylene ether film, a Parylene film or a polyimide fluoro polymer film.

Where the plug or the plug/wiring 110 is formed of a Cu or an Al-Cu material, it is possible for the barrier metal film or the liner film 109 to be formed of, for example, a conductive film such as a Ti film, a TiN film, a Ta film, a TaN film, or a Ti/TiN film or an insulating thin film having a thickness that permits assuring the electrical connection.

The material of the plug or the plug/wiring 110 is not limited to the Cu or Al-Cu material. It is also possible to use, for example, W, polysilicon, Al, Al-Si-Cu, Ag, Au or WSi for forming the plug or the plug/wiring 110. Depending on the material used for forming the plug or the plug/wiring 110, it is unnecessary to use the barrier metal film or the liner film 109. Where the plug or the plug/wiring 110 is formed of Al, it is possible for the barrier metal film or the liner film to be formed of, for example, a Nb film or a NbN film.

Also, the wiring structures shown in FIGS. 25A to 25C, 26A to 26C and descriptions given in the first and second modifications of the twenty-second embodiment apply to the wring structures shown in FIGS. 29E and 29F.

<Twenty-fifth embodiment>

FIGS. 30A to 30D are cross sectional views collectively showing a method of manufacturing a semiconductor device according to a twenty-fifth embodiment. This embodiment is directed to the case where all the wiring structures in the same layer are of the air-bridge wiring structure.

Figure 30A:
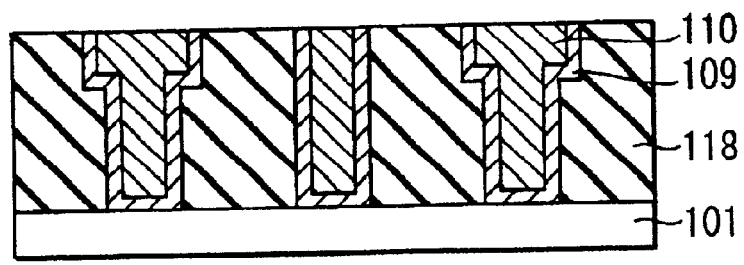
FIGS. 30A to 30F are cross sectional views collectively showing a method of manufacturing a semiconductor device according to a twenty-fifth embodiment.

In the first step, the steps of the twenty-second embodiment shown in FIGS. 24A to 24H are carried out as shown in FIG. 30A. It should be noted, however, that a low dielectric constant film 118 is used in the twenty-fifth embodiment in place of the $SiO_2$ film 102. It is possible to use the material used for forming the low dielectric constant film 117 in the twenty-fourth embodiment can be used for forming the low dielectric constant film 118 in the twenty-fifth embodiment.

Figure 30B:
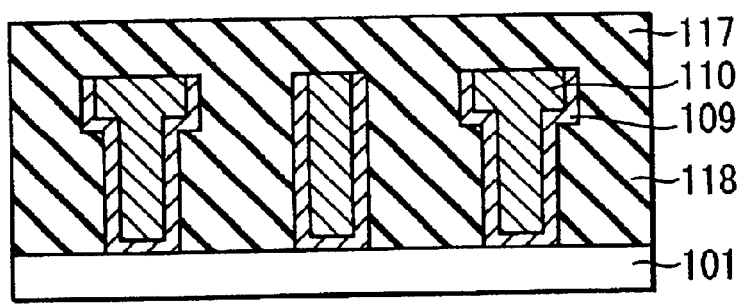
Figure 30C:
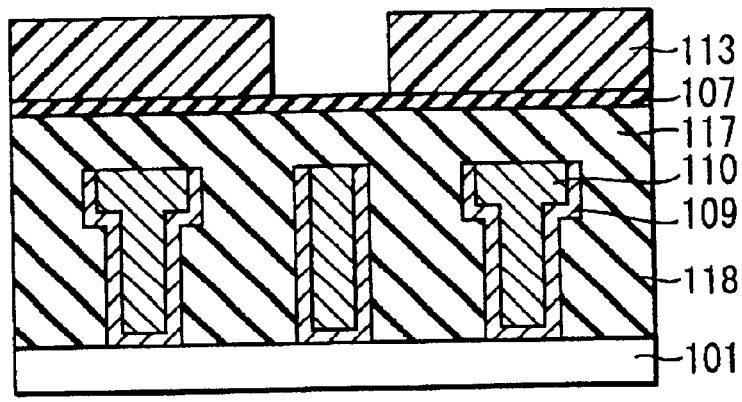

In the next step, a low dielectric constant film 117 is formed on the entire surface, as shown in FIG. 30B. Then, an SOG film 107 and a resist pattern 113 are formed on the low dielectric constant film 117, as shown in FIG. 30C. Further, an anisotropic etching is applied to the SOG film 107 with the resist pattern 113 used as a mask so as to transfer the pattern of the resist pattern 113 onto the SOG film 107, followed by etching the low-k film 117 with the resist pattern 113 and the SOG film 107 used as a mask so as to form a wiring trench in the low-k film 117.

Figure 30D:
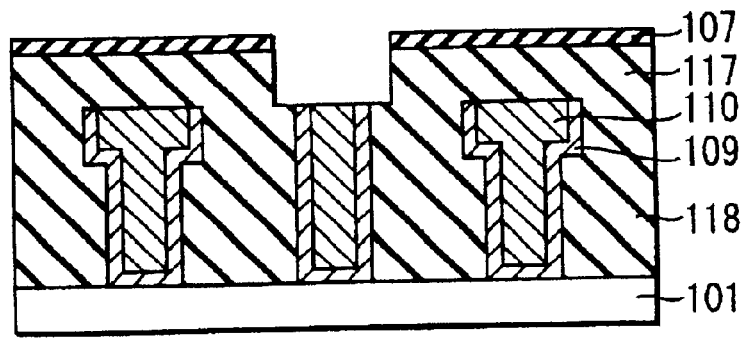

The low-k film 117 is etched in the initial stage with the resist pattern 113 used as a mask. However, since the resist pattern 113 is etched away during the etching treatment, the low-k film 117 is etched finally with the SOG film 107 used as a mask. FIG. 30D is a cross sectional view showing the state in this stage. The etching conditions of the SOG film 107 and the low-k film 117 are equal to the etching conditions in the twenty-fourth embodiment.

In the next step, a metal film forming a barrier metal film or the liner 114 and the wiring 115 is deposited on the entire surface, followed by applying a CMP treatment so as to remove the undesired barrier metal film or the liner film 114 and the metal film outside the wiring trench, to form the wiring 115, and to planarize the surface. Incidentally, it is also possible to form again the SOG film 107 on the entire surface as in the twenty-fourth embodiment shown in FIG. 30E.

Further, a hole is made in a part of the SOG film 107 formed on the low-k film 117, followed by removing the low-k films 117 and 118 by an $O_2$ asher so as to form an air-bridge wiring. By converting the entire wiring structure within the same layer into the air-bridge structure in this fashion, it is possible to suppress more effectively the signal transmission delay caused by the inter-wiring parasitic capacitance.

Incidentally, each of the twenty-fourth and twenty-fifth embodiments of the present invention described above is directed to the case where the silicon substrate 101 provides the underlying layer. However, the underlying layer in the steps described above is not limited to the silicon substrate. Needless to say, it is possible to form the similar air-bridge structure on a layer of an optional material.

In the twenty-fifth embodiment, the low-k films having a particularly small value of the dielectric constant include, for example, an organic silicon oxide film such as a polysiloxane film or a benzocyclobutene film (BCB), an inorganic silicon oxide film such as a hydrogen-silsesque oxane film, and a CF-based organic silicon film such as a polyarylene ether film, a Parylene film or a polyimide fluoro polymer film.

Where the plug or the plug/wiring 110 is formed of a Cu or an Al-Cu material, it is possible for the barrier metal film or the liner film 109 to be formed of, for example, a conductive film such as a Ti film, a TiN film, a Ta film, a TaN film, or a Ti/TiN film or an insulating thin film having a thickness that permits assuring the electrical connection.

The material of the plug or the plug/wiring 110 is not limited to the Cu or Al-Cu material. It is also possible to use, for example, W, polysilicon, Al, Al-Si-Cu, Ag, Au or WSi for forming the plug or the plug/wiring 110. Depending on the material used for forming the plug or the plug/wiring 110, it is unnecessary to use the barrier metal film or the liner film 109. Where the plug or the plug/wiring 110 is formed of Al, it is possible for the barrier metal film or the liner film to be formed of, for example, a Nb film or a NbN film.

Figure 30E:
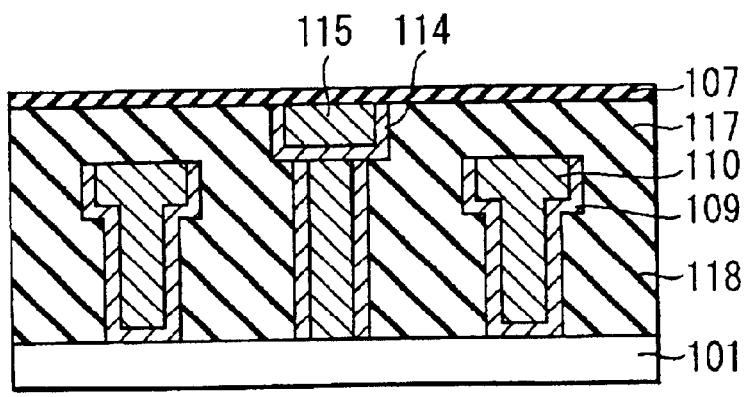
Figure 30F:
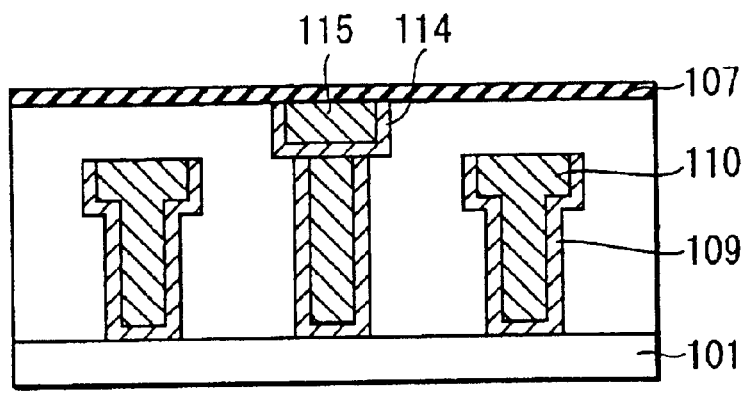

Also, the wiring structures shown in FIGS. 25A to 25C, 26A to 26C and descriptions in the first and second modifications of the twenty-second embodiment apply to the wiring structures shown in FIGS. 30E and 30F.

<Twenty-sixth embodiment>

FIGS. 31A to 31F are cross sectional views collectively showing a method of manufacturing a semiconductor device according to a twenty-sixth embodiment. This embodiment is directed to the case where wiring layers differing from each other in height are alternately formed in the same wiring layer by using Al as the wiring material.

Figure 31A:
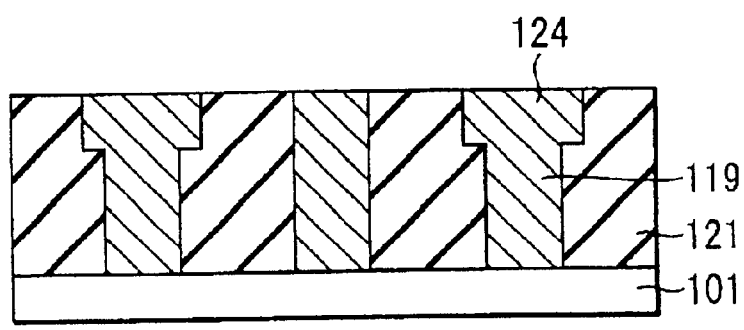
FIGS. 31A to 31F are cross sectional views collectively showing a method of manufacturing a semiconductor device according to a twenty-sixth embodiment.
Figure 31B:
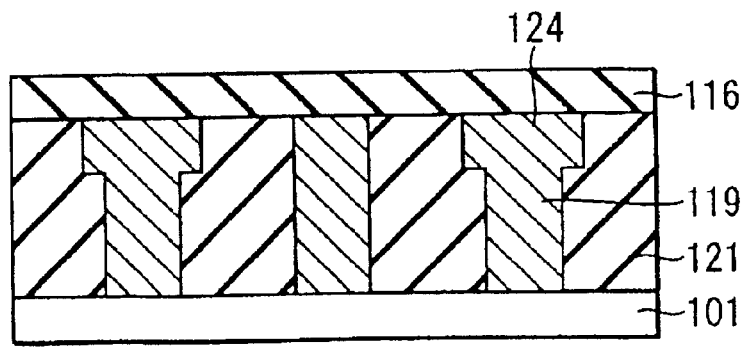
Figure 31C:
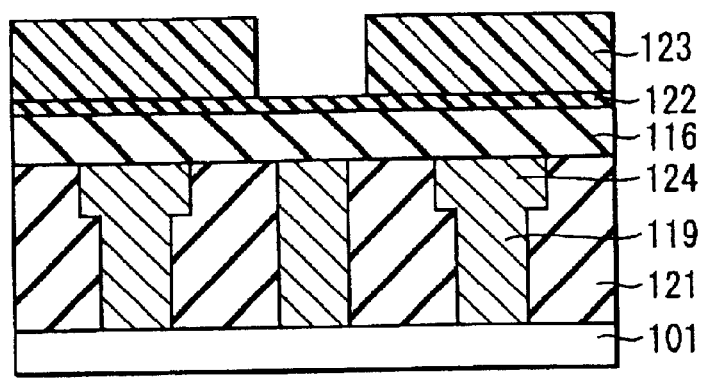
Figure 31D:
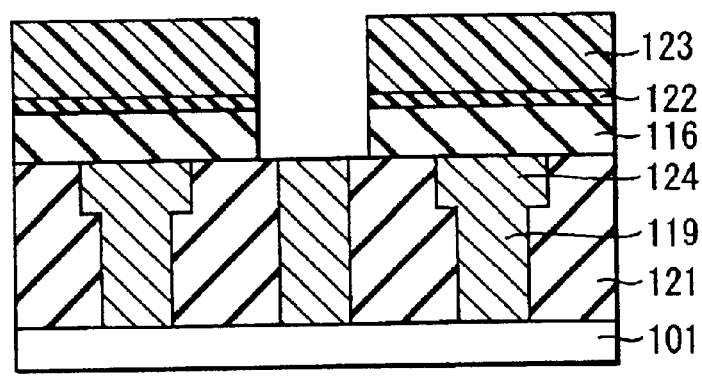
Figure 31E:
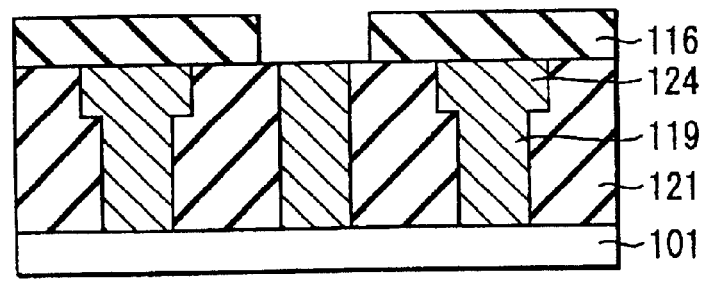

In the first step, an Al film providing the material of the plug 119 is formed on the silicon substrate 101, and a pattern of a TEOS oxide film is formed on the Al film as a hard mask for processing the Al film into plugs, as shown in FIG. 31A. The TEOS oxide film is etched under, for example, the pressure of 50 mTorr, the power supply of 1,000 W and the flow ratio of the etching gases $C_4F_8$/Co/Ar of 10/100/100 sccm. On the other hand, the Al film is etched under, for example, the pressure of 4 mTorr, the power supply of 500 W, and the flow ratio of the etching gases $Cl/O_2$ of 75/10 sccm. In this case, the etching selectivity ratio of the Al film relative to the TEOS oxide film is about 50, with the result that the TEOS oxide film provides a satisfactory etching mask relative to the Al film.

In the next step, the TEOS oxide film 121 is buried again in the clearance between the adjacent Al plugs 119 formed on the silicon substrate, followed by planarizing the surface and subsequently etching the TEOS oxide film with a resist film used as a mask so as to form a wiring trench connected to the Al plug 119.

Further, an Al film is deposited within the wiring trench and a CMP treatment (damascene process) is applied to the Al film so as to form an Al wiring 124 connected to the Al plug 119. Incidentally, a part of the Al film in which the wiring trench is not formed provides an Al plug having one edge exposed to the surface as shown in the central portion of FIG. 31A.

In the next step, an organic silicon oxide film 116 is deposited on the entire surface as an interlayer insulating film, followed by carrying out the steps of the twenty-third embodiment shown in FIGS. 24J to 24M, as shown in FIGS. 31C to 31F.

In the twenty-sixth embodiment, the organic silicon oxide film 116 is used as the interlayer insulating film so as to make it possible to decrease the inter-wiring parasitic capacitance. Incidentally, it is possible to use a low dielectric constant film such as a low-k film or an inorganic silicon oxide film in place of the organic silicon oxide film 116.

The low-k films having a particularly small value of the dielectric constant include, for example, an organic silicon oxide film such as a polysiloxane film or a benzocyclobutene film (BCB), an inorganic silicon oxide film such as a hydrogen-silsesque oxane film, and a CF-based organic silicon film such as a polyarylene ether film, a Parylene film or a polyimide fluoro polymer film.

Also, it is possible for the first and second insulating films to be a combination of different insulating films selected from the group consisting of a low-k film, an inorganic silicon oxide film and an organic silicon oxide film as in the twenty-third embodiment. An $SiO_2$ film may be used in place of the organic silicon oxide film.

Also, a TEOS oxide film is used as a hard mask of the Al film in the twenty-sixth embodiment. However, it is also possible to use another insulating film such as a silicon nitride film or an insulating film containing silicon, nitrogen and oxygen (SiON film), and an SiC film in place of the TEOS oxide film.

In the twenty-sixth embodiment of the present invention, Al is used as the wiring material. However, it is also possible to use another wiring material such as W, polysilicon, Cu, Al-Cu, Al-Si-Cu, Ag, Au or WSi in place of Al. Also, in the twenty-sixth embodiment, a barrier metal and a liner film are not used. However, it is possible to use a liner film, as required. It is possible to use the barrier metal film and the liner film used in, for example, the twenty-second embodiment described previously.

That is, where the plug or the plug/wiring is formed of a Cu or an Al-Cu material, it is possible for the barrier metal film or the liner film to be formed of, for example, a conductive film such as a Ti film, a TiN film, a Ta film, a TaN film, or a Ti/TiN film or an insulating thin film having a thickness that permits assuring the electrical connection. Also, where the plug or the plug/wiring is formed of Al, it is possible for the barrier metal film or the liner film to be formed of, for example, a Nb film or a NbN film.

Further, the twenty-sixth embodiment is directed to the case where a conductive region such as a diffused layer formed in a surface region of the substrate is used as the underlying layer. Alternatively, it is possible for the metal wiring layer formed on the silicon substrate to provide the underlying layer.

As described above, it is possible to obtain a wiring layer in which the Al wiring structures (Al plug+Al wiring) differing from each other in the height of the wiring are alternately formed in the twenty-sixth embodiment so as to make it possible to obtain the effects similar to those obtained in the twenty-second embodiment. Incidentally, it is possible to form the Al air-bridge wiring structure described in each of the twenty-fourth and twenty-fifth embodiments on the basis of the Al wiring structure shown in FIG. 31F.

Figure 31F:
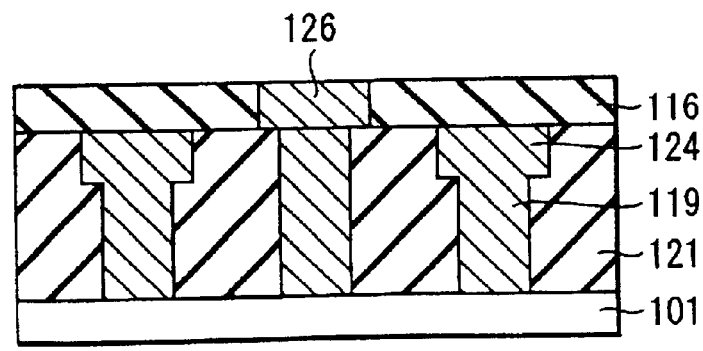

It should be noted that the wiring structures shown in FIGS. 25A to 25C, 26A to 26C and descriptions in the first and second modifications of the twenty-second embodiment also apply to the wring structure shown in FIG. 31F of this embodiment.

<Twenty-seventh embodiment>

A twenty-seventh embodiment of the present invention will now be described with reference to FIGS. 32A to 32F. In each of the twenty-second to twenty-sixth embodiments described above, a single layer damascene wiring having a small inter-wiring parasitic capacitance is formed on a flat silicon substrate. In the twenty-seventh embodiment, however, formed is a single layer damascene wiring having a small inter-wiring parasitic capacitance, said damascene wiring being connected to the source-drain diffusion layers of a MOS transistor formed on a silicon substrate.

FIGS. 32A to 32F are cross sectional views collectively showing a method of connecting a plug of a single layer damascene wiring to the source-drain diffusion layers by using a self-aligned contact (SAC).

It should be noted that a plug is connected to the source-drain diffusion layers by employing an SAC using $SiO_2$ and polysilane in the fifteenth embodiment described previously. Also, the wirings buried in the wiring trench and differing from each other in height are connected to a plug in the twenty-second embodiment so as to form a single layer damascene wiring having a small inter-wiring parasitic capacitance. What should be noted is that the method of the twenty-seventh embodiment can be achieved by combining the methods employed in the fifteenth embodiment and the twenty-second embodiment referred to above.

Figure 32A:
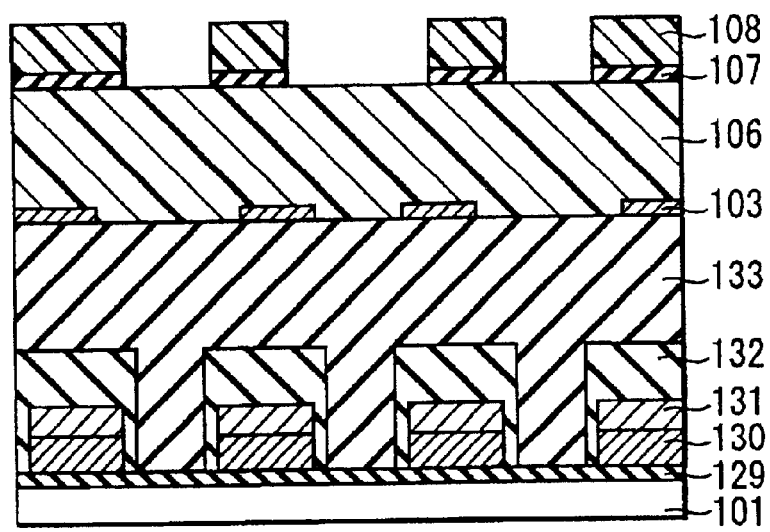
FIGS. 32A to 32F are cross sectional views collectively showing a method of manufacturing a semiconductor device according to a twenty-seventh embodiment.
Figure 32B:
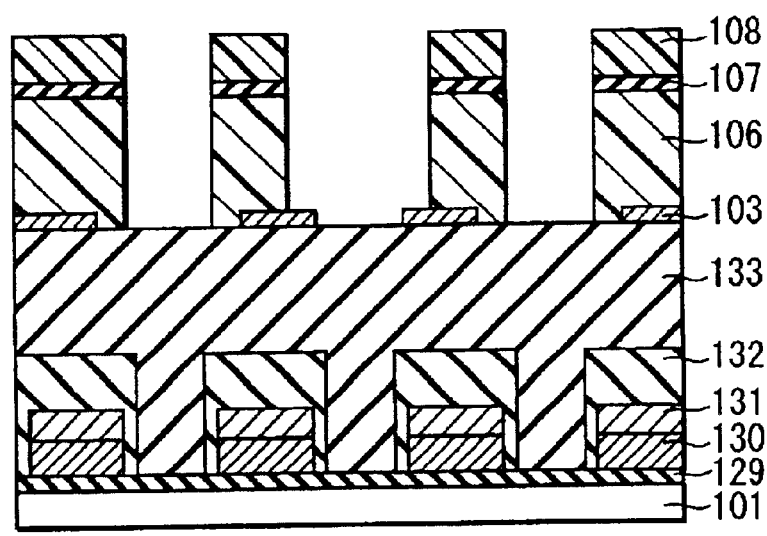

The structure shown in FIG. 32A comprises the a silicon substrate 101, a gate insulating film 129, a polysilicon film 130 and a tungsten silicide film 131 collectively forming a polyside gate, a silicon nitride film 132 covering the polyside gate, an interlayer insulating film 133, e.g., a BPSG film, having a sufficiently large etching selectivity ratio relative to the silicon nitride film, the polysilicon film 103 providing a hard mask of the interlayer insulating film 133, the resist film 106, the SOG film 107, and the resist pattern 108.

In the structure shown in FIG. 32A, a polyside gate is used as the gate of the MOS transistor. However, it is also possible to use another gate structure, such as a poly-metal gate. It should be noted that the interlayer insulating film 133 corresponds to the $SiO_2$ film 102 shown in, for example FIG. 24A referred to previously in conjunction with the twenty-second embodiment.

In the next step, the resist film 106 is selectively etched with the resist pattern 108 and the SOG film 107 used as a mask. The resist film 106 is etched in the initial stage with the resist pattern 108 used as a mask. However, since the resist pattern 108 is etched away during the etching process, the resist film 106 is etched finally with the SOG film 107 used as a mask.

Figure 32C:
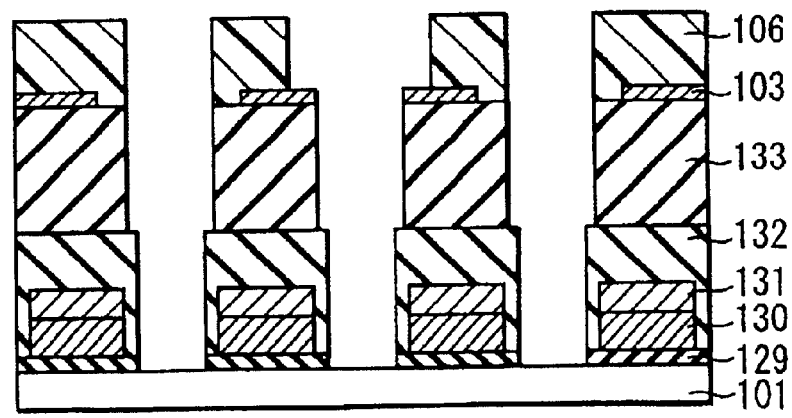

In the next step, the interlayer insulating film 133 is selectively etched with the resist film 106 and the SOG film 107 used as a mask. In this step, the SOG film 107 is etched away, with the result that a contact hole is formed in the self-aligned fashion in the interlayer insulating film 133 in a manner to extend to reach the source-drain regions (not shown) formed in a surface region of the silicon substrate, as shown in FIG. 32C.

Figure 32D:
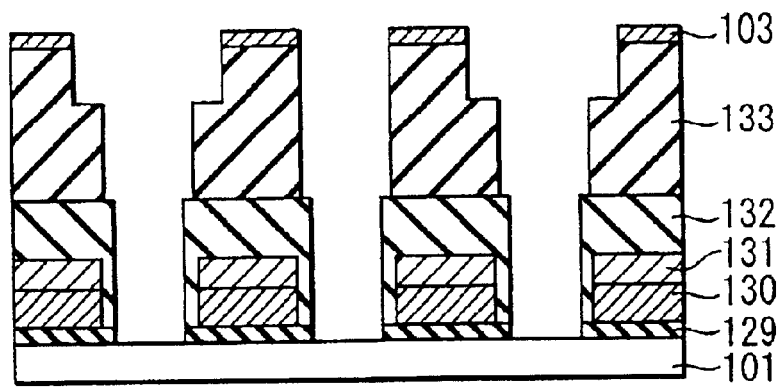
Figure 32E:
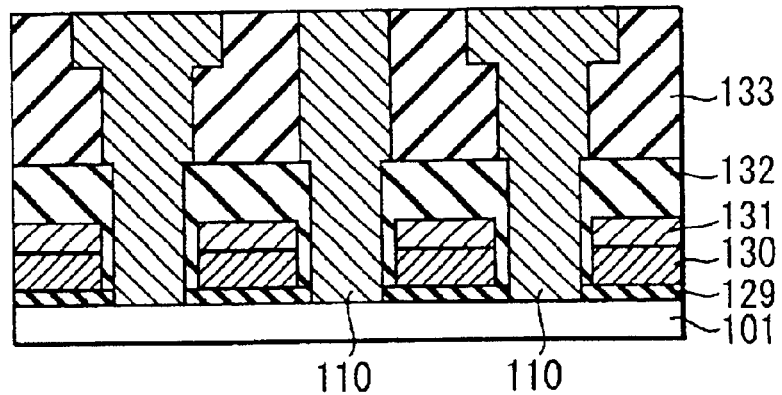

In the next step, the resist film 106 is removed by the $O_2$ RIE, followed by forming a wiring trench having a low upper surface of the wiring on the surface of the interlayer insulating film 133 as shown in FIG. 32D and subsequently burying and planarizing a metal film forming a plug or the plug/wiring 110 as shown in FIG. 32E.

Then, an organic silicon oxide film 116 is formed on the upper surface of the planarized interlayer insulating film 133, followed by forming a wiring trench having a high upper surface of the wiring by using a resist pattern such that the upper surface of the plug buried between the adjacent plug/wiring 110 on both sides is exposed to the outside.

Figure 32F:
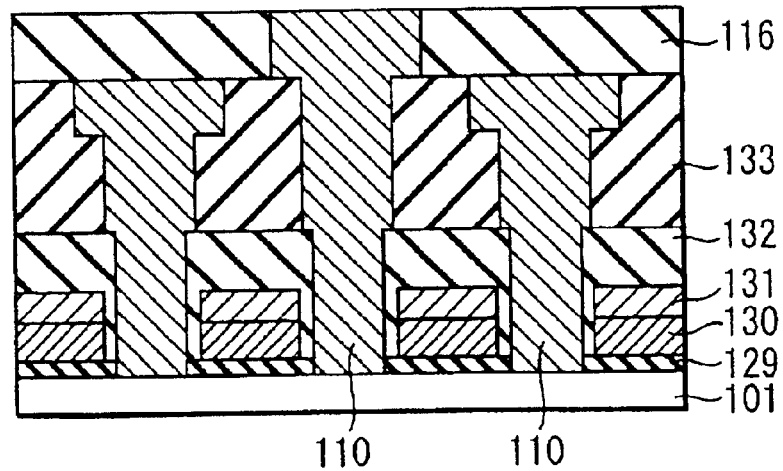

Further, a metal layer is buried in the wiring trench having a high upper surface of the wiring so as to form the plug/wiring 110, in the central portion followed by planarizing the surface as shown in FIG. 32F so as to form a single layer damascene wiring having a decreased inter-wiring parasitic capacitance and connected to the source-drain diffusion layers formed in a surface region of the silicon substrate.

For forming the plug or the plug/wiring 110, it is possible to use a pure metal such as polysilicon, Cu, W, Al, Ag or Au, alloys such as Al-Cu, Al-Si-Cu or WSi as well as other metal silicides. It is also possible to bury different metals in the plug and the wiring trench. The barrier metal film or the liner film (not shown) is selected appropriately depending on the material of the plug or the plug/wiring 110. For example, where the plug or the plug/wiring 110 is formed of Cu or Al-Cu, it is possible for the barrier metal film or the liner film to be formed of, for example, a Ti film, a Ti/TiN film, a TiN film, a TaN film or a Ta film. Also, where the plug or the plug/wiring 110 is formed of Al, it is possible for the barrier metal film or the liner film to be formed of, for example, a Nb film or a NbN film.

Also, in the twenty-seventh embodiment, it is possible to use an inorganic silicon oxide film, an organic silicon oxide film, low-k film and a $SiO_2$ film such as a TEOS oxide film in addition to the BPSG film as the interlayer insulating film 133. It is also possible to use an $SiO_2$ film an inorganic silicon oxide film or another low-k film in place of the organic silicon oxide film 116 formed on the interlayer insulating film 133. The organic silicon oxide film 116 and interlayer insulating film 133 may be formed of the same material film, for example, a silicon oxide film.

The low-k films having a particularly small value of the dielectric constant include, for example, an organic silicon oxide film such as a polysiloxane film or a benzocyclobutene film (BCB), an inorganic silicon oxide film such as a hydrogen-silsesque oxane film, and a CF-based organic silicon film such as a polyarylene ether film, a Parylene film or a polyimide fluoro polymer film.

Further, if the organic silicon oxide film 116 is covered again with the SOG film 107, followed by removing the organic silicon oxide film 116 so as to form an air-bridge wiring structure having a high upper surface, it is possible to further decrease markedly the inter-wiring parasitic capacitance, as described previously in conjunction with the twenty-fourth embodiment.

It should be noted that the wiring structures shown in FIGS. 25A to 25C, 26A to 26C and descriptions in the first and second modifications of the twenty-second embodiment also apply to the wiring structure shown in FIG. 32F.

Figure 33A:
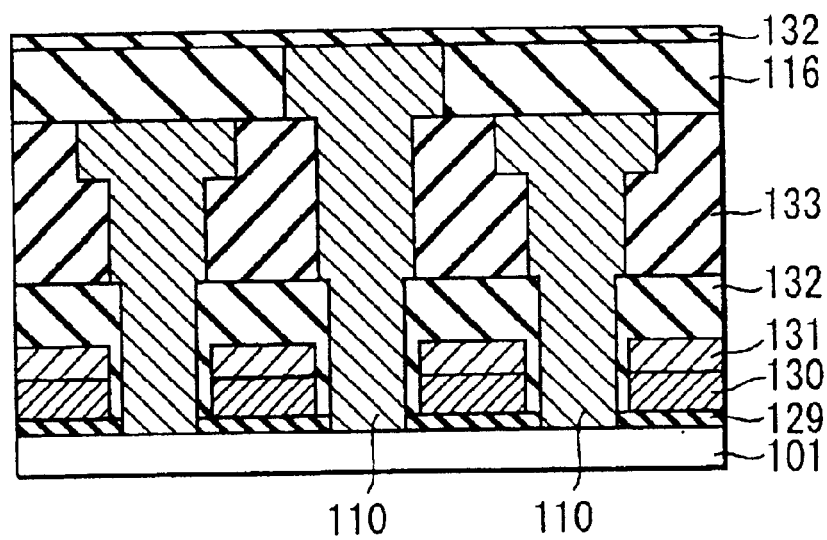
FIGS. 33A and 33B are cross sectional views showing a method of manufacturing a semiconductor device according to a modification of the twenty-seventh embodiment.

Specifically, when the wiring structure of this embodiment is applied to form a multi-layered wiring structure, the organic silicon film 116 is preferably covered with an SiN film (or an SiC film) 132 again, as shown in FIG. 33A according to a modification of this embodiment.

Figure 33B:
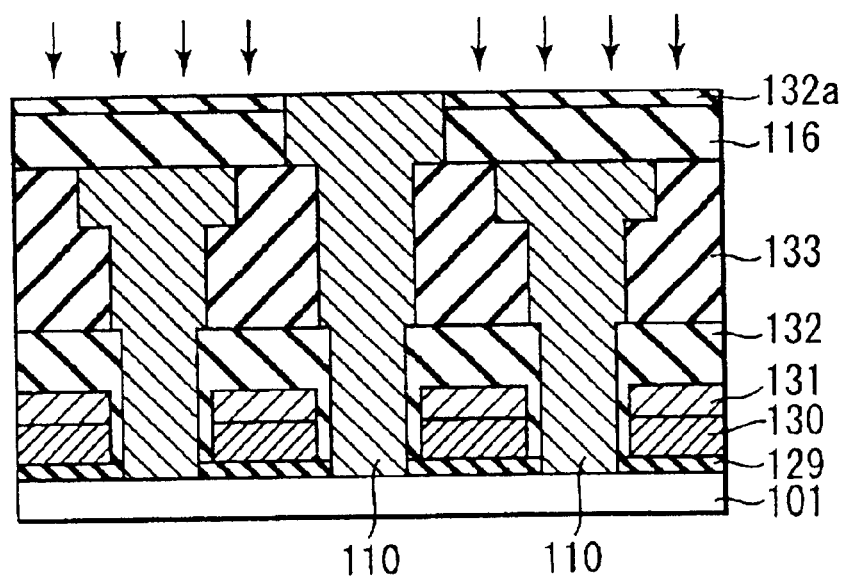

At this time, organic silicon nitride film 132a being changed from organic silicon oxide film by introducing nitrogen on the surface of the organic silicon oxide film may be used instead of the SiN film 132 as shown in FIG. 33B. The SiN film (or the SiC film) 132 or the organic silicon nitride film 132a is useful as a substrate for forming upper layer wiring structure or is useful as a passivation film.

What should also be noted is that, since it is possible to form a SAC by using the organic silicon oxide film 116 in place of the interlayer insulating film 133, it is possible to use an organic silicon oxide film for forming the entire interlayer insulating film surrounding the single layer damascene wiring having a difference in height on the upper surface of the wiring, as described previously in conjunction with the sixteenth embodiment. In this case, it is possible to use an inorganic silicon oxide film or another low-k film in place of the organic silicon oxide film, as described previously in conjunction with the twenty-fifth embodiment. Further, it is possible to decrease markedly the inter-wiring parasitic capacitance by removing the entire interlayer insulating film surrounding the single layer damascene wiring having a difference in height provided in the upper surface of the wiring.

If the twenty-second to the twenty-sixth embodiments are combined with the twenty-seventh embodiment, many wiring structures improving the performance of semiconductor devices are possible to form.

<Twenty-eighth embodiment>

Figure 34A:
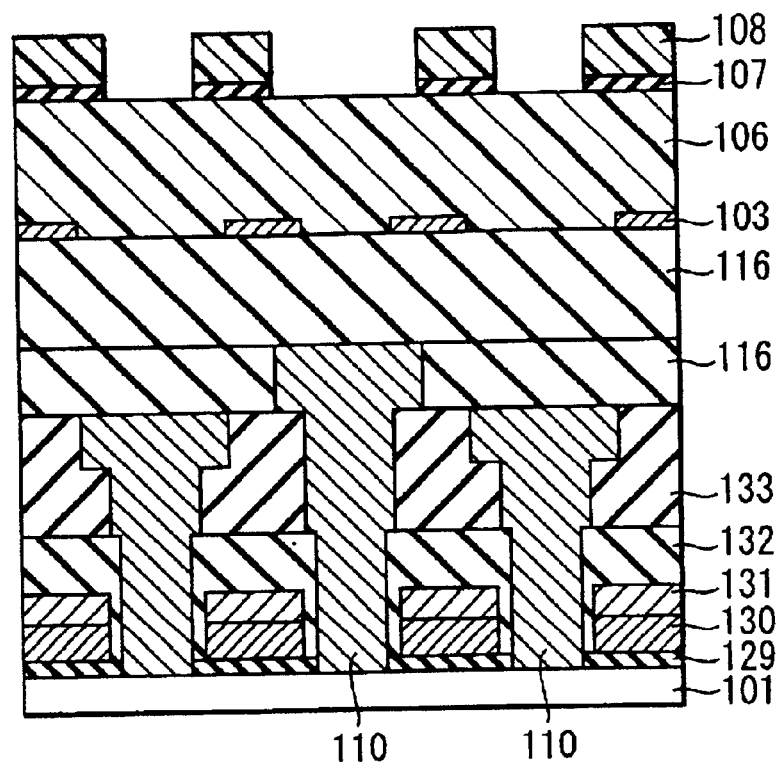
FIGS. 34A to 34C are cross sectional views collectively showing a method of manufacturing a semiconductor device according to a twenty-eighth embodiment of the present invention.

A twenty-eighth embodiment of the present invention will now be described with reference to FIGS. 34A to 34C. This embodiment is directed to a method of forming a damascene wiring of a two-layer structure having a difference in height provided in the upper surface of the wiring on a single layer damascene wiring having a difference in height provided in the upper surface of the wiring.

In the twenty-seventh embodiment, an organic silicon oxide film is deposited to form the interlayer insulating film 116 on the upper surface of the single layer damascene wiring after the process shown in FIG. 32F. Then, the interlayer insulating film 116 is planarized, followed by depositing an organic silicon oxide film in the twenty-eighth embodiment so as to form the interlayer insulating film 116 as shown in FIG. 34A.

In the next step, a first mask (a hard mask) consisting of a polysilicon film 103 is formed on the upper surface of the interlayer insulating film 116, followed by forming the resist film 106 on the polysilicon film 103 and subsequently forming a second mask consisting of the SOG film 107 on the resist film 106. The SOG film 107 formed on the resist film 106 is patterned by using the resist film 108. The interlayer insulating film may be formed of an $SiO_2$ film.

Figure 34B:
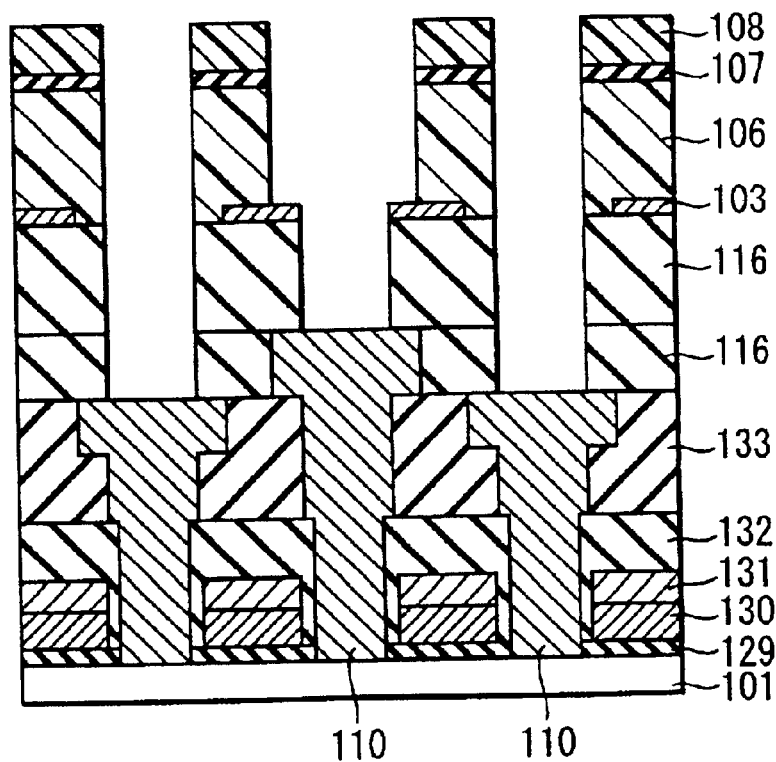

In the next step, the interlayer insulating film 116 and the resist film 106 formed on the interlayer insulating film 116 are continuously etched by using the first and second masks as shown FIG. 34B. In this case, a difference in the etching depth required for the etched region to reach the upper surface of the lower wiring layer is generated because there is a difference in height in the upper surface of the lower wiring layer. However, since the upper surface of the lower wiring layer performs the function of an etching stopper, it is possible to form a contact hole extending to reach the upper surface of the lower wiring layer with a high reproducibility.

At this time, the resist film 106 is etched in the initial stage with the resist pattern 108 used as a mask. However, since the resist pattern 108 is etched away during the etching treatment, the resist film 106 is etched finally with the SOG film 107 used as a mask. Then, the interlayer insulating film 116 is selectively etched with the SOG film 107 and the resist film 106 used as a mask. However, since the SOG film 107 is etched away during the subsequent etching treatment, the interlayer insulating film 116 is etched finally with the polysilicon film 103 used as a mask. FIG. 34C is a cross sectional view showing the state in this stage.

Figure 34C:
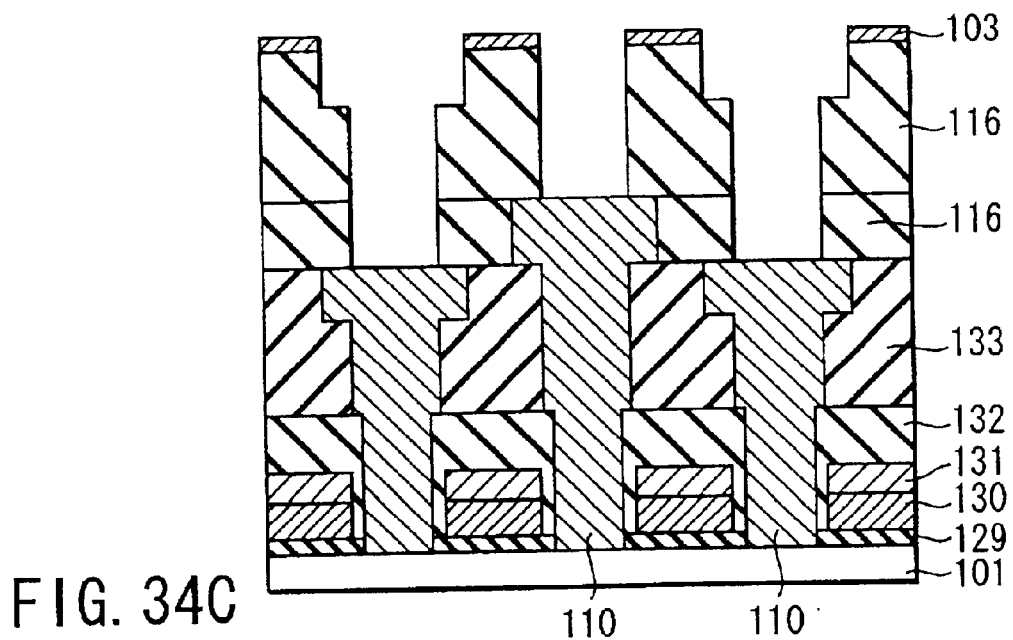

After removing the polysilicon film 103, second layer metal materials are buried in the contact hole and the wiring trench shown in FIG. 34C, followed by carrying out the process shown in FIG. 32F described previously in conjunction with the twenty-seventh embodiment so as to form a two-layered damascene wiring structure having a difference in height provided in the upper surface of the wiring. If a low-k film material or the like is used in this case as the material of the interlayer insulating film, it is possible to decrease the inter-wiring parasitic capacitance. Also, the inter-wiring parasitic capacitance can be further decreased, if the upper surface of the second layer damascene wiring having a difference in height and provided in the upper surface of the wiring is covered again with an SiN film or an SiC film, followed by removing the material of the interlayer insulating film.

The SiN or SiC film covering the upper surface of the second layer damascene wiring plays a role of the supporting substrate in further forming the upper wiring layer, as well as a role of a passivation film.

<Twenty-ninth embodiment>

A twenty-ninth embodiment of the present invention will now be described with reference to FIGS. 35 to 38. This embodiment is directed to the case where the wiring structure described previously in conjunction with the twenty-second to twenty-eighth embodiments is applied to the formation of a multi-layered wiring of a semiconductor device.

Figure 35:
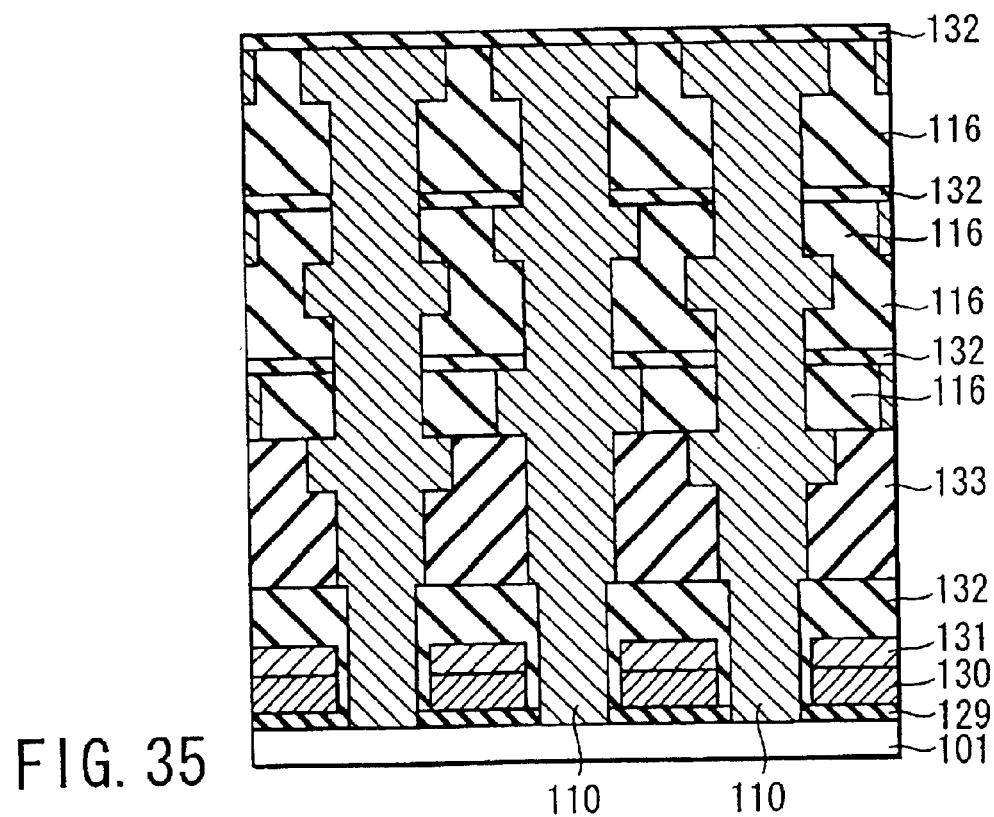
FIGS. 35 to 38 are cross sectional views collectively showing the construction of a semiconductor device according to a twenty-ninth embodiment.

FIG. 35 is a cross sectional view showing the three-layered damascene wiring structure connected in a self-aligned fashion to the source-drain regions (not shown) of a MOS transistor formed on a silicon substrate. The same reference numerals used for those portions of FIG. 35 which correspond to the twenty-seventh and twenty-eighth embodiments so as to avoid an overlapping description.

The wiring structure shown in FIG. 35 comprises a first layer wiring connected in a self-aligned fashion between the polyside gate electrode and having a difference in height provided in the upper surface of the wiring, a second layer wiring formed on the first layer wiring with the SiN or SiC film 132 interposed therebetween and having a difference in height provided in the upper surface of the wiring, a third layer wiring formed on the second layer wiring with the SiN or SiC film 132 interposed therebetween and having a flat wiring surface, and the SiN or SiC film 132 covering the flat upper surface of the multi-layered wiring.

The SiN or SiC film 132 plays the role of avoiding the contamination of the interlayer with a heavy metal and the role of the supporting substrate in the case where the lower layer wiring is formed into an air-bridge wiring structure. If such roles need not be played, it is possible to omit the SiN or SiC film 132 so as to simplify the manufacturing process. Also, it is possible to add easily the barrier metal film and the liner film covering the metal material buried as the plug or the plug/wiring, if it is necessary to do so.

Also, in the wiring structure shown in FIG. 35, it is possible to derive easily from the description given previously in conjunction with the twenty-eighth embodiment the method of aligning the upper surface of the upper wiring layer in the same height when there is a difference in height provided in the upper surface of the lower wiring layer.

As described above, if the wiring structure having a difference in height is employed in the lower wiring layer in order to decrease the inter-wiring parasitic capacitance of the particularly fine lower wiring layer, and if the height of the uppermost thick wiring, which is small in the problem of the signal delay caused by the inter-wiring parasitic capacitance, is aligned in the same height so as to assure the flatness of the chip, it is possible to assure the passivation of the chip so as to improve the reliability of the semiconductor device.

Figure 36:
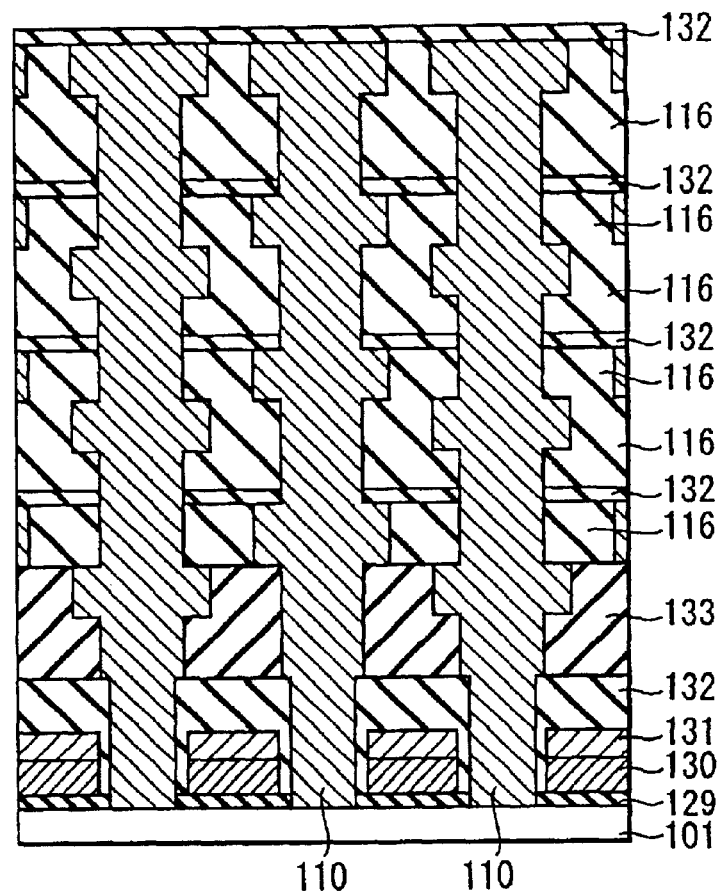
Figure 40:
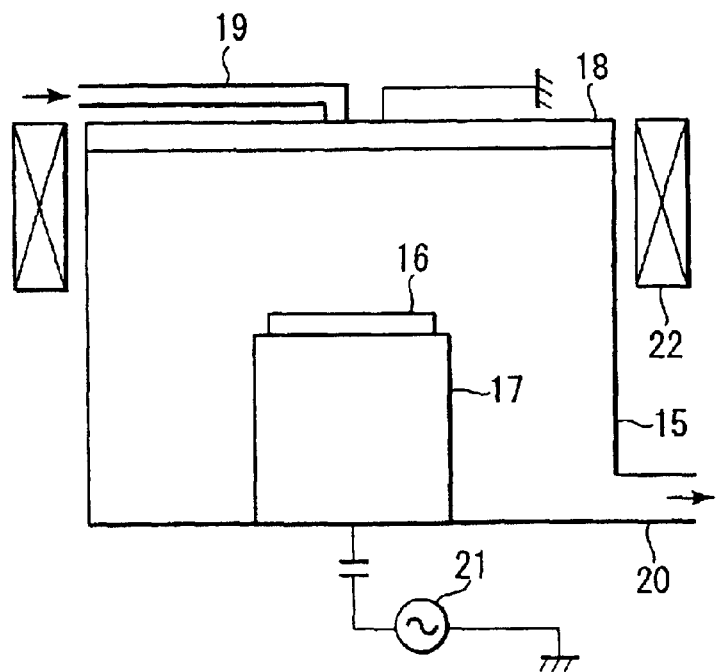
FIG. 40 is a diagram showing a dry etching apparatus for use in the manufacturing method of semiconductor devices according to a thirty-first embodiment.

FIG. 36 exemplifies a four-layered wiring structure prepared by introducing an additional single layer having a difference in height into the lower wiring shown in FIG. 35. As shown in FIG. 36, the four-layered wiring structure can be easily realized by simply repeating the forming process of the lower wiring shown in FIG. 35. Needless to say, a multi-layered wiring structure including an optional number of layers can be formed similarly.

Figure 37:
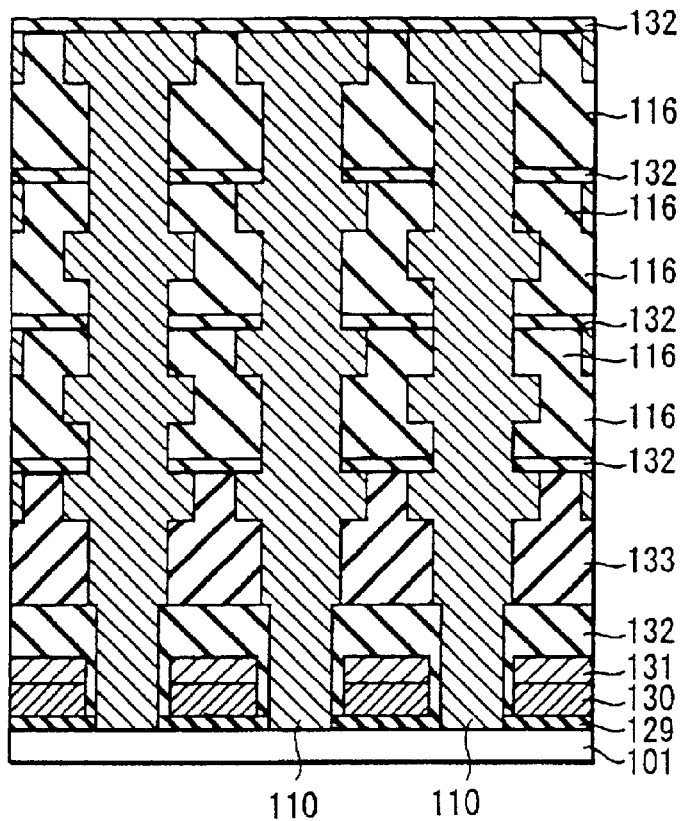

FIG. 37 exemplifies a four-layered wiring structure aligning the upper surfaces of the uppermost and lowermost wiring layers and introducing additional intermediate wiring layers having a difference in height provided in the upper surfaces.

Also, it is possible to derive easily from these results the structure in which a difference in height is provided in the upper surface of a predetermined layer of the wiring structure, said predetermined layer giving rise to a serious problem of the signal delay caused by the inter-wiring parasitic capacitance.

Figure 38:
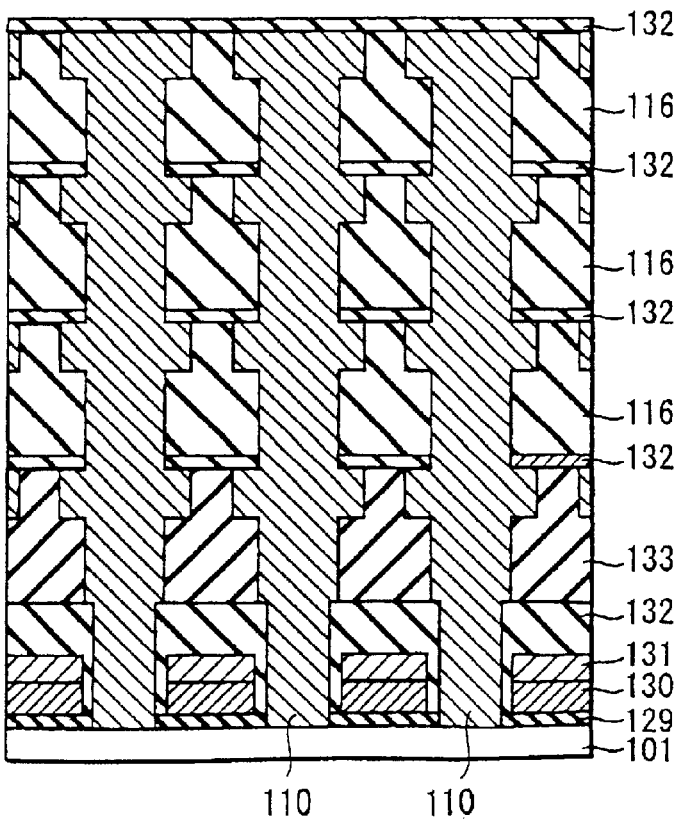

FIG. 38 shows a four-layered damascene wiring in which each of the wiring layers is of a wiring structure free from a difference in height. Because of the particular construction, the multi-layered wiring shown in FIG. 38 has an inter-wiring parasitic capacitance larger than that of the wiring structure shown in each of FIGS. 36 and 37. However, it is possible to decrease the inter-wiring parasitic capacitance of the multi-layered wiring structure shown in FIG. 38 by using a low-k film for forming the interlayer insulating film or by partially introducing an air-bridge wiring structure into the wiring structure shown in FIG. 38. In this case, the manufacturing process can be simplified so as to reduce the manufacturing cost.

The wiring structure of the present invention is not limited to those according to the twenty-second to twenty-ninth embodiments described above. For example, in each of the embodiments referred to above, a silicon substrate is used as the semiconductor substrate. However, it is also possible to use an SOI substrate in order to further decrease the parasitic capacitance. Further, it is possible to use a SiGe substrate for coping with the further improvement in the transmitting speed of the signal.

The wiring structures shown in FIGS. 25A to 25C, 26A to 26C and descriptions in the first and second modifications of the twenty-second embodiment also apply to the multi-layered wiring structures shown in FIGS. 35 to 38. Needless to say, the multi-layered wiring structures described above can be extended to have an arbitrary number of wiring layers.

<Thirtieth embodiment>

FIGS. 39A to 39D are plan views collectively showing various layouts of wiring structures on VLSI chips 101 according to a thirtieth embodiment where the multi-layered wiring structures described in the twenty-ninth embodiment are applied to the formation of respective layouts of the wiring structures.

Each of the wiring structures shown in FIGS. 35 to 38 is directed to show the case where the wiring layers having a difference in height and low inter-wiring coupling capacitance are introduced into the lower wiring layers in the multi-layered wiring structure. However, it is also possible to form the wiring layers of low inter-wiring coupling capacitance in some specific regions on the VLSI chip, thereby to form very high speed functional blocks. Various combination of regions where any one of the multi-layered wiring structures shown in FIGS. 35 to 38 is introduced on the surface of the VLSI chip will now be described in this embodiment.

Figure 39A:
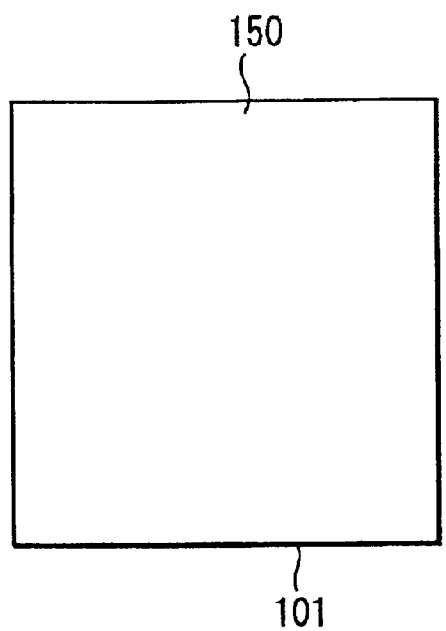
FIGS. 39A to 39D are plan views showing various wiring layouts on VLSI chips according to a thirtieth embodiment.

FIG. 39A show the simplest case where any one of the multi-layered wiring structures shown in FIGS. 35 to 38 is introduced into the entire region 150 of the VLSI chip 101. That is, all the circuits of the VLSI chip are formed by using the same multi-layered wring structure. In this case, the requirement of high-speed circuit operation is met only by optionally selecting wiring layers having a difference in height among the layers constituting the multi-layered wiring structure.

Figure 39B:
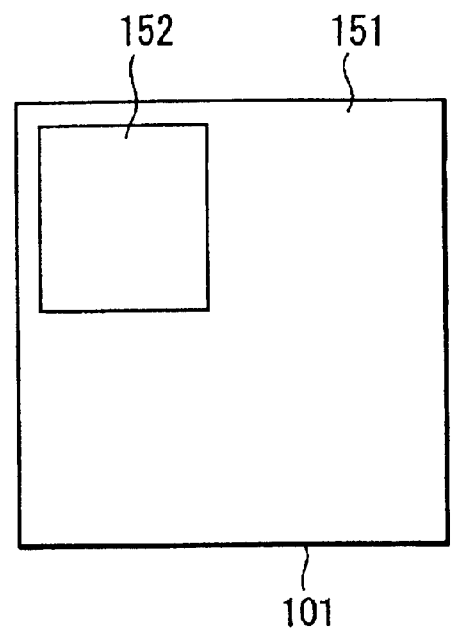

FIG. 39B shows the case where any one of the multi-layered wiring structures shown in FIGS. 35 to 37 is formed in the region 152 and the multi-layered wiring structure shown in FIG. 38 is formed in the remaining region 151 of the VLSI chip 101.

It is very important to reduce parasitic capacitance of bit lines so as to realize high-speed operation of a semiconductor memory. For example, a high speed cache memory is preferably formed in the region 152 by using the multi-layered wiring structure shown in FIG. 35 or FIG. 36 so as to largely reduce parasitic capacitance of the bit lines owing to the difference in height between adjacent bit line pairs. A main memory of high memory capacity is formed in the remaining region 151 by using the multi-layered wiring structure shown in FIG. 38.

Because wiring structures shown in FIGS. 35 to 38 are compatible each other in the manufacturing process, a high-speed memory system on a single chip is thus realized easily. Needless to say, the functional blocks formed in the regions 151 and 152 are not limited to the main memory and cache memory. Any one of the functional blocks may be formed by using any one of the multi-layered wiring structures shown in FIGS. 35 to 38 so as to realize a high-speed system on a single chip.

Figure 39C:
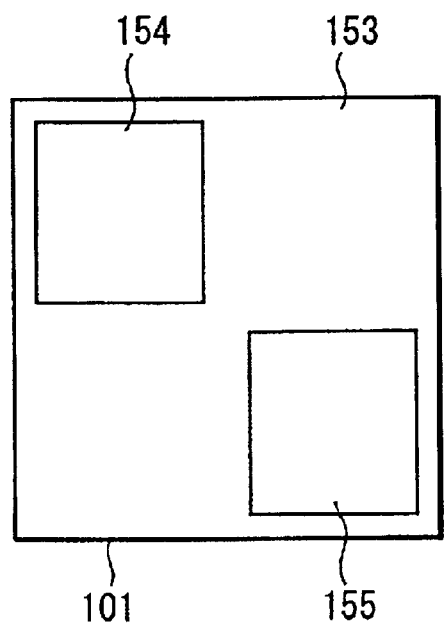

FIG. 39C shows the case where any one of the multi-layered wiring structures shown in FIGS. 35 to 37 is formed in the regions 154 and 155 and the multi-layered wiring structure shown in FIG. 38 is formed in the remaining region 153 of the VLSI chip 101.

For example, a CPU and a high-speed cache memory is preferably formed in the regions 154 and 155, respectively, and a main memory of high memory capacity is formed in the remaining region 153. Any one of the functional blocks may be formed by using any one of the multi-layered wiring structures shown in FIGS. 35 to 38, thereby to realize a high-speed processing system on a single chip.

Figure 39D:
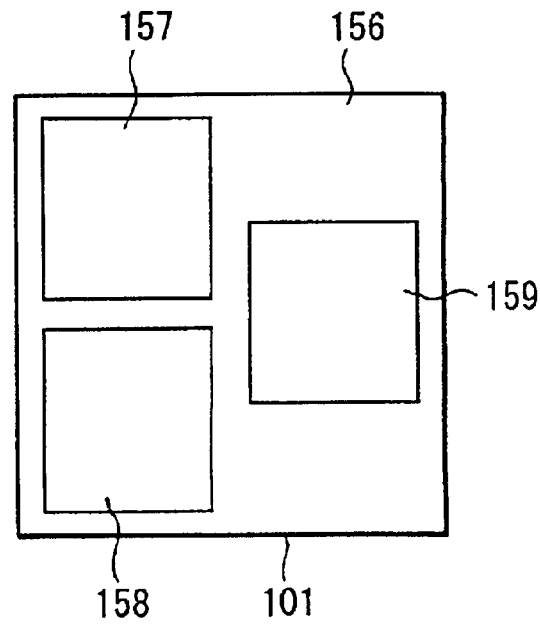

FIG. 39D shows the case where any one of the multi-layered wiring structures shown in FIGS. 35 to 37 is formed in the regions 157, 158 and 159 and the multi-layered wiring structure shown in FIG. 38 is formed in the remaining region 156 of the VLSI chip 101.

For example, an ALU, a high-speed functional block such as a parallel multiplier, and a high-speed memory is preferably formed in the regions 157, 158 and 159, respectively, and peripheral circuits are formed in the remaining region 156. Needless to say, any one of the functional blocks may be formed in the regions 157, 158 and 159 by using any one of the multi-layered wiring structures shown in FIGS. 35 to 38.

<Thirty-first embodiment>

The structure of a dry etching machine to perform the RIE and the ashing step in each embodiment is shown in FIG. 34. The dry etching machine incorporates a vacuum chamber 15, a subject 16 such as silicon wafer, which must be processed, a retaining frame 17 on which the subject 16 is placed, an opposite electrode 18, a gas introducing pipe 19, an exhaust opening 20, a high-frequency-wave source 21 and a magnet 22.

The retaining frame 17 has a regulating mechanism to be capable of controlling the temperature of the subject 16 which must be processed. The gas introducing pipe 19 is connected to the upper inner wall of the vacuum chamber 15 serving as the opposite electrode 18. Gas is introduced into the vacuum chamber 15 through the gas introducing pipe 19. The valve at the exhaust opening 20 is operated to adjust the pressure.

After the pressure has been stabilized, high frequency waves are applied from the high-frequency-wave source 21 under the retaining frame 17 so that plasma is generated in the vacuum chamber 15. The magnet 22 is joined to the vacuum chamber 15 to form a dense magnetic field in the vacuum. Simultaneously, an anisotropic characteristic is imparted to ions in the plasma to etch the subject 16 which must be processed.

The dry etching machine shown in FIG. 29 is a magnetron RIE machine. Alternatively, another dry etching machine may be employed which is exemplified by a machine using ECR (Electron Cycloton Resonance), helicon or inductance-coupled-type plasma.

Finally, a method of forming an organic silicon film by performing a coating step using polysilane and the like will now be described. Initially, an organic silicon compound (generally called "organic silicon" in the claims) having the main chains, which are bondings of silicon and silicon, is dissolved in organic solvent so that material of the solution is prepared.

The organic silicon compound, having the main chains which are bondings of silicon, and silicon are exemplified by polysilane expressed by a general formula $(SiR_{11}R_{12})$, where R11 and R12 are each a hydrogen atom or substituted or non-substituted aliphatic hydrocarbon or aromatic hydrocarbon or the like having 1 to 20 carbon atoms.

Polysilane may be in the form of a single polymer resist a copolymer. Alternatively, polysilane may have a structure that two or more types of polysilane materials are bonded to one another through an oxygen atom, a nitrogen atom, a fatty acid group or an aromatic group. The organic silicon compound is exemplified by the following chemical formulas [1-1] to [1-114]:

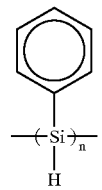
[1-1]

[1-2]

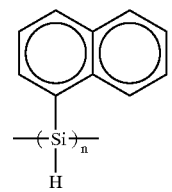
[1-3]

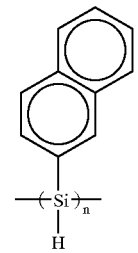
[1-4]

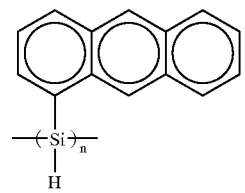
[1-5]

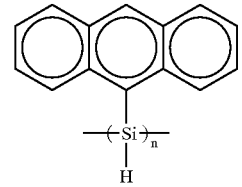
[1-6]

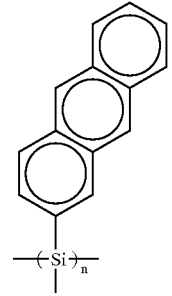
[1-7]

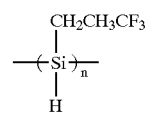
[1-8]

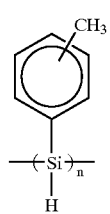 [1-9]
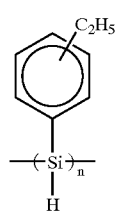 [1-10]
 [1-11]
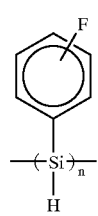 [1-12]
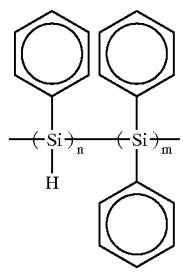 [1-13]
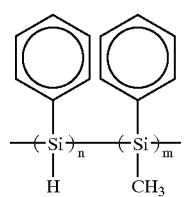 [1-14]
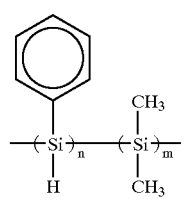 [1-15]
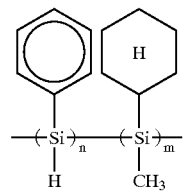 [1-16]
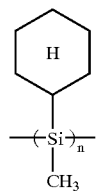 [1-17]
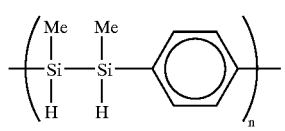 [1-18]
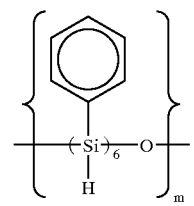 [1-19]
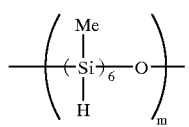 [1-20]
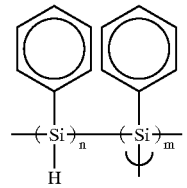 [1-21]
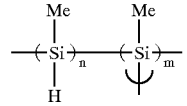 [1-22]
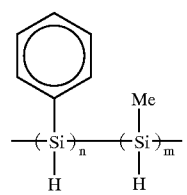 [1-23]

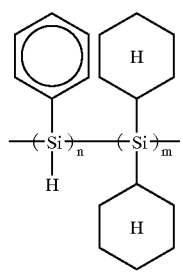
[1-24]
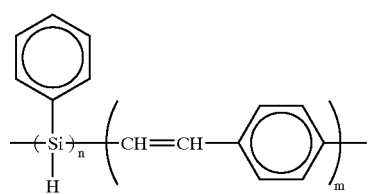
[1-25]
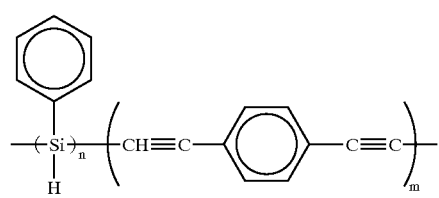
[1-26]
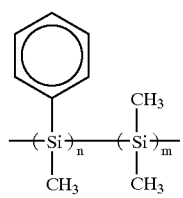
[1-27]
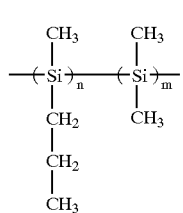
[1-28]
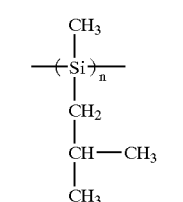
[1-29]
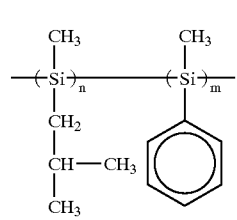
[1-30]
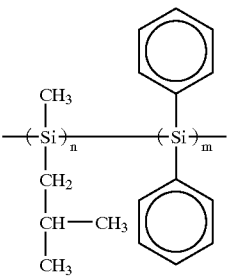
[1-31]
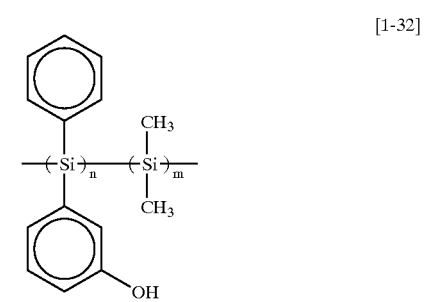
[1-32]
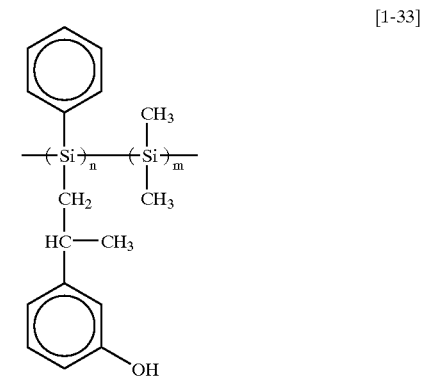
[1-33]
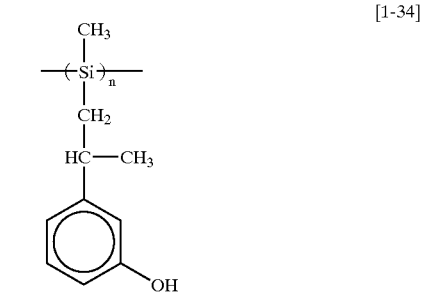
[1-34]
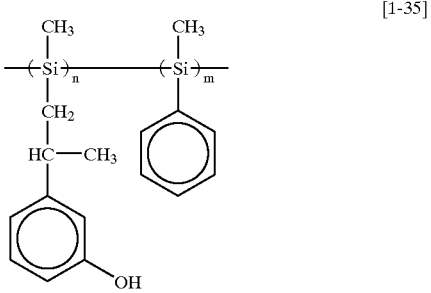
[1-35]

-continued

[1-36]

[1-37]

[1-38]

[1-39]

[1-40]

[1-41]

[1-42]

[1-43]

[1-44]

[1-45]

[1-46]

[1-47]

[1-48]

[1-49]

-continued
[1-50]
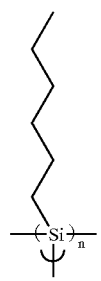
[1-51]
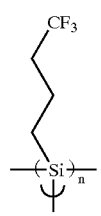
[1-52]
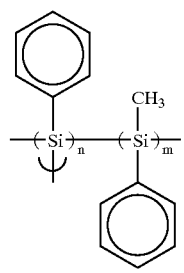
[1-53]
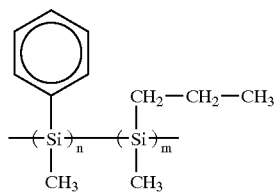
[1-54]
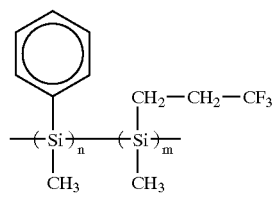
[1-55]
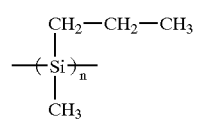
[1-56]
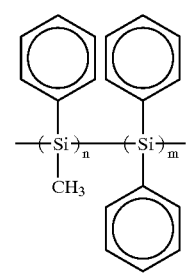
-continued
[1-57]
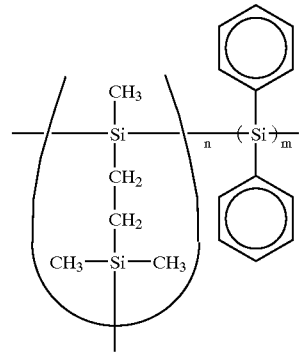
[1-58]
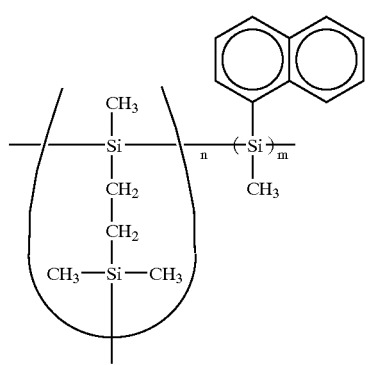
[1-59]
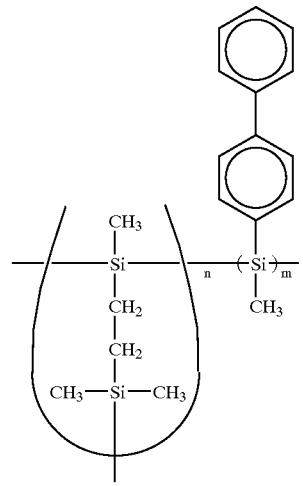
[1-60]
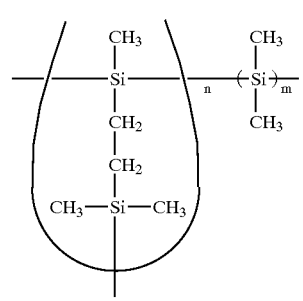

[1-61]
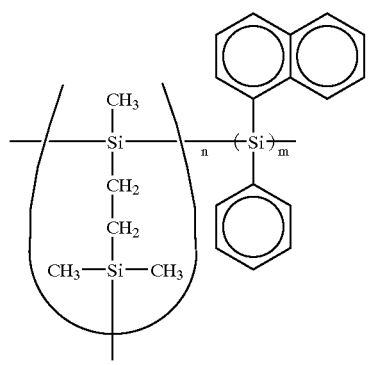
[1-62]
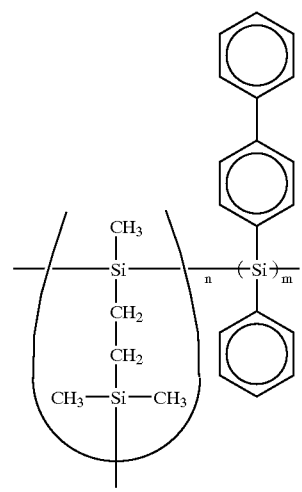
[1-63]
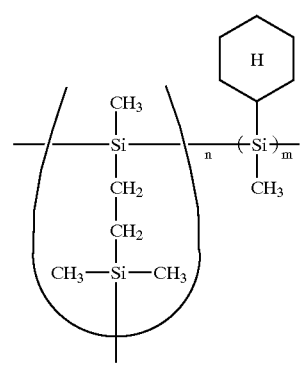
[1-64]
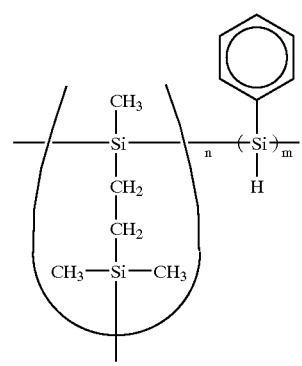
[1-65]
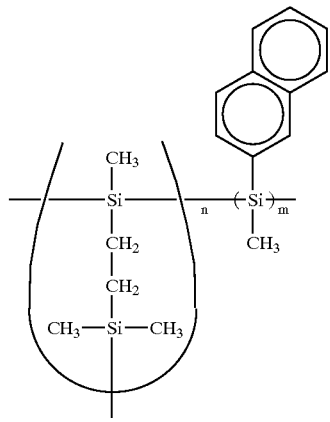
[1-66]
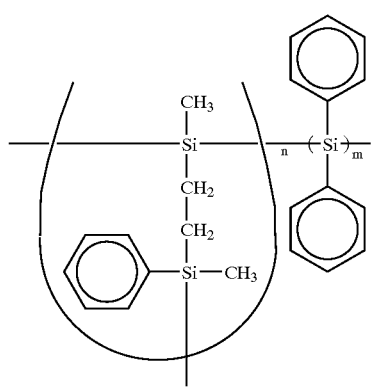
[1-67]
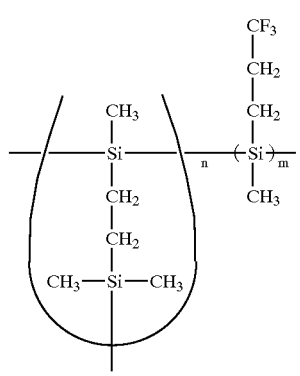
[1-68]
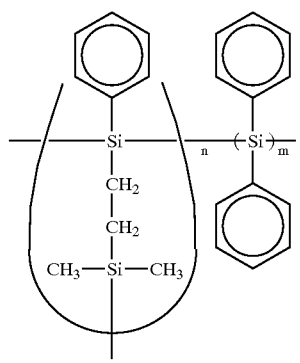

[1-69]
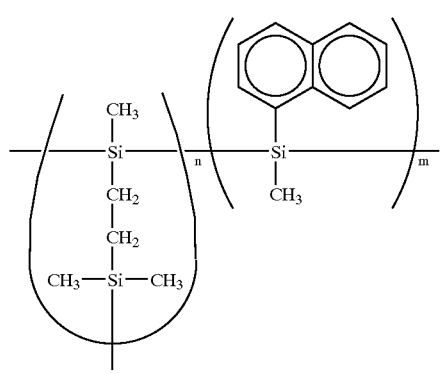
[1-70]
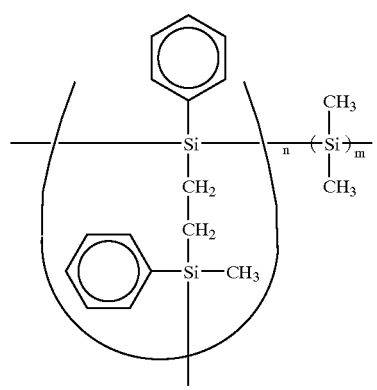
[1-71]
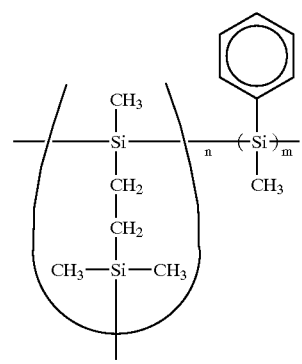
[1-72]
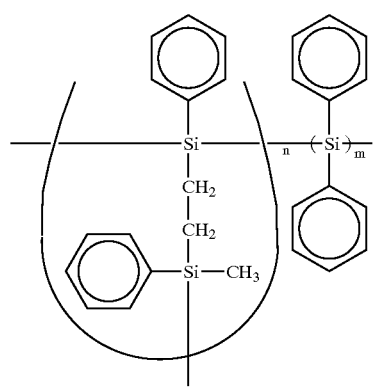
[1-73]
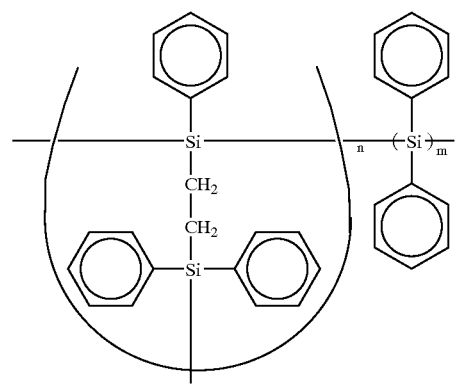
[1-74]
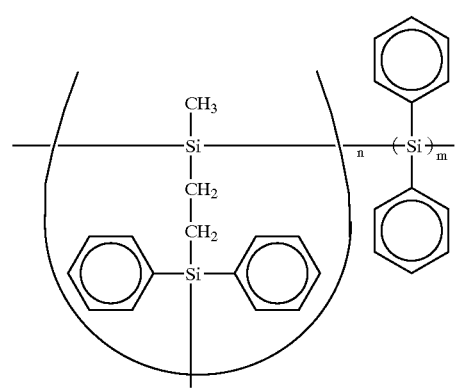
[1-75]
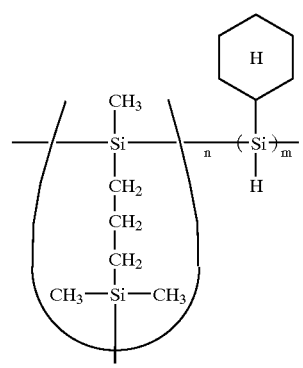
[1-76]
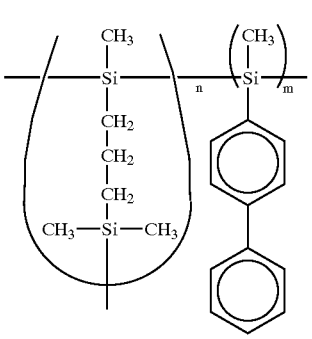

[1-77]
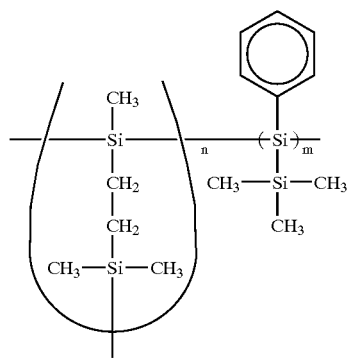
[1-78]
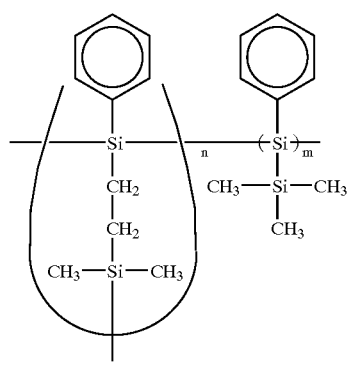
[1-79]
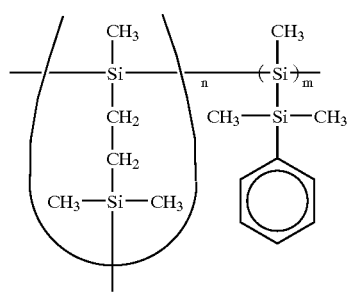
[1-80]
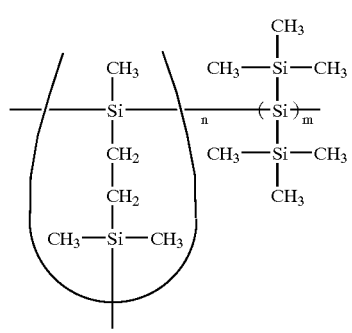
[1-81]
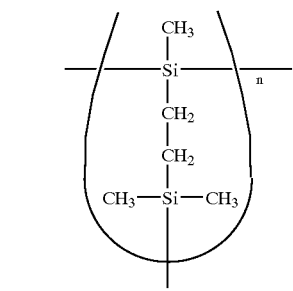
[1-82]
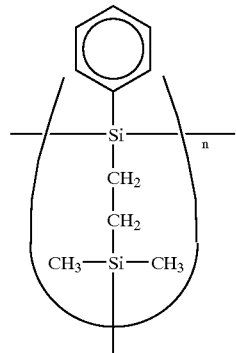
[1-83]
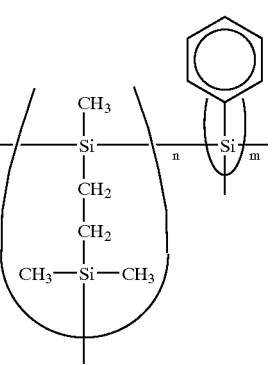
[1-84]
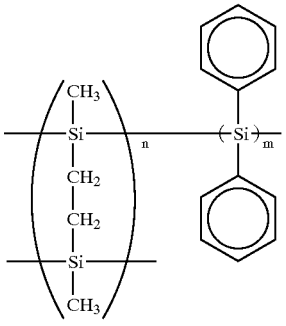
[1-85]
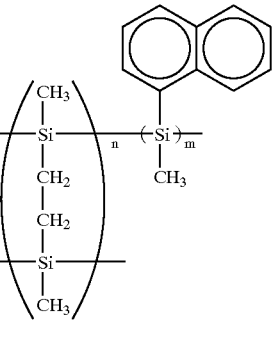

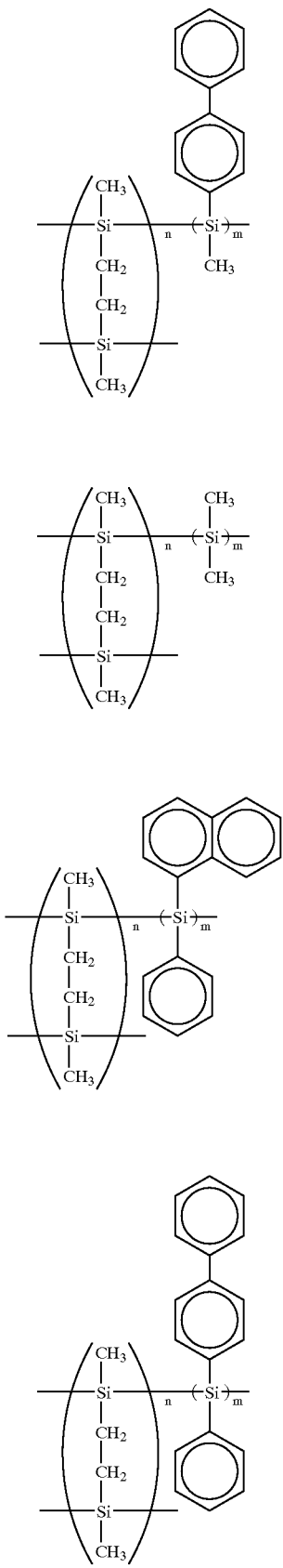
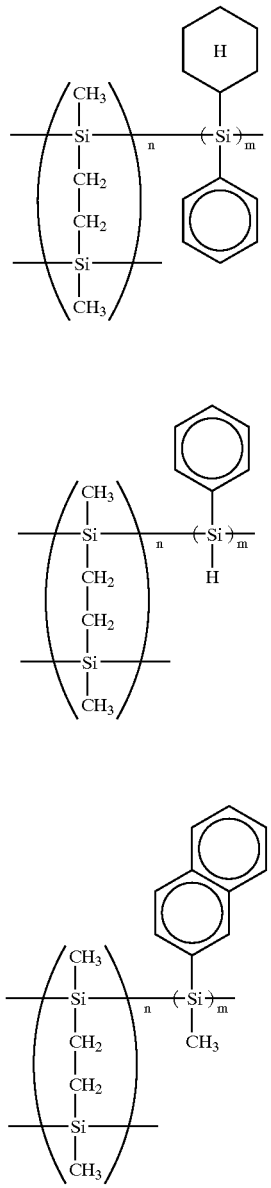
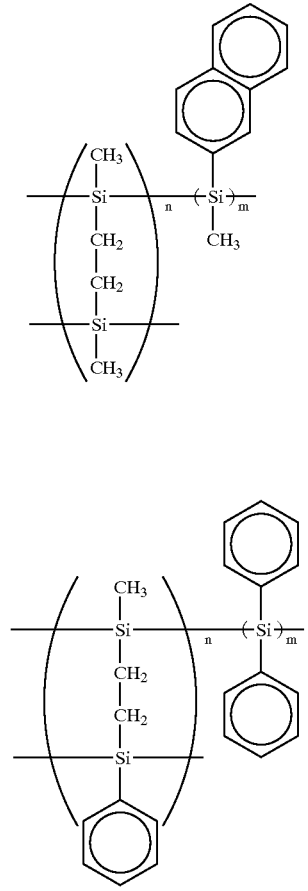

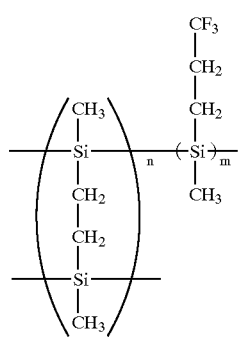
[1-94]
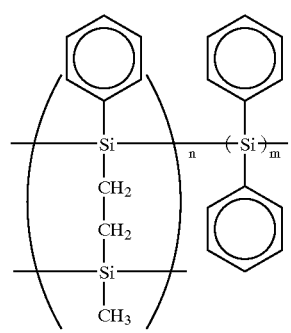
[1-95]
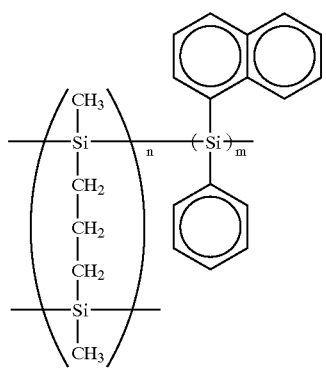
[1-96]
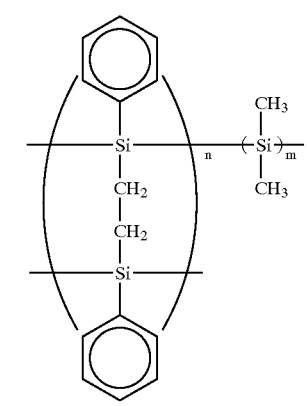
[1-97]
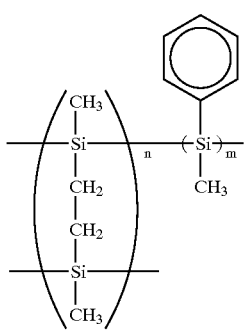
[1-98]
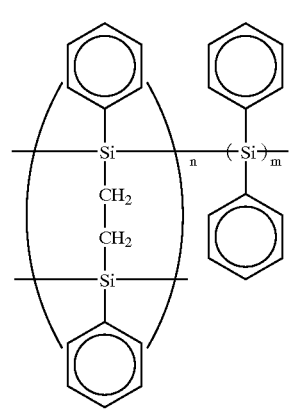
[1-99]
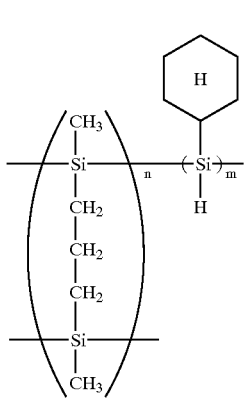
[1-100]
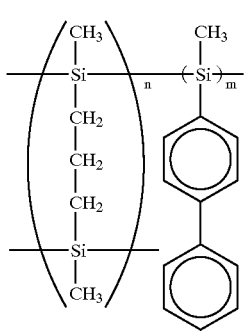
[1-101]

[1-102]
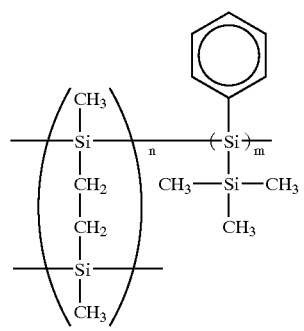
[1-103]
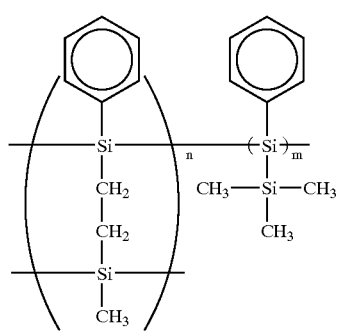
[1-104]
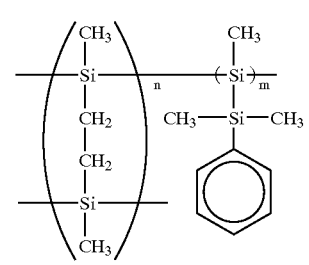
[1-105]
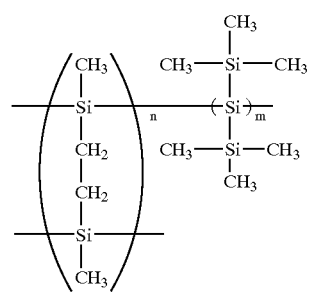
[1-106]
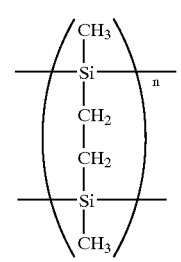
[1-107]
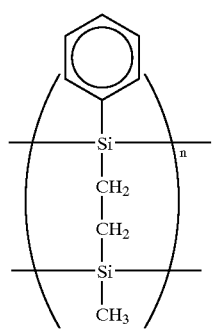
[1-108]
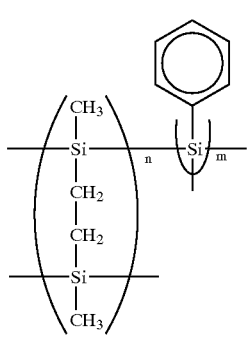
[1-109]
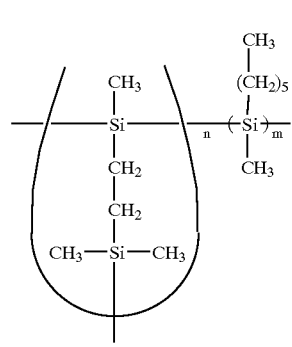
[1-110]
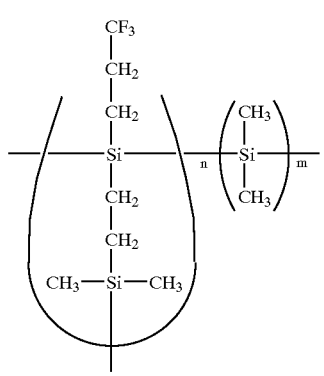

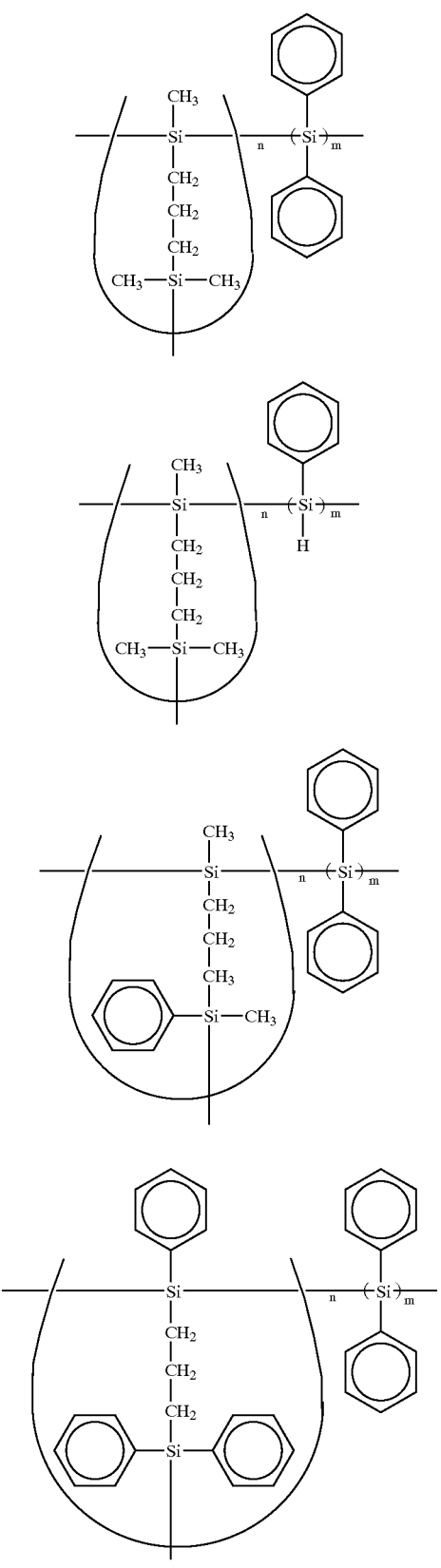

where m and n are positive integers.

Although the weight average molecular weight of each compound is not limited, it is preferable that a range from 200 to 100,000 is satisfied. The reason for this will now be described. If the molecular weight is smaller than 200, the organic silicon film is dissolved by the solvent for the resist. If the molecular weight is larger than 100,000, dissolution in organic selective cannot be satisfactorily performed. Thus, formation of the material of the solution cannot easily be performed.

The organic silicon compound is not limited to one type. A plurality of types of compounds may be mixed. To improve preservation stability if necessary, addition of the following materials is permitted: a thermal polarization inhibitor, an adhesion enhancing agent for improving adhesion to the silicon insulating film, ultraviolet absorbing dye that is effective to prevent reflected light from the silicon insulating film into the resist film, a polymer such as polysulfon or polybenzimidazole for absorbing ultraviolet rays, a substance showing conductivity owing to a conductive substance, light or heat or a crosslinking material for crosslinking the organic silicon compound.

The conductive substance is exemplified by organic sulfonic acid, organic carboxylic acid, polyalcohol, polythiol (for example, iodine or bromine), $SbF_5$, $PF_5$, $BF_5$ and $SnF_5$.

The substance showing conductivity owing to the energy of light or heat is exemplified by carbon cluster ($C_{60}$ or $C_{70}$), cyanoanthracene, dicyanoanthracene, triphenylpyryum, tetrafluoroborate, tetracyanoquinodimethane, tetracyanoethylene, futhalimidotriphrate, perchloropentacyclododecane, dicyanobenzen, benzotrynyl, trichloromethyltriazine, benzoilperoxide, benzophenon tetra carboxylic acid and t-butylperoxide. The substance is exemplified by the following compounds:

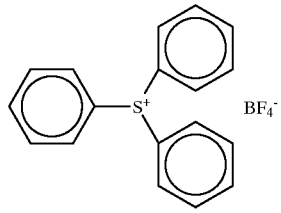

[2-1]

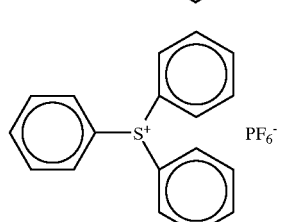

[2-2]

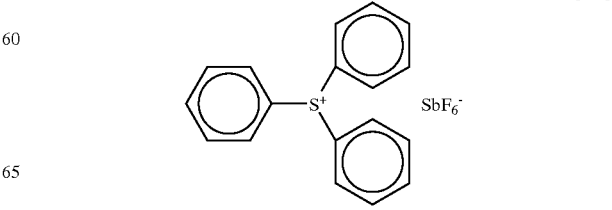

[2-3]

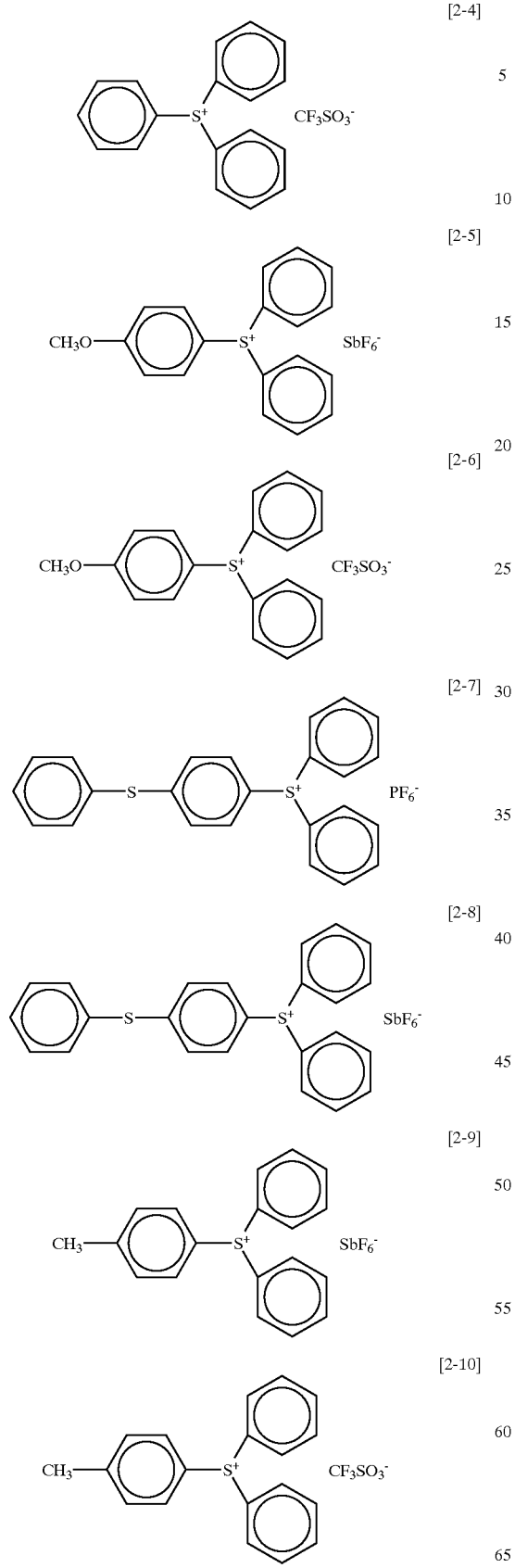
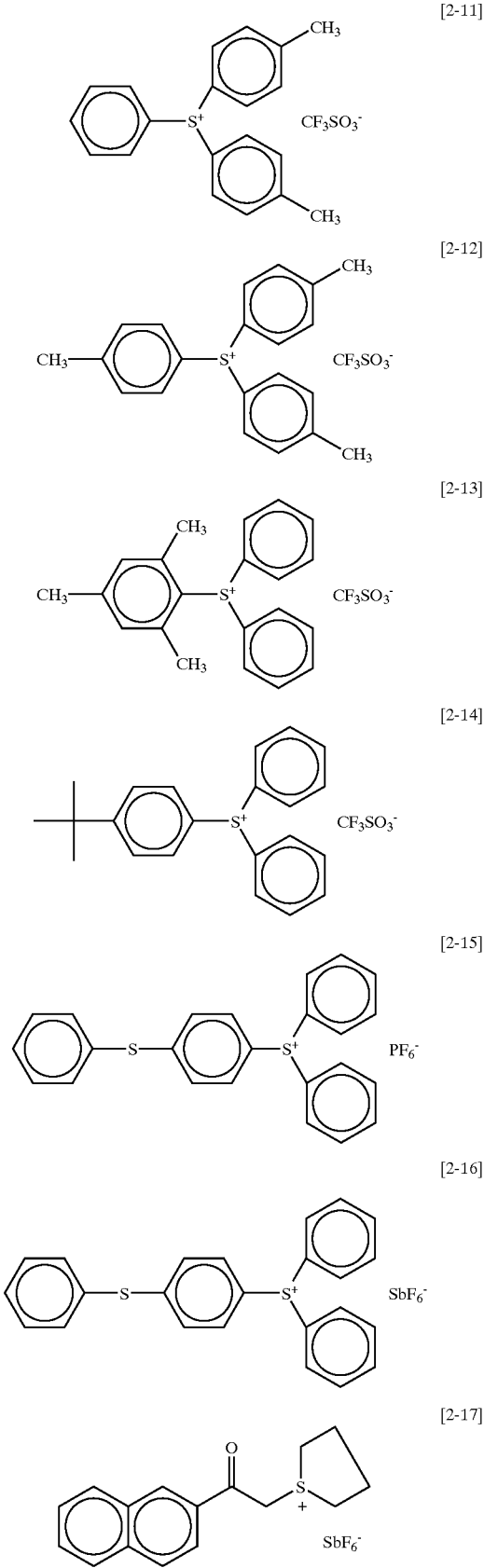

-continued
[2-18] 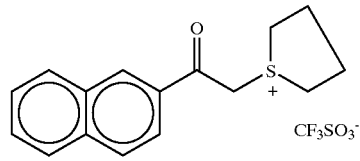
[2-19] 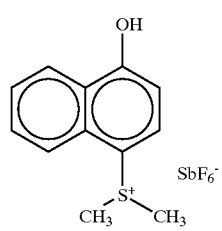
[2-20] 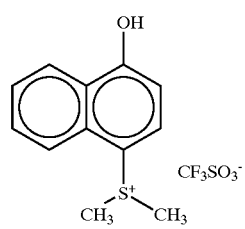
[2-21] 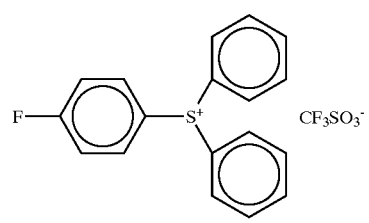
[2-22] 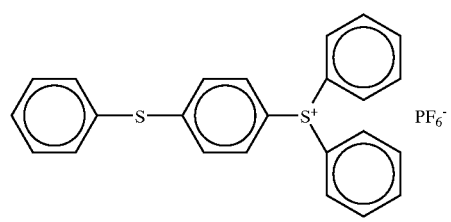
[2-23] 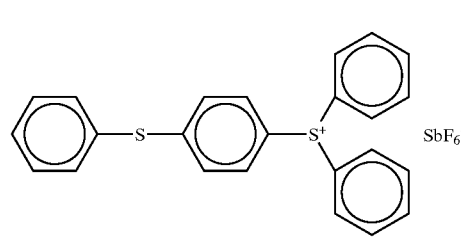
[2-24] 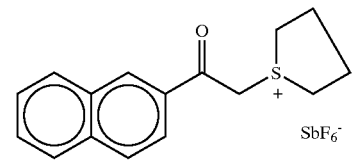
-continued
[2-25] 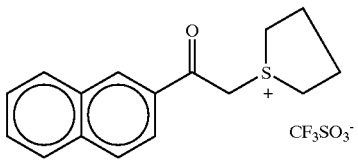
[2-26] 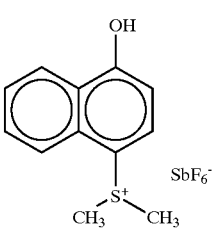
[2-27] 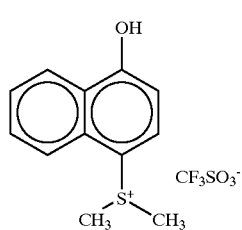
[2-28] 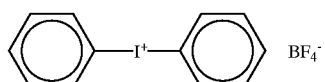
[2-29] 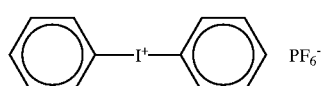
[2-30] 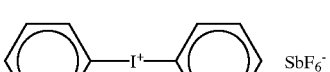
[2-31] 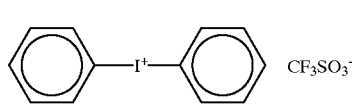
[2-32] 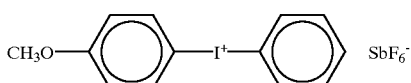
[2-33] 
[2-34] 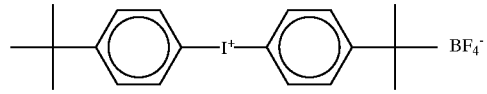
[2-35] 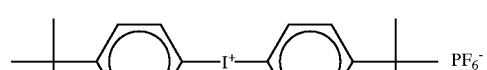
[2-36] 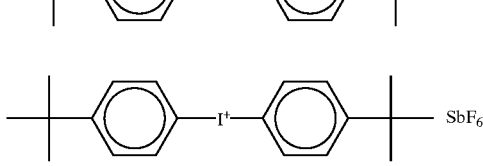

[2-37]
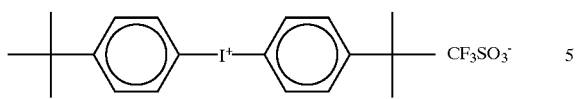
[2-38]
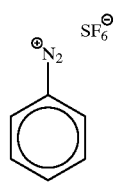
[2-39]
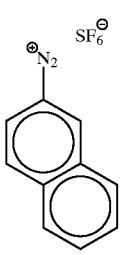
[2-40]
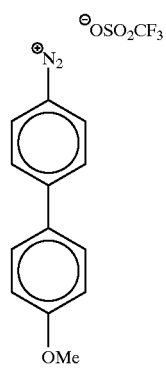
[2-41]
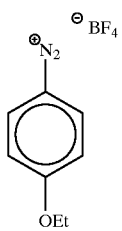
[2-42]
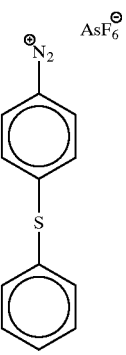
[2-43]
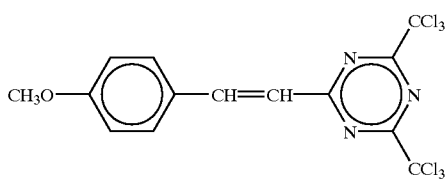
[2-44]
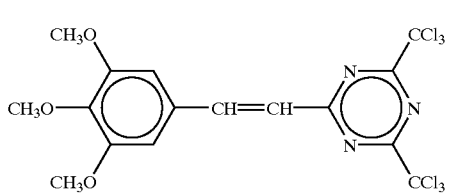
[2-45]
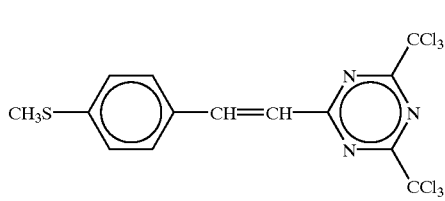
[2-46]
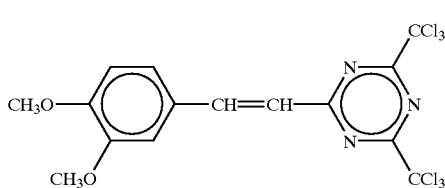
[2-47]
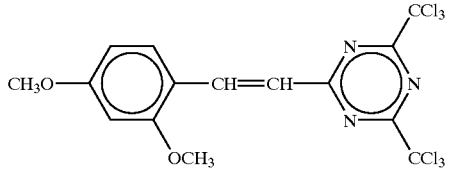
[2-48]
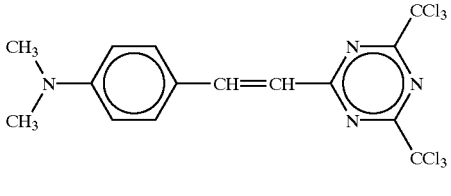
[2-49]
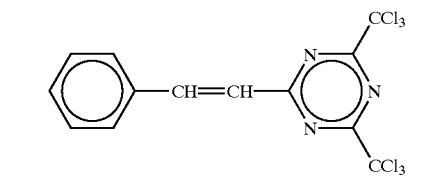
[2-50]
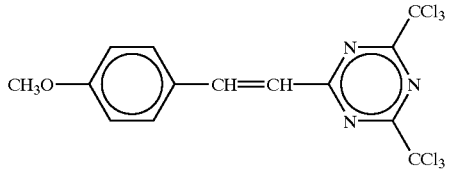

[2-51]
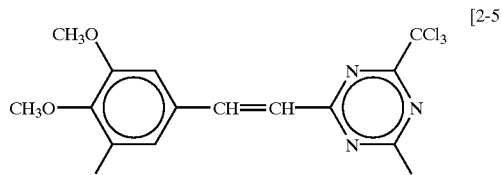
[2-52]
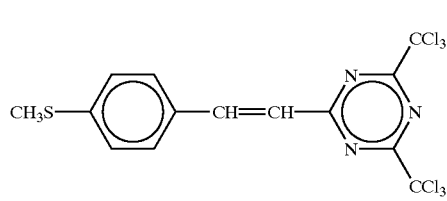
[2-53]
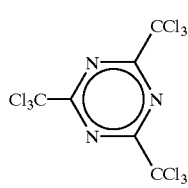
[2-54]
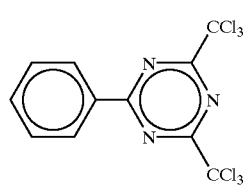
[2-55]
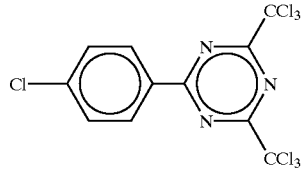
[2-56]
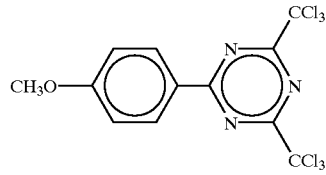
[2-57]
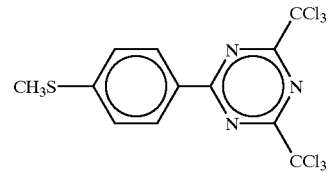
[2-58]
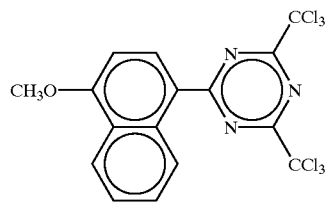
[2-59]
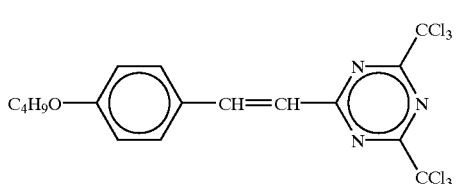
[2-60]
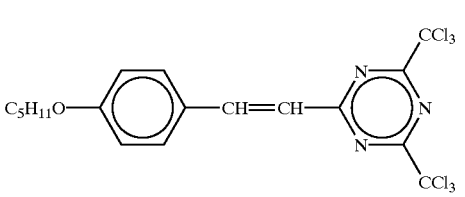
[2-61]
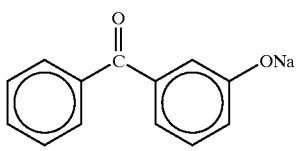
[2-62]
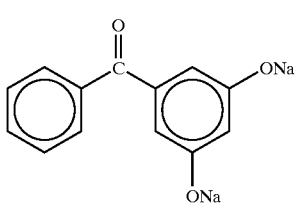
[2-63]
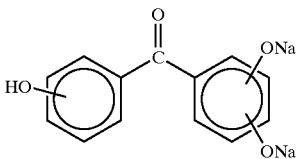
[2-64]
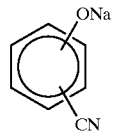
[2-65]
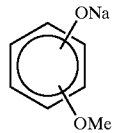
[2-66]
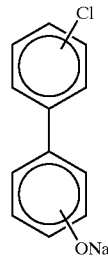
[2-67]
$C_2H_5ONa$

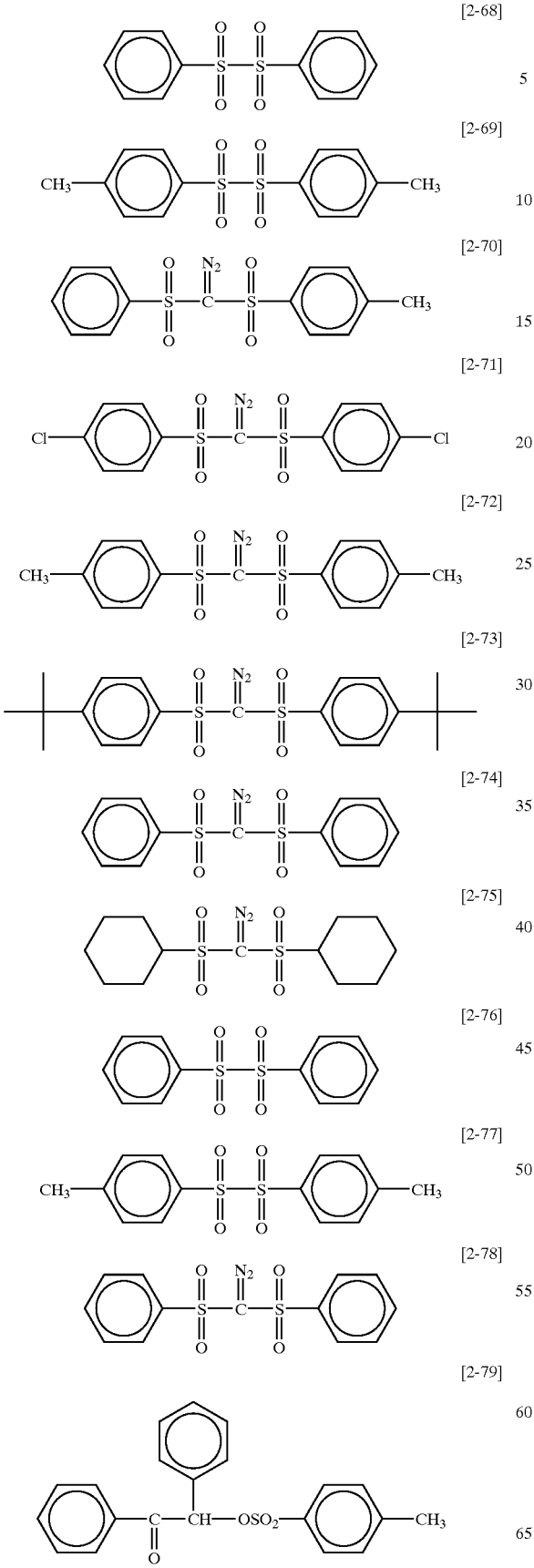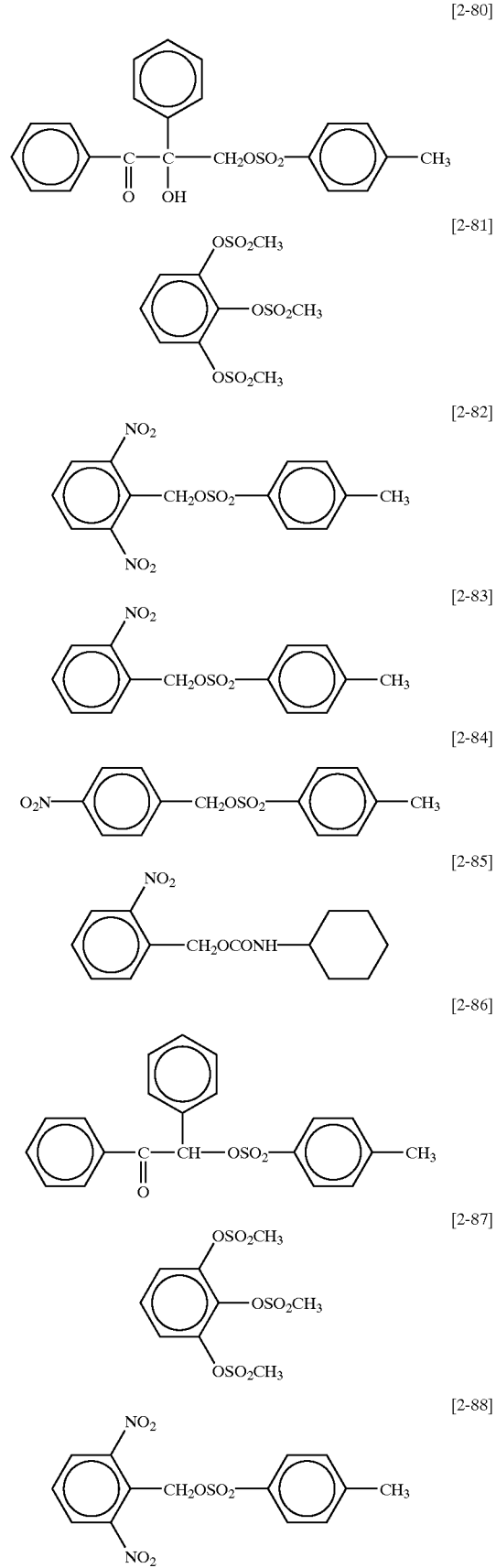

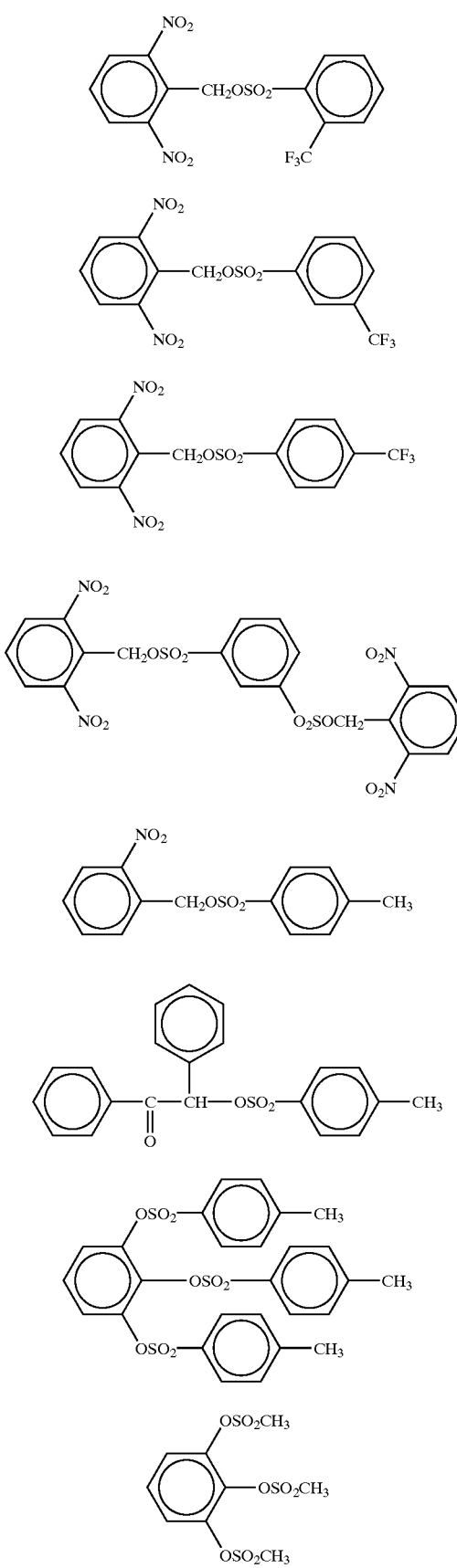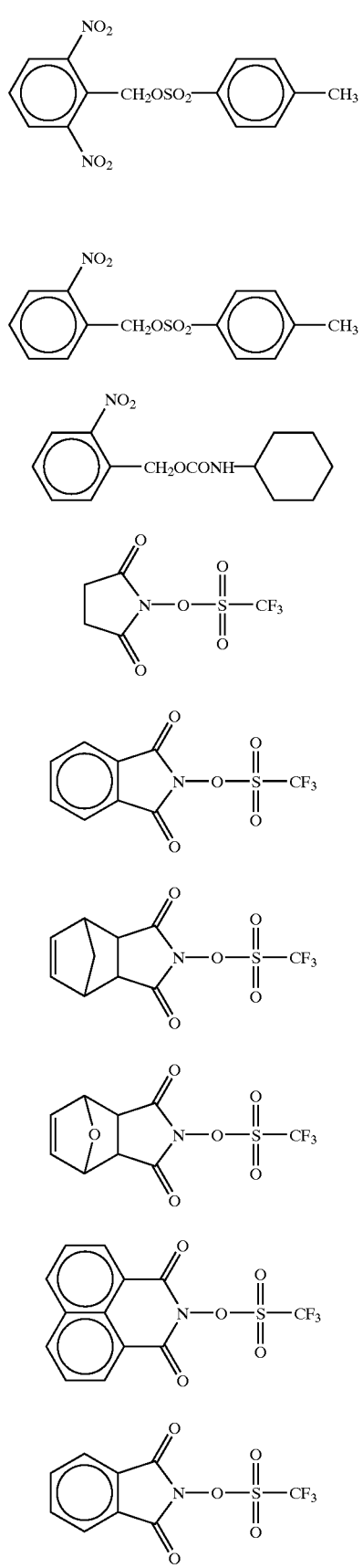

-continued

[2-106]

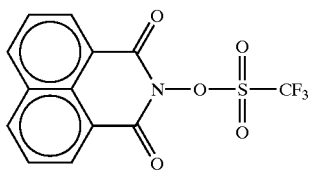

The crosslinking material is exemplified by an organic silicon compound having a multiple bond and an acrylic unsaturated compound. The solvent may be a polar organic solvent or a non-polar organic solvent. Specifically, the solvent is exemplified by ethyl lactate (EL), ethyl-3-ethoxy propionate (EEP), propylene glycol monomethylether acetate (PGMEA), propylene glycol monomethylether (PGME), ketone such as cyclohexane, 2-heptane, 3-heptane, acetylacetone or cyclopentanone, ester such as propylene glycol monoethyl ether acetate, ethylcellosolve acetate, methylcellosolve acetate, methyl-3-methoxypropionate, ethyl-3-methoxypropionate, methyl-3-ethoxypropionate, methyl pyruvate or ethyl pyruvate, ether such as diethylene glycol dimethylether or propyleneglycol dimethylether, glycol ester derivative such as methyl lactate or ethyl glycolate. Note that the solvent is not limited to the foregoing materials.

The coating material is prepared by the foregoing method. Then, the surface of the silicon insulating film is coated with the material of the solution by a spin coating method or the like. Then, the temperature is raised to vaporize the solvent so that the organic silicon film is formed. A glass transition temperature with which a satisfactory etching selective ratio with respect to the resist can be realized is required in the foregoing state. If the satisfactory etching selective ratio with respect to the resist cannot be realized, the coated film is furthermore heated or irradiated with energy beams to crosslink the coated film.

The energy beam is exemplified by ultraviolet rays, X-rays, electron beams and ion beams. When heating and irradiation with the energy beam are simultaneously performed, the crosslinking reaction is quickened. Thus, the glass transition temperature can be significantly raised in a practical range of process duration.

Note that heating or irradiation with the energy beam sometimes causes bondings between silicon and the silicon that constitute the main chains in the organic silicon compound to be broken. Thus, bonding with oxygen causes oxidation to easily occur, resulting in reduction in the etching selective ratio between the resist and the organic silicon film. In the foregoing case, it is preferable that heating and irradiation with the energy beam are performed in an atmosphere in which the concentration of oxygen is lower than that in the air.

The present invention is not limited to the description about the embodiments. In the foregoing description, the structure has been formed such that the insulating film mainly constituted by the silicon oxide film and polysilane are stacked to change the polysilane to the silicon oxide film or the silicon nitride film. If similar methods are combined with each other, the insulating film constituted by the silicon nitride film and polysilane are stacked to change polysilane to the silicon oxide film or the silicon nitride film so as to be a portion of the insulating film constituted by the silicon nitride film. Alternatively, polysilane may be changed to the silicon oxide film so as to be removed from the insulating film constituted by the silicon nitride film.

In the first to sixth embodiments, the dry etching processing method is employed where the interlayer film having the dual-damascene structure is formed by using polysilane. The present invention is not limited to the interlayer film having the dual-damascene structure. As a matter of course, the foregoing method may be applied to a common multiple trench metallization. Moreover, a variety of modifications may be permitted within the scope of the present invention.

In the device manufacturing process, the organic silicon film of the polysilicon group and the insulating film are stacked with each other and oxygen, nitrogen, or hydrogen are introduced into the organic silicon film to be changed as a portion of the insulating film as stated above.

In this case, a thin interlayer film containing the constituent organic silicon sometimes remains at the interface between the organic silicon film and the insulating film.

Relating to the present invention, however, no problem occurs concerning the manufactured device operation caused by the existence of such a thin and little remaining interface film.

As described above, the manufacturing method of semiconductor devices by using dry etching technology according to the present invention has the structure that the organic silicon film constituted by polysilane and the like is used to form the insulating film of the semiconductor device or a portion of the same by dry etching. The portion constituted by the organic silicon film is changed to an oxide or a nitride so that the portion constituted by the organic silicon film is integrated with the insulating film of the semiconductor device or a portion of the same. If a similar method is employed, removal of the anti-reflective film which has been difficult for the conventional technology can easily be performed.

The surface region of the organic silicon film is selectively changed to an oxide or a nitride, and then dry etching is performed by using the oxide or the nitride. Then, the process is performed such that the organic silicon film is made to be a portion of the insulating film. A contact hole or the like having a higher aspect ratio as compared with that of the conventional resist mask can be formed.

When the dry etching method structured by combining the foregoing organic silicon films is applied, formation of the contact hole in the interlayer insulating film having the dual-damascene structure, the metallization trench and the dual-damascene structure metallization, which has been difficult, can be facilitated. Moreover, the etching mask incorporating the insulating film, having a high aspect ratio and required to form a deep trench in the silicon substrate can be formed.

Moreover, the present invention may widely be applied to the smoothing process of a device region and the device isolation region, formation of a SAC, and patterning of a precise gate electrode which are important factors in the manufacture of dense semiconductor integrated circuits at a satisfactorily high yield.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
  a first wiring structure formed on a semiconductor substrate and including a first plug and a first wiring formed on said first plug; and
  a second wiring structure formed on said semiconductor substrate and including a second plug and a second wiring formed on said second plug;

wherein the upper surface of said first wiring is positioned higher than the upper surface of said second wiring, and the lower surface of said first wiring is positioned flush with or lower than the upper surface of said second wiring.

2. The semiconductor device according to claim 1, wherein said wiring layer is of a single layer structure or of a multi-layered structure, and said first and second wiring structures are formed adjacent to each other within the same wiring layer.

3. The semiconductor device according to claim 1, wherein each of said first and second wirings is surrounded by an insulating film.

4. The semiconductor device according to claim 3, wherein said insulating film includes a first insulating film and a second insulating film formed on said first insulating film, said first and second plugs and said second wiring are buried in said first insulating film, and said first wiring is buried in said second insulating film.

5. The semiconductor device according to claim 4, wherein said first and second insulating films are formed of different materials.

6. The semiconductor device according to claim 5, wherein said second insulating film is selected from the group consisting of a low dielectric constant film, an organic silicon oxide film and an inorganic silicon oxide film.

7. The semiconductor device according to claim 5, wherein each of said first and second insulating films is selected from the group consisting of a low dielectric constant film, an organic silicon oxide film and an inorganic silicon oxide film.

8. The semiconductor device according to claim 1, wherein each of said first and second plugs and said second wiring is surrounded by an insulating film, and said first wiring is an air-bridge wiring.

9. The semiconductor device according to claim 1, wherein each of said first and second plugs and said first and second wirings is an air-bridge wiring.

10. The semiconductor device according to claim 1, wherein the cross sectional area of said first wiring is larger than the cross sectional area of said second wiring.

11. The semiconductor device according to claim 1, wherein the wiring width of said first wiring is larger than the wiring width of said second wiring.

12. The semiconductor device according to claim 1, wherein the thickness of said first wiring is larger than the thickness of said second wiring.

13. The semiconductor device according to claim 1, wherein the distance between the mutually facing side surfaces of said first and second wirings is larger than 0 $\mu$m and not larger than 0.13 $\mu$m.

14. The semiconductor device according to claim 1, wherein satisfied is the inequality $1 < L2/L1 \leq 13$, where L1 represents the distance between the mutually facing side surfaces of said first and second wirings, and L2 represents the width of said first wiring.

15. The semiconductor device according to claim 1, wherein satisfied are inequalities of $1 \leq L2/L3 \leq 10$ and $1 \leq L5/L4 \leq 10$, where L2 represents the width of said first wiring, L3 represents the size of said first plug in the width direction of said first wiring, L4 represents the size of said second plug in the width direction of said second wiring, and L5 represents the width of said second wiring.

16. The semiconductor device according to claim 1, wherein each of said first and second wirings is formed of an elemental metal selected from the group consisting of Cu, Al, W, Ag and Au or an alloy selected from the group consisting of Al-Cu, Al-Si-Cu and WSi or a polysilicon.

17. The semiconductor device according to claim 1, wherein, where each of said first and second wirings is formed of Cu or Al-Cu, each of said first and second wirings is provided with a barrier film or a liner film made of a material selected from the group consisting of Ti, TiN, Ta, TaN, and Ti/TiN, and where each of said first and second wirings is formed of Al, each of said first and second wirings is provided with a barrier film or a liner film made of a material selected from the group consisting of Nb and NbN.

18. The semiconductor device according to claim 1, wherein the lower portion of each of said first and second plugs is connected to any of the source region and the drain region of a MOS transistor formed on said semiconductor substrate.

19. The semiconductor device according to claim 1, further comprising a third plug, a third wiring formed on said third plug, a fourth plug and a fourth wiring formed on said fourth plug, wherein the upper surface of said third wiring is positioned higher than the upper surface of said fourth wiring, the lower surface of said third wiring is positioned flush with or lower than the upper surface of said fourth wiring, the lower portion of said first plug is connected to said third wiring, and the lower portion of said second plug is connected to said fourth wiring.

20. The semiconductor device according to claim 1, further comprising a third plug, a third wiring formed on said third plug, a fourth plug and a fourth wiring formed on said fourth plug, wherein the upper surface of said third wiring is positioned flush with the upper surface of said fourth wiring, the lower portion of said third plug is connected to the upper surface of said first wiring, and the lower portion of said fourth plug is connected to the upper surface of said second wiring.

21. A semiconductor device, comprising:
   a first wiring structure formed on a semiconductor substrate and including a first plug and a first wiring formed on said first plug; and
   a second wiring structure formed on said semiconductor substrate and including a second plug and a second wiring formed on said second plug;
   wherein said first and second wiring structures constitute a wiring layer of an identical wiring level on said semiconductor substrate, and said first and second wiring structures are formed by using different materials.

22. The semiconductor device according to claim 21, wherein said first and second wirings are formed by using different materials.

23. The semiconductor device according to claim 21, wherein the upper surface of said first wiring is positioned higher than the upper surface of said second wiring, and the lower surface of said first wiring is positioned flush with or lower than the upper surface of said second wiring, where said first wiring is formed of Ag or Au and said second wiring is formed of Cu.

* * * * *